United States Patent
Kondo

(10) Patent No.: US 10,554,846 B2
(45) Date of Patent: Feb. 4, 2020

(54) LIGHT-EMITTING COMPONENT, PRINTHEAD, IMAGE FORMING APPARATUS, AND METHOD FOR MANUFACTURING LIGHT-EMITTING COMPONENT

(71) Applicant: FUJI XEROX CO., LTD., Tokyo (JP)

(72) Inventor: Takashi Kondo, Kanagawa (JP)

(73) Assignee: FUJI XEROX CO.,LTD., Tokyo (JP)

( * ) Notice: Subject to any disclaimer, the term of this patent is extended or adjusted under 35 U.S.C. 154(b) by 0 days.

(21) Appl. No.: 16/118,461

(22) Filed: Aug. 31, 2018

(65) Prior Publication Data

US 2019/0089859 A1   Mar. 21, 2019

(30) Foreign Application Priority Data

Sep. 21, 2017   (JP) .................................. 2017-181761

(51) Int. Cl.
| | |
|---|---|
| *H04N 1/028* | (2006.01) |
| *H01L 23/14* | (2006.01) |
| *G03G 15/04* | (2006.01) |
| *H04N 1/024* | (2006.01) |
| *H01L 33/36* | (2010.01) |
| *G03G 15/02* | (2006.01) |

(52) U.S. Cl.
CPC ..... *H04N 1/0282* (2013.01); *G03G 15/04036* (2013.01); *H01L 23/147* (2013.01); *H01L 33/36* (2013.01); *H04N 1/02409* (2013.01); *G03G 15/02* (2013.01)

(58) Field of Classification Search
CPC ............. G03G 15/02; G03G 15/04036; G03G 15/04054; H01L 23/147; H01L 33/36; H01L 27/153; H01L 33/005; H04N 1/02409; H04N 1/0282; G02B 27/0087
USPC ................ 347/141; 257/113, 79, 88; 438/23
See application file for complete search history.

(56) References Cited

U.S. PATENT DOCUMENTS

| | | | |
|---|---|---|---|
| 7,948,004 B2 | 5/2011 | Suzuki | |
| 9,049,036 B2* | 6/2015 | Kondo | .................... H04L 41/00 |
| 9,873,576 B2* | 1/2018 | Kondo | ................ B65H 3/5253 |
| 10,079,473 B2* | 9/2018 | Kondo | .................... H01S 5/042 |

(Continued)

FOREIGN PATENT DOCUMENTS

| | | |
|---|---|---|
| JP | H01238962 | 9/1989 |
| JP | 2001308385 | 11/2001 |
| JP | 2009286048 | 12/2009 |

*Primary Examiner* — Negussie Worku
(74) *Attorney, Agent, or Firm* — JCIPRNET

(57) ABSTRACT

A light-emitting component includes an insulating substrate, plural light-emitting elements, and plural thyristors. The plural light-emitting elements are disposed on the substrate and constituted by a first stacked semiconductor layer, the first stacked semiconductor layer being obtained by stacking plural semiconductor layers. The plural thyristors are constituted by a second stacked semiconductor layer disposed on the substrate such that the light-emitting elements and the thyristors are arranged side by side, connected to the plural light-emitting elements, respectively, and turn on to drive the light-emitting elements to emit light or to increase an emitted light amount, the second stacked semiconductor layer being obtained by stacking plural semiconductor layers that are different from the semiconductor layers of the first stacked semiconductor layer.

15 Claims, 24 Drawing Sheets

(56) References Cited

U.S. PATENT DOCUMENTS

| | | | |
|---|---|---|---|
| 10,185,901 B2* | 1/2019 | Komazawa | G06K 15/1823 |
| 10,236,321 B2* | 3/2019 | Kondo | H01L 27/15 |
| 10,266,875 B2* | 4/2019 | Kamba | C12Q 1/04 |
| 10,348,059 B2* | 7/2019 | Hayakawa | G02B 6/4262 |
| 2010/0231682 A1* | 9/2010 | Ohno | B41J 2/451 |
| | | | 347/238 |
| 2018/0006432 A1* | 1/2018 | Kondo | H01S 5/042 |
| 2018/0034578 A1* | 2/2018 | Kondo | H04B 10/506 |
| 2018/0234584 A1* | 8/2018 | Kondo | H01L 27/15 |
| 2018/0259872 A1* | 9/2018 | Kondo | G03G 15/043 |
| 2018/0309890 A1* | 10/2018 | Kondo | B41J 2/447 |
| 2019/0052061 A1* | 2/2019 | Kondo | G03G 15/04054 |
| 2019/0086831 A1* | 3/2019 | Kondo | G03G 15/04054 |

* cited by examiner

LIGHT-EMITTING COMPONENT, PRINTHEAD, IMAGE FORMING APPARATUS, AND METHOD FOR MANUFACTURING LIGHT-EMITTING COMPONENT

CROSS-REFERENCE TO RELATED APPLICATIONS

This application is based on and claims priority under 35 USC 119 from Japanese Patent Application No. 2017-181761 filed Sep. 21, 2017.

BACKGROUND

Technical Field

The present invention relates to a light-emitting component, a printhead, an image forming apparatus, and a method for manufacturing the light-emitting component.

SUMMARY

According to an aspect of the invention, there is provided a light-emitting component including an insulating substrate, plural light-emitting elements, and plural thyristors. The plural light-emitting elements are disposed on the substrate and constituted by a first stacked semiconductor layer, the first stacked semiconductor layer being obtained by stacking plural semiconductor layers. The plural thyristors are constituted by a second stacked semiconductor layer disposed on the substrate such that the light-emitting elements and the thyristors are arranged side by side, connected to the plural light-emitting elements, respectively, and turn on to drive the light-emitting elements to emit light or to increase an emitted light amount, the second stacked semiconductor layer being obtained by stacking plural semiconductor layers that are different from the semiconductor layers of the first stacked semiconductor layer.

BRIEF DESCRIPTION OF THE DRAWINGS

Exemplary embodiments of the present invention will be described in detail based on the following figures, wherein:

FIG. 6A is a plan layout view of the light-emitting chip and FIG. 6B is a cross-sectional view taken along line VIB-VIB illustrated in FIG. 6A;

FIG. 9A illustrates a first stacked semiconductor layer forming step, FIG. 9B illustrates a growth suppression layer forming step, and FIG. 9C illustrates a first stacked semiconductor layer etching step;

FIG. 10A illustrates a second stacked semiconductor layer forming step, FIG. 10B illustrates a growth suppression layer etching step, and FIG. 10C illustrates a cathode electrode forming step;

FIG. 11A illustrates a cathode region forming step, FIG. 11B illustrates a dividing etching step, and FIG. 11C illustrates a current constriction portion forming step;

FIG. 12A illustrates an anode region forming etching step, FIG. 12B illustrates an anode electrode forming step, and FIG. 12C illustrates a protective layer forming step;

FIG. 13A illustrates a wire forming step, and FIG. 13B illustrates an emission surface forming step;

FIG. 14A illustrates a second stacked semiconductor layer forming step, FIG. 14B illustrates a growth suppression layer forming step, and FIG. 14C illustrates a second stacked semiconductor layer etching step;

FIG. 15A illustrates a first stacked semiconductor layer forming step, FIG. 15B illustrates a growth suppression layer etching step, and FIG. 15C illustrates a cathode electrode forming step;

FIG. 16 illustrates a cathode region forming step;

FIG. 19A is a cross-sectional view of a setting thyristor including a voltage reduction layer, FIG. 19B is a cross-sectional view of a setting thyristor not including the voltage reduction layer, and FIG. 19C illustrates characteristics of the setting thyristors;

DETAILED DESCRIPTION

Exemplary embodiments of the present invention will be described in detail below with reference to the accompanying drawings.

Note that a chemical symbol is used to represent a substance below in such a manner that Al is used for aluminum.

First Exemplary Embodiment

A light-emitting chip C, which is an example of a light-emitting component, is herein applied to an image forming apparatus 1 as an example in the following description.
Image Forming Apparatus 1

Figure 1:
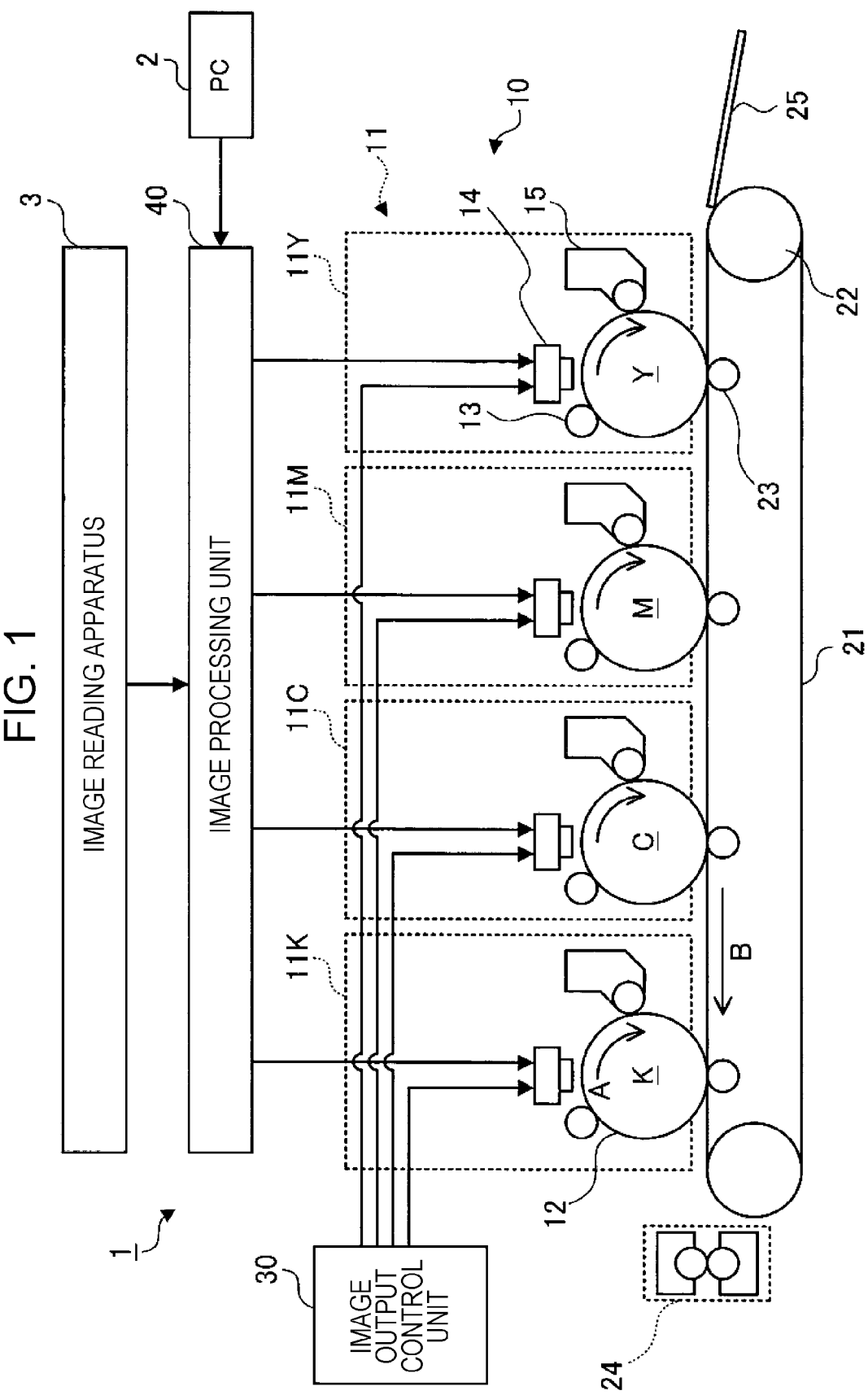
FIG. 1 illustrates an example of an overall configuration of an image forming apparatus to which a first exemplary embodiment is applied.

FIG. 1 illustrates an example of an overall configuration of the image forming apparatus 1 to which a first exemplary embodiment is applied. The image forming apparatus 1 illustrated in FIG. 1 is an image forming apparatus generally called a tandem type. The image forming apparatus 1 includes an image forming process unit 10, an image output control unit 30, and an image processing unit 40. The image forming process unit 10 forms an image in accordance with image data of each color. The image output control unit 30 controls the image forming process unit 10. The image processing unit 40 is connected to, for example, a personal computer (PC) 2 and an image reading apparatus 3 and performs predetermined image processing on image data received from the PC 2 and the image reading apparatus 3.

The image forming process unit 10 includes image forming units 11Y, 11M, 11C, and 11K that are disposed in parallel to each other with a predetermined space therebetween. The image forming units 11Y, 11M, 11C, and 11K are referred to as image forming units 11 when they are not distinguished from one another. Each of the image forming units 11 includes a photoconductor drum 12, a charger 13, a printhead 14, and a developer 15. The photoconductor drum 12, which is an example of an image bearing member, bears an electrostatic latent image and a toner image formed thereon. The charger 13, which is an example of a charging member, charges the surface of the photoconductor drum 12 to a predetermined potential. The printhead 14 exposes the photoconductor drum 12 that has been charged by the charger 13 to light. The developer 15, which is an example of a developing member, develops the electrostatic latent image obtained by the printhead 14. The image forming units 11Y, 11M, 11C, and 11K form toner images of yellow (Y), magenta (M), cyan (C), and black (K), respectively.

The image forming process unit 10 also includes a sheet transporting belt 21, a drive roll 22, transfer rolls 23, and a fixer 24 to transfer the toner images of the respective colors formed on the photoconductor drums 12 of the respective image forming units 11Y, 11M, 11C, and 11K onto a recording sheet 25 so that the toner images are superimposed together. The recording sheet 25 is an example of a transferred-image-receiving medium. The sheet transporting belt 21 transports the recording sheet 25. The drive roll 22 drives the sheet transporting belt 21. Each of the transfer rolls 23, which is an example of a transfer member, transfers the corresponding toner image on the corresponding photoconductor drum 12 onto the recording sheet 25. The fixer 24 fixes the toner images on the recording sheet 25.

In the image forming apparatus 1, the image forming process unit 10 performs an image forming operation in accordance with various control signals supplied thereto from the image output control unit 30. Under control of the image output control unit 30, the image processing unit 40 performs image processing on image data received from the PC 2 or the image reading apparatus 3 and supplies the resultant image data to the image forming units 11. Then, for example, in the image forming unit 11K for black (K), the photoconductor drum 12 is charged to a predetermined potential by the charger 13 while rotating in a direction of an arrow A and is exposed to light by the printhead 14 that emits light on the basis of the image data supplied thereto from the image processing unit 40. Consequently, an electrostatic latent image for an image of black (K) is formed on the photoconductor drum 12. The electrostatic latent image formed on the photoconductor drum 12 is then developed by the developer 15, and consequently a toner image of black (K) is formed on the photoconductor drum 12. Toner images of yellow (Y), magenta (M), and cyan (C) are formed in the image forming units 11Y, 11M, and 11C, respectively.

The toner images of the respective colors formed on the respective photoconductor drums 12 in the corresponding image forming units 11 are sequentially transferred electrostatically onto the recording sheet 25 that is fed in response to a movement of the sheet transporting belt 21 moving in a direction of an arrow B, by a transfer electric field applied to the transfer rolls 23. Consequently, a combined toner image in which the toner images of the respective colors are superimposed together is formed on the recording sheet 25.

Then, the recording sheet 25 having the electrostatically transferred combined toner image is transported to the fixer 24. The combined toner image on the recording sheet 25 transported to the fixer 24 undergoes a heat/pressure-based fixing process performed by the fixer 24 and is fixed on the recording sheet 25. Then, the recording sheet 25 is discharged from the image forming apparatus 1.
Printhead 14

Figure 2:
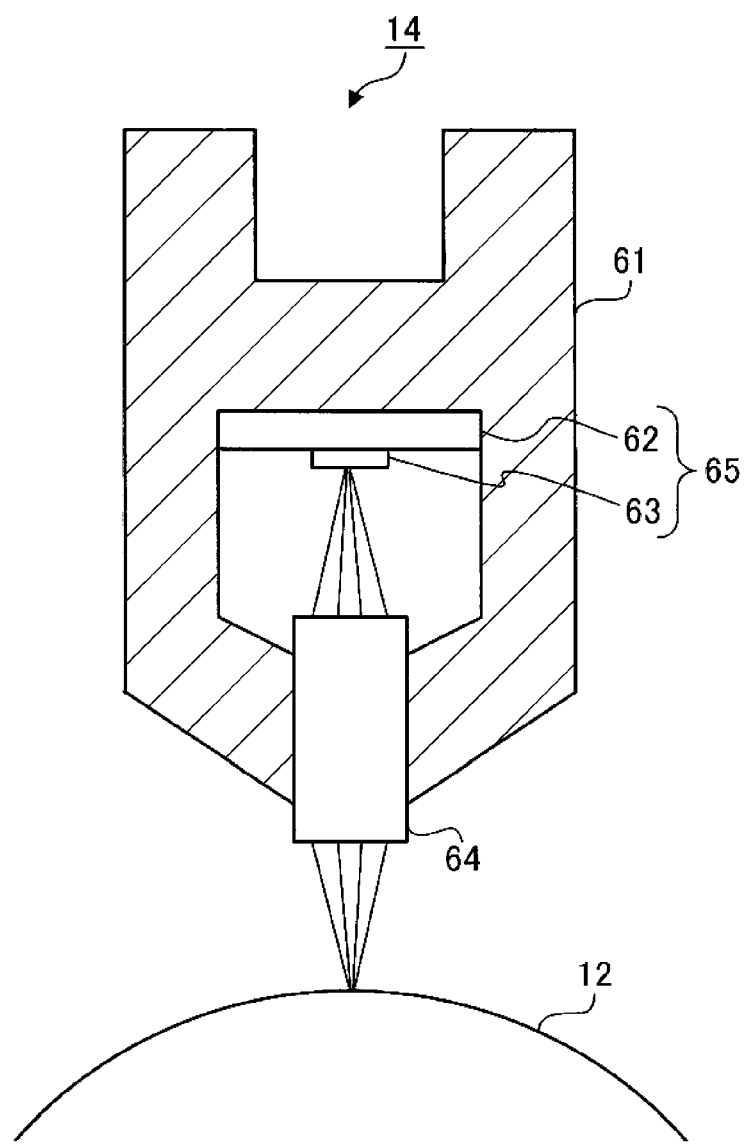
FIG. 2 is a cross-sectional view illustrating an example of a configuration of a printhead.

FIG. 2 is a cross-sectional view illustrating an example of a configuration of the printhead 14. The printhead 14, which is an example of an exposure device, includes a housing 61, a light-emitting device 65, and a rod lens array 64. The light-emitting device 65, which is an example of a light-emitting device, includes a light source unit 63 including plural light-emitting elements that expose the photoconductor drum 12 to light. In the first exemplary embodiment, the light-emitting elements are laser diodes LD. The rod lens array 64, which is an example of an optical system, focuses the light emitted from the light source unit 63 onto the surface of the photoconductor drum 12 to form an image thereon.

The light-emitting device 65 includes a circuit board 62 on which the light source unit 63 described above, a signal generation circuit 110 (described later with reference to FIG. 3) that drives the light source unit 63, and so forth are mounted.

The housing 61 is formed of a metal, for example. The housing 61 supports the circuit board 62 and the rod lens array 64 to set the light-emitting surface of the light-emitting elements of the light source unit 63 to be a focal plane of the rod lens array 64. In addition, the rod lens array 64 is disposed in an axial direction of the photoconductor drum 12 (which is a main scanning direction and an X direction in FIGS. 3 and 4B described later).

Light-Emitting Device 65

Figure 3:
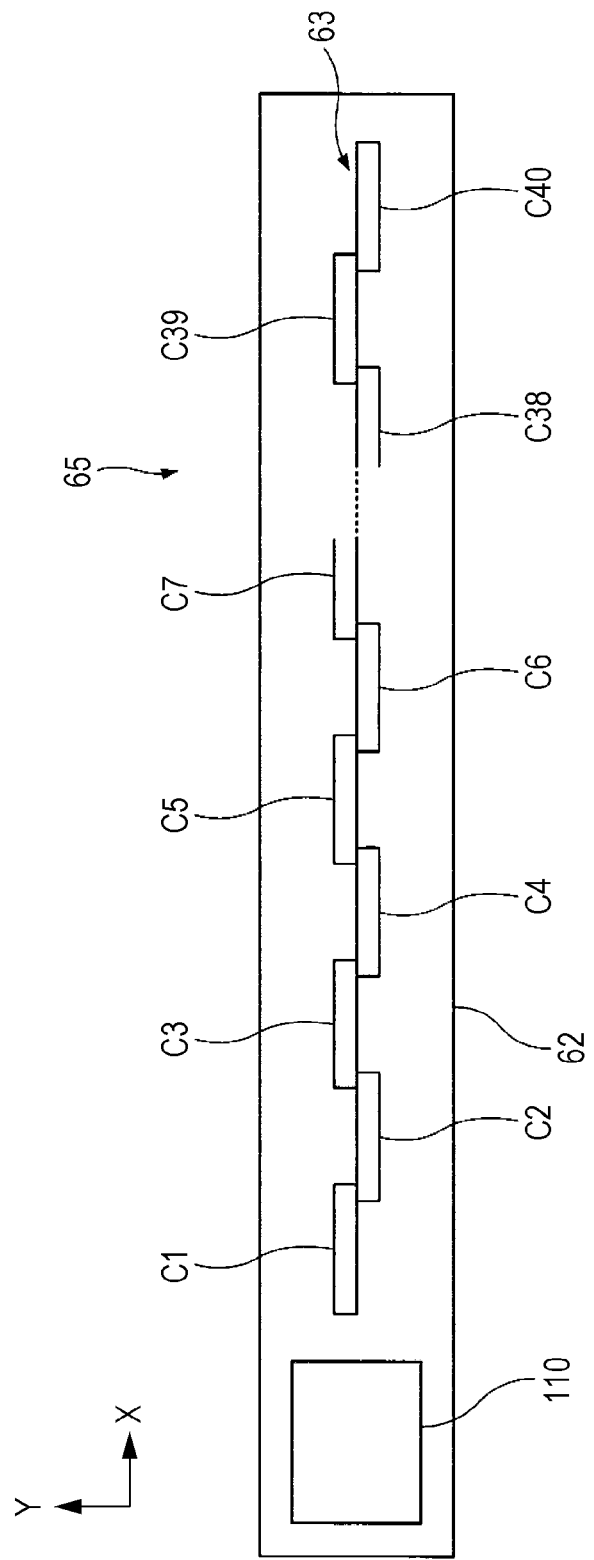
FIG. 3 is a top view of an example of a light-emitting device.

FIG. 3 is a top view of an example of the light-emitting device 65.

In the light-emitting device 65 illustrated by way of example in FIG. 3, the light source unit 63 includes 40 light-emitting chips C1 to C40, each of which is an example of a light-emitting component, arranged in two lines in the X direction which is the main scanning direction on the circuit board 62 to form a staggered pattern. The light-emitting chips C1 to C40 are referred to as light-emitting chips C when they are not distinguished from one another. The light-emitting chips C1 to C40 may have an identical configuration.

Herein, a symbol "-" or a word "to" is used to indicate plural components that are distinguished from one another using numbers and indicates that the plural components include components that are assigned the numbers preceding and following the symbol "-" or the word "to" and components that are assigned numbers between the preceding and following numbers. For example, the light-emitting chips C1-C40 (C1 to C40) include the light-emitting chip C1 through the light-emitting chip C40 in the numbered order.

In the first exemplary embodiment, 40 light-emitting chips C in total are used; however, the number of light-emitting chips C is not limited to 40.

The light-emitting device 65 includes the signal generation circuit 110 that drives the light source unit 63. The signal generation circuit 110 is constituted by an integrated circuit (IC), for example. Note that the light-emitting device 65 need not necessarily include the signal generation circuit 110. In such a case, the signal generation circuit 110 is provided outside the light-emitting device 65 and supplies control signals for controlling the light-emitting chips C or the like to the light-emitting device 65 through a cable or the like. The description is given herein on the assumption that the light-emitting device 65 includes the signal generation circuit 110.

An arrangement of the light-emitting chips C will be described in detail later.

FIGS. 4A and 4B illustrate an example of a configuration of each of the light-emitting chips C, an example of a configuration of the signal generation circuit 110 of the light-emitting device 65, and an example of a configuration of wires (lines) on the circuit board 62. Specifically, FIG. 4A illustrates the configuration of the light-emitting chip C, and FIG. 4B illustrates the configuration of the signal generation circuit 110 of the light-emitting device 65 and the configuration of wires (lines) on the circuit board 62. Note that FIG. 4B illustrates the light-emitting chips C1 to C9 among the light-emitting chips C1 to C40.

First, the configuration of the light-emitting chip C illustrated in FIG. 4A will be described.

The light-emitting chip C includes a light-emitting unit 102 including plural laser diodes LD1 to LD128 arranged in a line along long sides to be closer to one of the long sides on a front surface of a substrate 70 having a rectangular shape. The laser diodes LD1 to LD128 are referred to as laser diodes LD when they are not distinguished from one another. The light-emitting chip C further includes terminals (φ1, φ2, Vsub, Vga, and φI) at respective ends of a long-side direction on the front surface of the substrate 70. The terminals are plural bonding pads for receiving various control signals, for example. These terminals are disposed in an order of the terminal Vsub, the terminal φ1, and the terminal φI from one of the ends of the substrate 70 and in an order of the terminal Vga and the terminal φ2 from the other end of the substrate 70. The light-emitting unit 102 is disposed between the terminals φ1 and φ2. The laser diodes LD are examples of light-emitting elements (elements used for emitting light). A direction in which the laser diodes LD1-LD128 are arranged on the front surface of the substrate 70 is defined as an x direction, and a direction perpendicular to the x direction is defined as a y direction.

Note that the expression "arranged in a line" refers not only to a state in which plural light-emitting elements (the laser diodes LD in the first exemplary embodiment) are arranged in a line as illustrated in FIG. 4A but also to a state in which the plural light-emitting elements are shifted from each other by different displacement amounts in a direction perpendicular to the direction of the line. For example, the light-emitting elements may be arranged to be shifted from each other by a displacement amount in a direction perpendicular to the direction of the line. In addition, adjacent light-emitting elements or sets of plural adjacent light-emitting elements may be arranged in a zigzag pattern.

The configuration of the signal generation circuit 110 of the light-emitting device 65 and the configuration of wires (lines) on the circuit board 62 will be described next with reference to FIG. 4B.

As described above, the signal generation circuit 110 and the light-emitting chips C1 to C40 are mounted on the circuit board 62 of the light-emitting device 65, and wires (lines) that connect the signal generation circuit 110 and the respective light-emitting chips C1 to C40 to each other are provided on the circuit board 62.

The configuration of the signal generation circuit 110 will be described first.

The signal generation circuit 110 receives various control signals and pieces of image data that have been subjected to image processing respectively from the image output control unit 30 and the image processing unit 40 (see FIG. 1). The signal generation circuit 110 rearranges the pieces of image data and corrects an amount of light on the basis of the pieces of image data and the various control signals.

The signal generation circuit 110 includes a transfer signal generation unit 120 that sends a first transfer signal φ1 and a second transfer signal φ2 to the light-emitting chips C1 to C40 on the basis of the various control signals.

The signal generation circuit 110 also includes a turn-on signal generation unit 140 that sends turn-on signals φI1 to φI40 to the light-emitting chips C1 to C40 on the basis of the various control signals, respectively. The turn-on signals φI1 to φI40 are referred to as turn-on signals φI when they are not distinguished from each other.

The signal generation circuit 110 further includes a reference potential supplying unit 160 and a power supply potential supplying unit 170. The reference potential supplying unit 160 supplies a reference potential Vsub, which serves as a reference of the potential, to the light-emitting chips C1 to C40. The power supply potential supplying unit 170 supplies a power supply potential Vga for driving the light-emitting chips C1 to C40.

The arrangement of the light-emitting chips C1 to C40 will be described next.

Odd-numbered light-emitting chips C1, C3, C5, . . . are arranged in a line in a long-side direction of the substrate 70 with a space interposed therebetween. Similarly, even-numbered light-emitting chips C2, C4, C6, . . . are also arranged in a line in the long-side direction of the substrate 70 with a space interposed therebetween. The odd-numbered light-emitting chips C1, C3, C5, . . . and the even-numbered light-emitting chips C2, C4, C6, . . . are arranged in a staggered pattern with being rotated 180° from each other so that the long sides close to the light-emitting units 102 on the adjacent odd-numbered and even-numbered light-emitting chips C face each other. Positions of the light-emitting chips C are set such that the laser diodes LD of the light-emitting chips C are arranged in the main scanning direction (X direction) at predetermined intervals. Note that a direction in which the laser diodes LD illustrated in FIG. 4A are arranged (i.e., the numbered order of the laser diodes LD1 to LD128) is indicated using an arrow in each of the light-emitting chips C1 to C40 in FIG. 4B.

The wires (lines) that connect the signal generation circuit 110 and the light-emitting chips C1 to C40 to each other will be described.

A power supply line 200a is provided on the circuit board 62. The power supply line 200a is connected to the terminals Vsub provided in the respective light-emitting chips C and supplies the reference potential Vsub from the reference potential supplying unit 160 of the signal generation circuit 110.

A power supply line 200b is also provided on the circuit board 62. The power supply line 200b is connected to the terminals Vga provided in the respective light-emitting chips C and supplies the power supply potential Vga for driving from the power supply potential supplying unit 170 of the signal generation circuit 110.

A first transfer signal line 201 and a second transfer signal line 202 are provided on the circuit board 62. The first transfer signal line 201 is used to send the first transfer signal ϕ1 from the transfer signal generation unit 120 of the signal generation circuit 110 to the terminals ϕ1 of the respective light-emitting chips C1 to C40. The second transfer signal line 202 is used to send the second transfer signal ϕ2 from the transfer signal generation unit 120 of the signal generation circuit 110 to the terminals ϕ2 of the respective light-emitting chips C1 to C40. The first transfer signal ϕ1 and the second transfer signal ϕ2 are sent to the light-emitting chips C1 to C40 in common (in parallel).

In addition, turn-on signal lines 204-1 to 204-40 are provided on the circuit board 62. The turn-on signal lines 204-1 to 204-40 are used to send the turn-on signals ϕI1 to ϕI40 from the turn-on signal generation unit 140 of the signal generation circuit 110 to the terminals ϕI of the light-emitting chips C1 to C40 through respective current-limiting resistors RI, respectively. The turn-on signal lines 204-1 to 204-40 are referred to as turn-on signal lines 204 when they are not distinguished from one another.

As described above, the reference potential Vsub and the power supply potential Vga are supplied to all the light-emitting chips C1 to C40 on the circuit board 62 in common. The first transfer signal ϕ1 and the second transfer signal ϕ2 are also sent to the light-emitting chips C1 to C40 in common (in parallel). On the other hand, the turn-on signals ϕI1 to ϕI40 are individually sent to the light-emitting chips C1 to C40, respectively.

Light-Emitting Chip C

Figure 4:
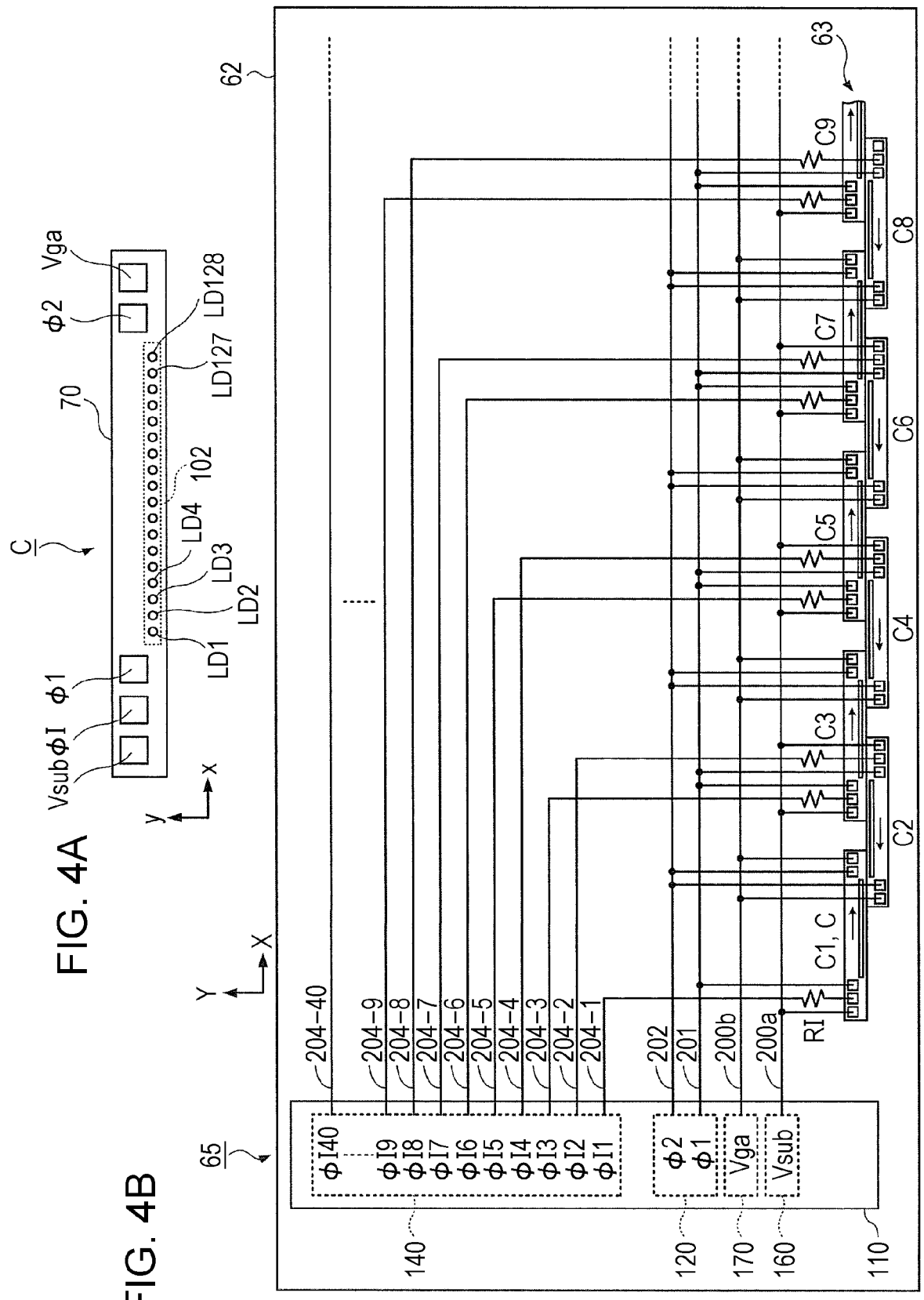
FIGS. 4A and 4B illustrate an example of a configuration of a light-emitting chip, an example of a configuration of a signal generation circuit of the light-emitting device, and an example of a configuration of wires (lines) on a circuit board.
Figure 5:
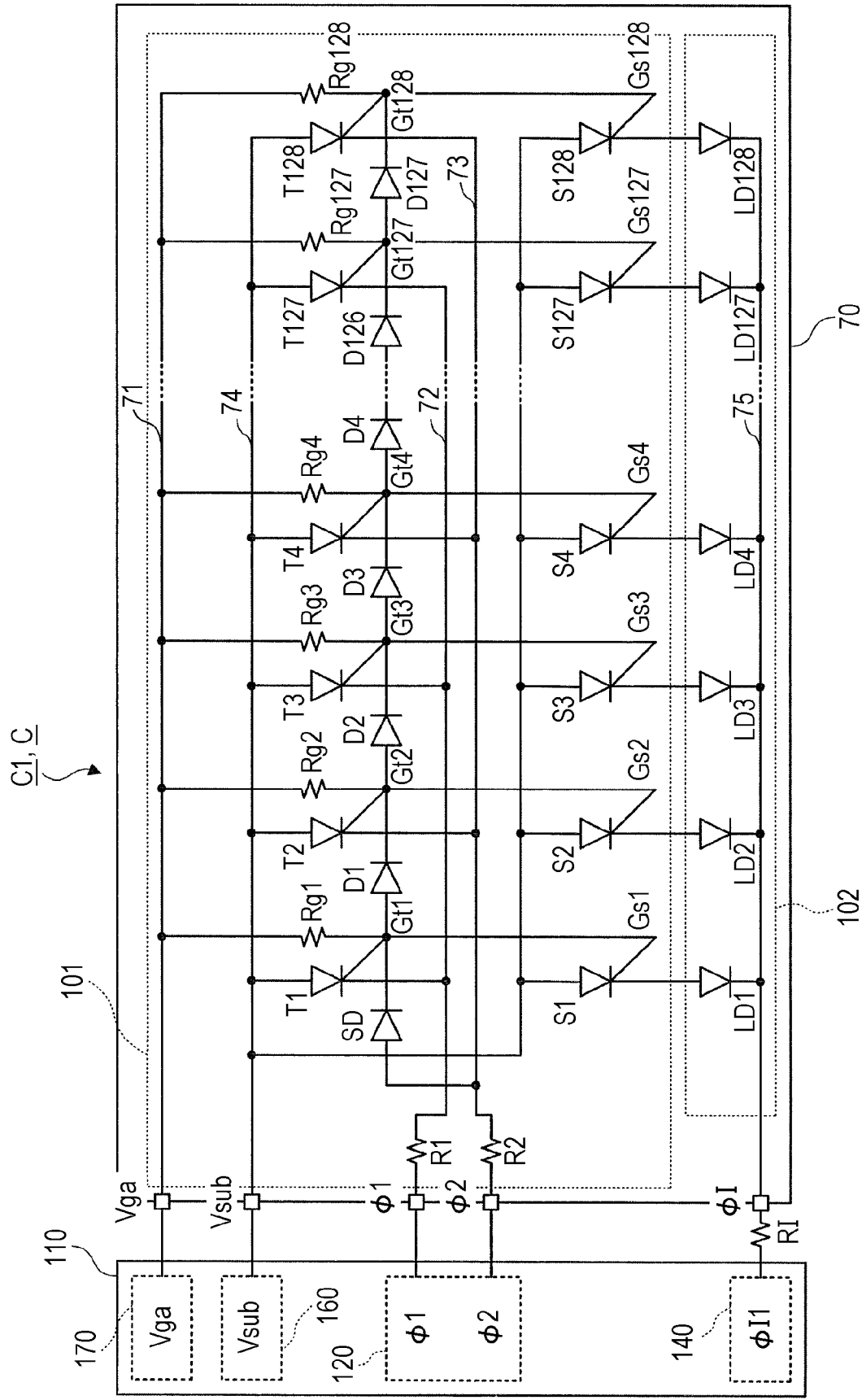
FIG. 5 is an equivalent circuit diagram illustrating a circuit configuration of the light-emitting chip in which a self-scanning light-emitting device (SLED) array according to the first exemplary embodiment is mounted.

FIG. 5 is an equivalent circuit diagram illustrating a circuit configuration of the light-emitting chip C in which a self-scanning light-emitting device (SLED) array according to the first exemplary embodiment is mounted. Elements described below are arranged in accordance with the layout (see FIGS. 6A and 6B described later) on the light-emitting chip C except for the terminals (ϕ1, ϕ2, Vsub, Vga, and ϕI). Note that the positions of the terminals (ϕ1, ϕ2, Vsub, Vga, and ϕI) are different from those illustrated in FIG. 4A because the terminals are illustrated on the left end in FIG. 5 in order to describe connections with the signal generation circuit 110.

The light-emitting chips C will be described in relationship with the signal generation circuit 110 by using the light-emitting chip C1 by way of example. Accordingly, the light-emitting chip C is referred to as the light-emitting chip C1(C) in FIG. 5. The other light-emitting chips C2 to C40 have the same or substantially the same configuration as the light-emitting chip C1.

The light-emitting chip C1(C) includes the light-emitting unit 102 (see FIG. 4A) including the laser diodes LD1 to LD128 arranged in a line.

The light-emitting chip C1(C) also includes setting thyristors S1 to S128, which are referred to as setting thyristors S when they are not distinguished from one another, arranged in a line just like the laser diodes LD. The laser diodes LD1 to LD128 are connected to the setting thyristors S1 to S128, respectively, such that the laser diode LD and the setting thyristor S that are assigned the same number are connected in series. In this example, the anode of the laser diode LD and the cathode of the setting thyristor S are connected to each other. As described later, since the setting thyristor S turns on to set the laser diode LD in a state ready to emit light (turn on), the setting thyristor S is called "setting thyristor". Note that since the setting thyristor S is also a driving element that supplies a current to the laser diode LD, the setting thyristor S may also be called an element that drives the laser diode LD. In addition, the setting thyristor S is sometimes simply referred to as a thyristor.

The light-emitting chip C1(C) further includes transfer thyristors T1 to T128 that are also arranged in a line just like the laser diodes LD1 to LD128 and the setting thyristors S1 to S128. The transfer thyristors T1 to T128 are referred to as transfer thyristors T when they are not distinguished from one another.

Although the description is given here by using the transfer thyristors T as an example of transfer elements, the transfer elements may be any other circuit elements that sequentially turn on. For example, a shift register or a circuit element including a combination of plural transistors may be alternatively used.

In addition, the light-emitting chip C1(C) includes coupling diodes D1 to D127. The transfer thyristors T1 to T128 are paired in the numbered order, and each of the coupling diodes D1 to D127 is disposed between a corresponding one of the pairs. The coupling diodes D1 to D127 are referred to as coupling diodes D when they are not distinguished from one another.

Furthermore, the light-emitting chip C1(C) includes power supply line resistors Rg1 to Rg128, which are referred to as power supply line resistors Rg when they are not distinguished from one another.

The light-emitting chip C1(C) also includes a start diode SD. In addition, the light-emitting chip C1(C) includes current-limiting resistors R1 and R2 that are provided to prevent an excessive current from flowing through a first transfer signal line 72 (described later) used to send the first transfer signal ϕ1 and through a second transfer signal line 73 (described later) used to send the second transfer signal ϕ2.

In this example, the setting thyristors S1 to S128, the transfer thyristors T1 to T128, the power supply line resistors Rg1 to Rg128, the coupling diodes D1 to D127, the start diode SD, and the current-limiting resistors R1 and R2 constitute a driving unit 101.

The laser diodes LD1 to LD128 of the light-emitting unit 102 and the setting thyristors S1 to S128 and the transfer thyristors T1 to T128 of the driving unit 101 are arranged in the numbered order from the left in FIG. 5. Further, the coupling diodes D1 to D127 and the power supply line resistors Rg1 to Rg128 are also arranged in the numbered order from the left in FIG. 5.

Furthermore, the light-emitting chip C includes a power supply line 71 to which the power supply potential Vga is supplied, a power supply line 74 to which the reference potential Vsub is supplied, the first transfer signal line 72 to which the first transfer signal ϕ1 is supplied, the second transfer signal line 73 to which the second transfer signal ϕ2 is supplied, and a turn-on signal line 75 to which a current for turning on the laser diodes LD is supplied.

In the first exemplary embodiment, the number of laser diodes LD of the light-emitting unit 102 and the number of setting thyristors S, the number of transfer thyristors T, and the number of power supply line resistors Rg of the driving unit 101 are set equal to 128. The number of coupling diodes D is equal to 127, which is less than the number of transfer thyristors T by 1.

The numbers of laser diodes LD and other elements are not limited to the above numbers and may be set equal to predetermined numbers. The number of transfer thyristors T may be greater than the number of laser diodes LD.

Each of the diodes (the laser diodes LD, the coupling diodes D, and the start diode SD) is a two-terminal semiconductor element having an anode terminal (anode) and a cathode terminal (cathode). Each of the thyristors (the setting thyristors S and the transfer thyristors T) is a three-terminal semiconductor element having an anode terminal (anode), a gate terminal (gate), and a cathode terminal (cathode).

As described later, the diodes (the laser diodes LD, the coupling diodes D, and the start diode SD) and the thyristors (the setting thyristors S and the transfer thyristors T) do not necessarily have the anode terminal, the gate terminal, or the cathode terminal that is formed as an electrode in some cases. Thus, hereinafter, the anode terminal, the gate terminal, and the cathode terminal are sometimes referred to as an anode, a gate, or a cathode, respectively.

Electrical connections between the elements of the light-emitting chip C1(C) will be described next.

The anodes of the transfer thyristors T and the anodes of the setting thyristors S are connected to the power supply line 74. The power supply line 74 is connected to the terminal Vsub. The terminal Vsub is connected to the power supply line 200a (see FIG. 4B) from the reference potential supplying unit 160 and is supplied with the reference potential Vsub from the reference potential supplying unit 160. This is an anode-common configuration in which the anodes of the transfer thyristors T and the anodes of the setting thyristors S are set to the reference potential Vsub in common.

The cathodes of the odd-numbered transfer thyristors T1, T3, . . . are connected to the first transfer signal line 72 along the line of the transfer thyristors T. The first transfer signal line 72 is connected to the terminal ϕ1 through the current-limiting resistor R1. The first transfer signal line 201 (see FIG. 4B) is connected to the terminal ϕ1, and the first transfer signal ϕ1 is sent to the terminal ϕ1 from the transfer signal generation unit 120.

On the other hand, the cathodes of the even-numbered transfer thyristors T2, T4, . . . are connected to the second transfer signal line 73 along the line of the transfer thyristors T. The second transfer signal line 73 is connected to the terminal ϕ2 through the current-limiting resistor R2. The second transfer signal line 202 (see FIG. 4B) is connected to the terminal ϕ2, and the second transfer signal ϕ2 is sent to the terminal ϕ2 from the transfer signal generation unit 120.

Gates Gt1 to Gt128 of the transfer thyristors T1 to T128 are connected to gates Gs1 to Gs128 of the setting thyristors S1 to S128, respectively, to have a one-to-one correspondence. The gates Gt1 to Gt128 are referred to as gates Gt when they are not distinguished from one another, and the gates Gs1 to Gs128 are referred to as gates Gs when they are not distinguished from one another. Thus, each pair of gates assigned the same number among the gates Gt1 to Gt128 and the gates Gs1 to Gs128 has an electrically equal potential. For example, the expression "gate Gt1 (gate Gs1)" indicates that the gate Gt1 and the gate Gs1 have an equal potential.

Each of the coupling diodes D1 to D127 is connected between a corresponding pair of gates Gt, which are two of the gates Gt1 to Gt128 of the transfer thyristors T1 to T128 in the numbered order. That is, the coupling diodes D1 to D127 are connected in series so that each of the coupling diodes D1 to D127 is interposed between a corresponding pair among the gates Gt1 to Gt128. The coupling diode D1 is connected so that a current flows from the gate Gt1 to the gate Gt2. The same applies to the other coupling diodes D2 to D127.

The gates Gt of the transfer thyristors T are connected to the power supply line 71 through the respective power supply line registers Rg provided for the corresponding transfer thyristors T. The power supply line 71 is connected to the terminal Vga. The power supply line 200b (see FIG. 4B) is connected to the terminal Vga, and the terminal Vga is supplied with the power supply potential Vga from the power supply potential supplying unit 170. Since the gates Gs of the setting thyristors S are connected to the gates Gt of the transfer thyristors T, the gates Gs of the setting thyristors S are also connected to the power supply line 71 through the respective power supply line registers Rg.

The gate Gt1 of the transfer thyristor T1 is connected to the cathode of the start diode SD. The anode of the start diode SD is connected to the second transfer signal line 73.

The cathodes of the laser diodes LD are connected to the turn-on signal line 75. The turn-on signal line 75 is connected to the terminal ϕI. The terminal ϕI of the light-emitting chip C1 is connected to the turn-on signal line 204-1 through the current-limiting resistor RI that is provided outside the light-emitting chip C1(C), and the turn-on signal ϕI1 is sent to the terminal ϕI from the turn-on signal generation unit 140 (see FIG. 4B). The turn-on signal ϕI1 supplies a current to turn on the laser diodes LD1 to LD128 of the light-emitting chip C1. Note that the turn-on signal lines 204-2 to 204-40 are respectively connected to the terminals ϕI of the other light-emitting chips C2 to C40 through the respective current-limiting resistors RI, and the turn-on signals φI2 to φI40 are sent to the respective terminals φI from the turn-on signal generation unit 140 (see FIG. 4B). As described above, the anodes of the laser diodes LD are connected to the cathodes of the setting thyristors S. That is, the laser diodes LD and the setting thyristors S are connected in series.

Figures 6A, 6B:
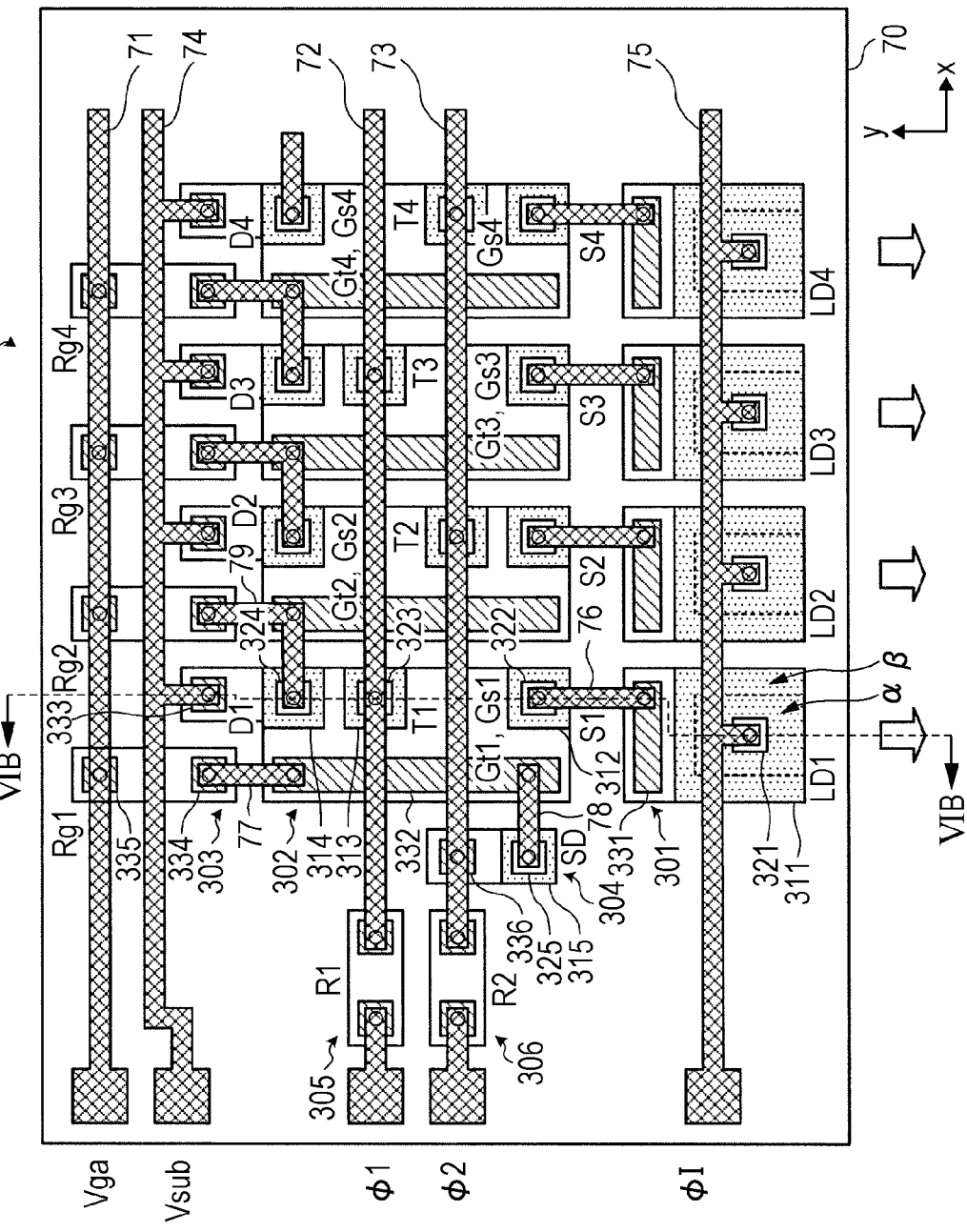
FIGS. 6A and 6B are examples of a plan layout view and a cross-sectional view of the light-emitting chip according to the first exemplary embodiment, specifically.

FIGS. 6A and 6B are an example of a plan layout view and a cross-sectional view of the light-emitting chip C according to the first exemplary embodiment. Specifically, FIG. 6A is a plan layout view of the light-emitting chip C, and FIG. 6B is a cross-sectional view taken along line VIB-VIB illustrated in FIG. 6A. Since connections between the light-emitting chips C and the signal generation circuit 110 are not illustrated in FIGS. 6A and 6B, it is not necessary to use the light-emitting chip C1 by way of example. Thus, the term "light-emitting chip C" is used.

FIG. 6A mainly illustrates a portion around the laser diodes LD1 to LD4, the setting thyristors S1 to S4, and the transfer thyristors T1 to T4. Note that the terminals (φ1, φ2, Vsub, Vga, and φI) are illustrated at a left end portion in FIG. 6A for convenience of explanation, and these positions of the terminals are different from those illustrated in FIG. 4A. When the terminals are disposed in accordance with FIG. 4A, the terminals φ2 and Vga are disposed at a right end portion of the substrate 70. In addition, the start diode SD may be disposed on the right end portion of the substrate 70.

FIG. 6B, which is a cross-sectional view taken along line VIB-VIB illustrated in FIG. 6A, illustrates the laser diodes LD1, the setting thyristor S1, the transfer thyristor T1, and the coupling diode D1 sequentially from the bottom.

FIGS. 6A and 6B illustrate major elements and terminals using reference signs thereof.

Note that a direction in which the laser diodes LD (the laser diodes LD1 to LD4) are arranged on the front surface of the substrate 70 is defined as an x direction, and a direction perpendicular to the x direction is defined as a y direction. A direction from the back surface to the front surface of the substrate 70 is defined as a z direction. Note that a direction in the x-y plane may be referred to as a horizontal direction, the z direction may be expressed as "upward", and the −x direction may be expressed as "downward".

The light-emitting chip C is described with reference to FIGS. 6A and 6B.

The laser diodes LD constituted by a first stacked semiconductor layer 80A are provided on the insulating substrate 70. In the first stacked semiconductor layer 80A, a p-type anode layer 81 (the p-anode layer 81), a light-emitting layer 82, and an n-type cathode layer 83 (the n-cathode layer 83) are sequentially stacked. Note that the laser diode LD1 is provided in an island 301 constituted by the first stacked semiconductor layer 80A. The other laser diodes LD are provided in islands that are substantially the same as the island 301. Note that the aforementioned terms in parentheses are used below. The same applies to the other cases.

In addition, the setting thyristors S, the transfer thyristors T, and the like constituted by a second stacked semiconductor layer 80B are provided on the substrate 70. In the second stacked semiconductor layer 80B, a p-type anode layer 85 (the p-anode layer 85), an n-type gate layer 86 (the n-gate layer 86), a p-type gate layer 87 (the p-gate layer 87), and an n-type cathode layer 88 (the n-cathode layer 88) are sequentially stacked. Note that the setting thyristor S1, the transfer thyristor T1, and the coupling diode D1 are disposed in an island 302 constituted by the second stacked semiconductor layer 80B. The power supply line resistor Rg1 is disposed in the island 303 constituted by the second stacked semiconductor layer 80B. The start diode SD is disposed in an island 304 constituted by the second stacked semiconductor layer 80B. The current-limiting resistor R1 is disposed in an island 305 constituted by the second stacked semiconductor layer 80B, and the current-limiting resistor R2 is disposed in an island 306 constituted by the second stacked semiconductor layer 80B. The other setting thyristors S, the other transfer thyristors T, and the other coupling diodes D are disposed in islands that are substantially the same as the island 302. In addition, the other power supply line resistors Rg are disposed in islands substantially the same as the island 303.

In the light-emitting chip C, a protective layer 90 is disposed to cover the upper surface and the side surfaces of these islands (e.g., the islands 301 and 302) as illustrated in FIG. 6B. The protective layer 90 is formed of a light-transmitting insulating material.

In FIG. 6A, arrows indicate a direction in which light from the laser diodes LD exits (light emission direction). Herein, the light emission direction is a direction perpendicular to the front surface of the substrate 70 (−y direction in this example). In addition, the surface (emission surface) from which the laser diodes LD light exits is an etched surface by way of example. Note that the emission surface of the laser diodes LD may be a cleaved surface. In this example, the protective layer 90 is not disposed on the emission surface of the laser diodes LD.

These islands are connected to wires such as the power supply lines 71 and 74, the first transfer signal line 72, the second transfer signal line 73, and the turn-on signal line 75 via through-holes (illustrated as circles in FIG. 6A) formed in the protective layer 90. A description of the protective layer 90 and the through-holes is omitted below.

The first stacked semiconductor layer 80A including the p-anode layer 81, the light-emitting layer 82, and the n-cathode layer 83, and the second stacked semiconductor layer 80B including the p-anode layer 85, the n-gate layer 86, the p-gate layer 87, and the n-cathode layer 88 are layers monolithically stacked by epitaxial growth, as described later.

To form the islands (e.g., the islands 301 and 302) that are mutually isolated in island shapes, the semiconductor layers between the islands are removed by etching (mesa etching).

The terms "p-anode layer 81" and "n-cathode layer 83" herein correspond to functions (operations) in the case where these layers constitute the laser diode LD. That is, the p-anode layer 81 functions as the anode, and the n-cathode layer 83 functions as the cathode. Note that each of the p-anode layer 81 and the n-cathode layer 83 functions as a cladding layer in the laser diode LD. Thus, the p-anode layer 81 and the n-cathode layer 83 may also be referred to as the p-anode (cladding) layer 81 and the n-cathode (cladding) layer 83, respectively.

The terms "p-anode layer 85", "n-gate layer 86", "p-gate layer 87", and "n-cathode layer 88" correspond to functions (operations) in the case where these layers constitute the setting thyristor S and the transfer thyristor T. That is, the p-anode layer 85 functions as the anode, the n-gate layer 86 and the p-gate layer 87 function as the gates, and the n-cathode layer 88 functions as the cathode.

These layers have different functions when they constitute the coupling diode D and the power supply line resistor Rg, as described later.

Now, the islands 301 to 306 will be described in detail with reference to FIGS. 6A and 6B.

As illustrated in FIG. 6B, the laser diode LD1 disposed in the island 301 is constituted by the first stacked semiconductor layer 80A constituted by the p-anode layer 81, the light-emitting layer 82, and the n-cathode layer 83. In addition, the laser diode LD1 uses an n-type ohmic electrode 321 (the n-ohmic electrode 321) as the cathode terminal. The n-ohmic electrode 321 is disposed in a region 311 constituted by the n-cathode layer 83. Further, the laser diode LD1 uses a p-type ohmic electrode 331 (the p-ohmic electrode 331) as the anode terminal. The p-ohmic electrode 331 is disposed on the p-anode layer 81 exposed by removing the n-cathode layer 83 and the light-emitting layer 82.

The p-anode layer 81 includes a current constriction layer 81b (see FIG. 7 described later). The current constriction layer 81b is provided to constrict a current that flows through the laser diode LD to a central portion of the laser diode LD. Since a circumferential portion of the laser diode LD often has a crystal defect resulting from mesa etching, non-radiative recombination is likely to occur. Thus, the current constriction layer 81b is provided so that the central portion of the laser diode LD serves as a current passing portion (region) α in which a current easily flows and the circumferential portion of the laser diode LD serves as a current blocking portion (region) β in which a current does not easily flow. As illustrated in the laser diode LD1 in FIG. 6A, the portion inside a dash line corresponds to the current passing portion α, and the portion outside the dash line corresponds to the current blocking portion β. Note that the current blocking portion β does not have to completely block a current, and a current less easily flows in the current blocking portion β than in the current passing portion α.

If the current blocking portion β is present on a side from which light from the laser diode LD exits, a loss might be generated, thereby reducing the light amount. Thus, the current blocking portion β is removed by etching, and the resultant etched surface serves as the surface (end surface) from which light from the laser diode LD exits as illustrated by the arrows. Consequently, the current blocking portion β is not present on the side from which light from the laser diode LD exits (−y in FIG. 6A).

Note that the surface from which light from the laser diode LD exits may be formed by cleaving, and if the loss is small, the portion of the current blocking portion β does not have to be removed. Advantages of leaving the portion of the current blocking portion β unremoved include the prevention of catastrophic optical damage (COD), which arises as an issue in a case of high-power light output in an end-surface emission type, because a portion that does not emit light is provided in a portion from which light exits (window structure).

Since the current constriction layer 81b reduces electric power consumed by non-radiative recombination, power consumption is reduced, and light extraction efficiency improves. Note that the light extraction efficiency indicates an amount of light that is successfully extracted per certain amount of power consumption.

In the case where the current blocking portion β is formed by oxidation as described later, regions of equal distance from the periphery of the island 301 become the current blocking portion β. However, in FIG. 6A, which schematically illustrates the current blocking portion β, the distances from the periphery of the island 301 are not equal. That is, in FIG. 6A, the width of the current blocking portion β in the y direction of the island 301 and the width of the current blocking portion β in the ±x direction are illustrated to be different.

The current constriction layer 81b will be described later.

As illustrated in FIG. 6B, the setting thyristor S1 and the transfer thyristor T1 disposed in the island 302 are constituted by the second stacked semiconductor layer 80B constituted by the p-anode layer 85, the n-gate layer 86, the p-gate layer 87, and the n-cathode layer 88. The setting thyristor S1 uses an n-ohmic electrode 322 as the cathode terminal. The n-ohmic electrode 322 is disposed in a region 312 constituted by the n-cathode layer 88. The transfer thyristor T1 uses an n-ohmic electrode 323 as the cathode terminal. The n-ohmic electrode 323 is disposed in a region 313 constituted by the n-cathode layer 88. The setting thyristor S1 and the transfer thyristor T1 use a p-ohmic electrode 333 as the anode terminals. The p-ohmic electrode 333 is disposed on the p-anode layer 85 exposed by removing the n-cathode layer 88, the p-gate layer 87, and the n-gate layer 86. In addition, the setting thyristor S1 and the transfer thyristor T1 use a p-ohmic electrode 332 as the gate Gt1 terminal and the gate Gs1 terminal. The p-ohmic electrode 332 is disposed on the p-gate layer 87 exposed by removing the n-cathode layer 88. Note that the gate Gt1 and the gate Gs1 are common to each other (gate Gt1 (gate Gs1)).

Likewise, the coupling diode D1 disposed in the island 302 is constituted by the p-gate layer 87 and the n-cathode layer 88 in the second stacked semiconductor layer 80B. The coupling diode D1 uses an n-ohmic electrode 324 as the cathode terminal. The n-ohmic electrode 324 is disposed in a region 314 constituted by the n-cathode layer 88. The coupling diode D1 uses the p-ohmic electrode 332 as the anode terminal. The p-ohmic electrode 332 is disposed on the p-gate layer 87 exposed by removing the n-cathode layer 88. The anode of the coupling diode D1 here is common to the gate Gt1 (gate Gs1).

The power supply line resistor Rg1 disposed in the island 303 is constituted by the p-gate layer 87 in the second stacked semiconductor layer 80B. That is, the power supply line resistor Rg1 is disposed using, as the resistor, the p-gate layer 87 between a p-ohmic electrode 334 and a p-ohmic electrode 335. The p-ohmic electrode 334 and the p-ohmic electrode 335 are disposed on the p-gate layer 87 exposed by removing the n-cathode layer 88.

The start diode SD disposed in the island 304 is constituted by the p-gate layer 87 and the n-cathode layer 88 in the second stacked semiconductor layer 80B. That is, the start diode SD uses an n-ohmic electrode 325 as the cathode terminal. The n-ohmic electrode 325 is disposed in a region 315 constituted by the n-cathode layer 88. The start diode SD uses a p-ohmic electrode 336 as the anode terminal. The p-ohmic electrode 336 is disposed on the p-gate layer 87 exposed by removing the n-cathode layer 88.

The current-limiting resistor R1 disposed in the island 305 and the current-limiting resistor R2 disposed in the island 306 are disposed just like the power supply line resistor Rg1 disposed in the island 303 and use the p-gate layer 87 between two p-ohmic electrodes (no reference signs assigned) as the resistor.

Connections between the elements will be described with reference to FIG. 6A.

The turn-on signal line 75 is connected to the n-ohmic electrode 321 serving as the cathode terminal of the laser diode LD1 disposed in the island 301. The turn-on signal line 75 is also connected to the cathode terminal of the other laser diodes LD disposed in islands that are substantially the same as the island 301. The turn-on signal line 75 is connected to the terminal ϕI.

The first transfer signal line 72 is connected to the n-ohmic electrode 323 serving as the cathode terminal of the transfer thyristor T1 disposed in the island 302. The first transfer signal line 72 is also connected to the cathode terminals of the other odd-numbered transfer thyristors T disposed in islands that are substantially the same as the island 302. The first transfer signal line 72 is connected to the terminal φ1 through the current-limiting resistor R1 disposed in the island 305.

On the other hand, the second transfer signal line 73 is connected to n-ohmic electrodes (no reference signs assigned) serving as the cathode terminals of the other even-numbered transfer thyristors T disposed in islands assigned no reference signs. The second transfer signal line 73 is connected to the terminal φ2 through the current-limiting resistor R2 disposed in the island 306.

The power supply line 71 is connected to the p-ohmic electrode 335 serving as one of the terminals of the power supply line resistor Rg1 disposed in the island 303. The power supply line 71 is also connected to each one of the terminals of the other power supply line resistors Rg disposed in islands that are substantially the same as the island 303. The power supply line 71 is connected to the terminal Vga.

The power supply line 74 is connected to the p-ohmic electrode 333 serving as the anode terminals of the setting thyristor S1 and the transfer thyristor T1 disposed in the island 302. The power supply line 74 is connected to the anode terminals of the other setting thyristors S and the other transfer thyristors T disposed in islands that are substantially the same as the island 302. The power supply line 74 is connected to the terminal Vsub.

In addition, the p-ohmic electrode 331 serving as the anode terminal of the laser diode LD1 disposed in the island 301 is connected to the n-ohmic electrode 322 serving as the cathode terminal of the setting thyristor S1 in the island 302 via a connection wire 76. The anode terminals of the laser diodes LD disposed in islands that are substantially the same as the island 301 are connected to the cathode terminals of the setting thyristors S disposed in islands that are substantially the same as the island 302 via connection wires that are substantially the same as the connection wire 76. That is, by connecting the anodes of the laser diodes LD to the cathodes of the setting thyristors S via the connection wires, the connection configuration is simplified.

Furthermore, the p-ohmic electrode 332 serving as the gate Gt1 (gate Gs1) terminal is connected to the p-ohmic electrode 334 serving as one of the terminals of the power supply line resistor Rg1 in the island 303 via a connection wire 77. Each of the other gate Gt (gate Gs) terminals is connected to a corresponding one of the terminals of the power supply line resistors Rg disposed in islands that are substantially the same as the island 303 via a connection wire that is substantially the same as the connection wire 77.

The n-ohmic electrode 324 serving as the cathode terminal of the coupling diode D1 disposed in the island 302 is connected to a p-ohmic electrode (no reference sign assigned) serving as the gate Gt2 (gate Gs2) terminal of the transfer thyristor T2 disposed in an island that is substantially the same as the adjacent island 302 via a connection wire 79. The cathode terminals of the coupling diodes D disposed in islands that are substantially the same as the island 302 are connected to the gate Gt (gate Gs) terminals of the thyristors T disposed in islands that are substantially the same as the adjacent island 302 via connection wires that are substantially the same as the connection wire 79.

The p-ohmic electrode 332 serving as the gate Gt1 (gate Gs1) terminal of the setting thyristor S1 and the transfer thyristor T1 disposed in the island 302 is connected to the n-ohmic electrode 325 serving as the cathode terminal of the start diode SD disposed in the island 304 via a connection wire 78. The p-ohmic electrode 336 serving as the anode terminal of the start diode SD is connected to the second transfer signal line 73.

Note that the above connection and configuration corresponds to an anode-common case, and the polarity is reversed in a cathode-common case.

Series Connection Between Laser Diode LD and Setting Thyristor S

Figure 7:
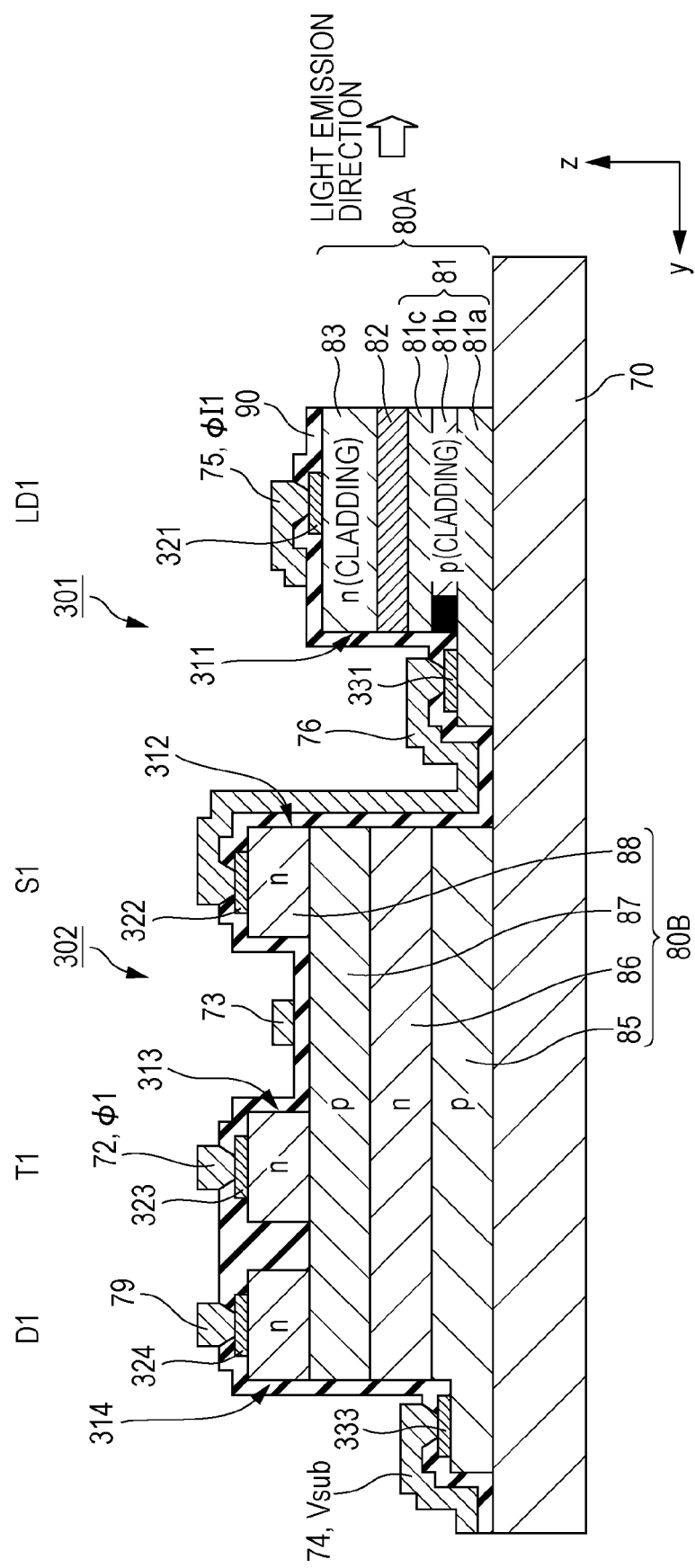
FIG. 7 is an enlarged cross-sectional view of an island in which a laser diode is disposed and an island in which a setting thyristor, a transfer thyristor, and the like are disposed in the light-emitting chip according to the first exemplary embodiment.

FIG. 7 is an enlarged cross-sectional view of the island 301 and the island 302 in the light-emitting chip C according to the first exemplary embodiment. The laser diode LD1 is disposed in the island 301, and the setting thyristor S1, the transfer thyristor T1, and the like are disposed in the island 302. Note that the protective layer 90 is omitted from the illustration. In addition, although FIG. 7 is a cross-sectional view taken along line VIB-VIB illustrated in FIG. 6A, but is viewed from the side (−x direction) opposite to the side illustrated in FIG. 6B. The same applies to the other cross-sectional views illustrated in the following description.

The laser diode LD1 is constituted by the p-anode layer 81 serving as a cladding layer, the light-emitting layer 82, and the n-cathode layer 83 serving as a cladding layer. Thus, the p-anode layer 81 and the n-cathode layer 83 will be respectively referred to as the p-anode (cladding) layer 81 and the n-cathode (cladding) layer 83, and the p-anode (cladding) layer 81 and the n-cathode (cladding) layer 83 are respectively represented as "p (CLADDING)" and "n (CLADDING)" in FIG. 7.

The p-anode (cladding) layer 81 includes the current constriction layer 81b. That is, the p-anode (cladding) layer 81 is constituted by a lower p-anode (cladding) layer 81a, the current constriction layer 81b, and an upper p-anode (cladding) layer 81c.

The light-emitting layer 82 has a quantum well structure in which well layers and barrier layers are alternately stacked. In addition, the light-emitting layer 82 may be an intrinsic (i-type) layer not doped with any impurities. Alternatively, the light-emitting layer 82 may have a structure other than the quantum well structure, for example, a quantum wire structure or a quantum dot structure.

The p-anode (cladding) layer 81, the n-cathode (cladding) layer 83, and the light-emitting layer 82 are set such that light emitted from the light-emitting layer 82 is confined between the p-anode (cladding) layer 81 and the n-cathode (cladding) layer 83 and that laser oscillation occurs between side surfaces (end faces) of the light-emitting layer 82. In this case, the light exits in parallel to the substrate 70 from a side surface (end face) of the light-emitting layer 82, as indicated by the arrow.

The setting thyristor S1 and the transfer thyristor T1 are constituted by the p-anode layer 85, the n-gate layer 86, the p-gate layer 87, and the n-cathode layer 88. That is, the setting thyristor S1 and the transfer thyristor T1 have a pnpn four-layer structure.

As described above, the p-ohmic electrode 331 serving as the anode terminal disposed on the p-anode layer 81 of the laser diode LD1 and the n-ohmic electrode 322 serving as the cathode terminal disposed on the n-cathode layer 88 of the setting thyristor S1 are connected to each other via the connection wire 76. That is, the laser diode LD1 and the setting thyristor S1 are connected in series. In addition, the n-ohmic electrode 321 serving as the cathode terminal of the laser diode LD1 is connected to the turn-on signal line 75 supplied with the turn-on signal φI1, and the p-ohmic electrode 333 serving as the anode terminal of the setting thyristor S1 is connected to the power supply line 74 supplied with the reference potential Vsub. That is, a voltage between the reference potential Vsub and the potential of the turn-on signal ϕI1 are applied to the laser diode LD1 and the setting thyristor S1 connected in series.

On the other hand, the n-ohmic electrode 323 serving as the cathode terminal of the transfer thyristor T1 is connected to the first transfer signal line 72 supplied with the first transfer signal ϕ1. The p-ohmic electrode 333 serving as the anode terminal of the transfer thyristor T1 is connected to the power supply line 74 supplied with the reference potential Vsub. That is, a voltage between the reference potential Vsub and the potential of the first transfer signal ϕ1 is applied to the transfer thyristor T1.

Thyristor

Next, a basic operation of a thyristor (the transfer thyristor T or the setting thyristor S) will be described. As described before, the thyristor is a semiconductor element having three terminals, i.e., the anode terminal (anode), the cathode terminal (cathode), and the gate terminal (gate), and is constituted by stacking p-type semiconductor layers (the p-anode layer 85 and the p-gate layer 87) and n-type semiconductor layers (the n-gate layer 86 and the n-cathode layer 88) formed of, for example, GaAs, GaAlAs, AlAs, or the like on the substrate 70. That is, a thyristor has a pnpn structure. A description is given here on the assumption that a forward potential (diffusion potential) Vd of a pn junction formed by a p-type semiconductor layer and an n-type semiconductor layer is equal to 1.5 V, for example.

The following description is given on the assumption that the reference potential Vsub is a high-level potential (hereinafter, referred to as "H" or "H" (0 V)) of 0 V, a first low-level potential (hereinafter, referred to as "L1" (−3.3 V)) of −3.3 V, or a second low-level potential (hereinafter, referred to as "L2" (−5 V)) of −5 V, for example.

The power supply potential Vga supplied to the Vga terminal is at "L1" (−3.3 V). The first transfer signal ϕ1 and the second transfer signal ϕ2 are signals having "H" (0 V) and "L1" (−3.3 V). The turn-on signal ϕI is a signal having "H" (0 V) and "L2" (−5 V).

First, an operation of the thyristor alone will be described. In this example, the anode of the thyristor is assumed to have a potential of 0 V.

When a potential lower than or equal to a threshold voltage (a negative potential having a greater absolute value) is applied across the anode and the cathode of a thyristor that is in an off-state in which no current flows between the anode and the cathode, the thyristor enters an on-state (turns on). Note that the threshold voltage of the thyristor is equal to a value obtained by subtracting the forward potential Vd (1.5 V) of the pn junction from the gate potential.

When the thyristor enters the on-state, the gate of the thyristor has a potential close to the potential of the anode. Since the potential of the anode is 0 V in this case, the potential of the gate becomes equal to 0 V. In addition, the cathode of the on-state thyristor has a potential close to a potential obtained by subtracting the forward potential Vd (1.5 V) of the pn junction from the potential of the anode. Since the potential of the anode is 0 V in this case, the cathode of the on-state transfer thyristor T1 has a potential close to −1.5 V (a negative potential having an absolute value greater than 1.5 V). Note that the potential of the cathode is set in accordance with a relationship with a power supply that supplies a current to the on-state transfer thyristor T1.

When the cathode of the on-state thyristor has a potential higher than or equal to (a negative potential having an absolute value of less than or equal to, 0 V, or a positive potential) a potential necessary to maintain the thyristor in the on-state (a potential close to −1.5 V), the thyristor enters the off-state (turns off).

On the other hand, when a potential lower than or equal to (a negative potential having an absolute value of greater than or equal to) the potential necessary to maintain the thyristor in the on-state is continuously applied to the cathode of the on-state transfer thyristor T1 and a current that successfully maintains the on-state (maintaining current) is supplied to the transfer thyristor T1, the transfer thyristor T1 is maintained in the on-state.

The transfer thyristor T1 will be specifically described. The reference potential Vsub ("H" (0 V)) and the potential of the first transfer signal ϕ1 ("H" (0 V) or "L1" (−3.3 V)) are respectively applied the anode and the cathode of the transfer thyristor T1. Here, when the first transfer signal ϕ1 has a potential of "L1" (−3.3 V), −3.3 V is applied across the anode and the cathode of the transfer thyristor T1. Thus, if the threshold voltage of the transfer thyristor T1 is a potential lower than or equal to (a negative potential having an absolute value of greater than or equal to) −3.3 V, that is, if the gate Gt1 has a potential higher than or equal to (a negative potential having an absolute value of less than or equal to) −1.8 V, the transfer thyristor T1 turns on. Conversely, if a voltage lower than or equal to (a voltage having an absolute value of greater than or equal to) the threshold voltage of the transfer thyristor T1 is applied across the cathode and the anode, the transfer thyristor T1 turns on.

The same applies to the other transfer thyristors T.

Next, an operation of the laser diode LD and the setting thyristor S that are connected in series will be described by referring to the laser diode LD1 and the setting thyristor S1.

The reference potential Vsub ("H" (0 V)) and the potential of the turn-on signal ϕI ("H" (0 V) or "L2" (−5 V)) are applied to the laser diode LD1 and the setting thyristor S1 connected in series. If the turn-on signal ϕI1 has a potential of "L2" (−5 V), −5 V is divided into a voltage for the laser diode LD1 and a voltage for the setting thyristor S1. The description is given here on the assumption that the voltage applied to the laser diode LD1 is equal to −1.7 V. In addition, the description is given on the assumption that −3.3 V is applied to the setting thyristor S1 when the setting thyristor S1 is in the off-state. As in the above-described transfer thyristor T1, when the absolute value of the threshold voltage of the setting thyristor S1 is less than or equal to −3.3 V, that is, when the gate Gs1 has a potential of higher than or equal to (a negative potential having an absolute value of less than or equal to) −1.8 V, the setting thyristor S1 turns on. In response to this, a current flows to the laser diode LD1 and the setting thyristor S1 that are connected in series, and the laser diode LD1 turns on (emits light).

On the other hand, when the absolute value of the threshold voltage of the setting thyristor S1 is greater than −3.3 V, the setting thyristor S1 does not turn on and is maintained in the off-state. Thus, the laser diode LD1 is also maintained in the off-state (no light emission).

Note that when the setting thyristor S1 turns on, the absolute value of a voltage to be applied to the laser diode LD1 and the setting thyristor S1 that are connected in series is decreased by the current-limiting resistor RI (see FIG. 5). However, as long as the voltage to be applied to the setting thyristor S1 is a voltage that maintains the setting thyristor S1 in the on-state, the setting thyristor S1 is maintained in the on-state. Thus, the laser diode LD1 continues to emit light.

The same applies to the other laser diodes LD and the other setting thyristors S.

In this way, the setting thyristors S that drive the laser diodes LD and the laser diodes LD are controlled by using the turn-on signal ϕI, and thereby turn-on control is made easier.

Note that the voltages described above are merely examples and are changed in accordance with characteristics of the setting thyristors S and the transfer thyristors T and/or the emission wavelength or light amount of the laser diodes LD. In such a case, "L1" and/or "L2" may be adjusted.

Since the thyristor (the setting thyristor S or the transfer thyristor T) is composed of a semiconductor such as GaAs, the thyristor in the on-state might possibly emit light between the n-gate layer 86 and the p-gate layer 87. The amount of light emitted from the thyristor is determined on the basis of the area of the cathode and a current flowing between the cathode and the anode. Accordingly, in the case where the light emitted from the thyristor is not used, for example, the area of the cathode may be reduced, or the thyristor may be shielded by using a material for forming the electrode (the n-ohmic electrode 322 of the setting thyristor S1 and/or the n-ohmic electrode 323 of the transfer thyristor T1), a wire, or the like so as to suppress unnecessary light.

Operation of Light-Emitting Device 65

An operation of the light-emitting device 65 will be described next.

As described before, the light-emitting device 65 includes the light-emitting chips C1 to C40 (see FIGS. 3 to 4B).

Since the light-emitting chips C1 to C40 are driven in parallel, a description of the operation of the light-emitting chip C1 may suffice.

Timing Chart

Figure 8:
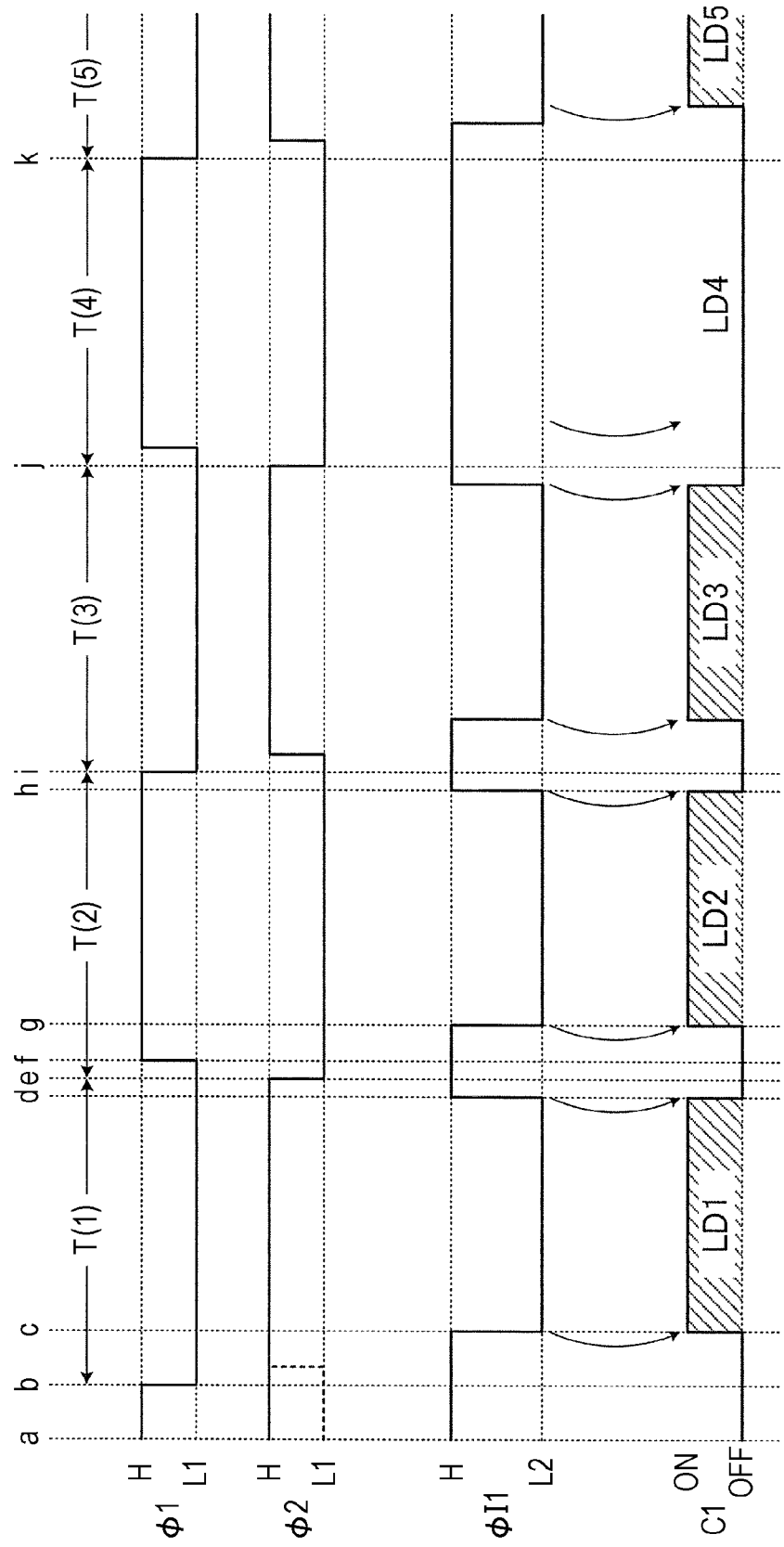
FIG. 8 is a timing chart illustrating an operation of the light-emitting device and an operation of the light-emitting chip.

FIG. 8 is a timing chart illustrating the operation of the light-emitting device 65 and the operation of the light-emitting chip C.

FIG. 8 is a timing chart of a period in which on (light emission) and off (no light emission) of five laser diodes LD (i.e., the laser diodes LD1 to LD5) of the light-emitting chip C1 are controlled (hereinafter, referred to as turn-on control). Note that the laser diodes LD1, LD2, LD3, and LD5 of the light-emitting chip C1 are turned on, and the laser diode LD4 is maintained in the off-state (no light emission) in FIG. 8.

In FIG. 8, time passes in the alphabetical order from time a to time k. On (light emission) and off (no light emission) of the laser diodes LD1, LD2, LD3, and LD4 are controlled (turn-on control is performed) in periods T(1), T(2), T(3), and T(4), respectively. Turn-on control is performed on the laser diodes LD assigned the numbers of 5 and greater in the similar manner.

It is assumed here that the periods T(1), T(2), T(3), . . . have equal durations and are referred to as periods T when they are not distinguished from one another.

Each of the first transfer signal ϕ1 that is sent to the terminal ϕ1 (see FIGS. 5 to 6B) and the second transfer signal ϕ2 that is sent to the terminal ϕ2 (see FIGS. 5 to 6B) is a signal having two potentials of "H" (0 V) and "L1" (−3.3 V). Each of the first transfer signal ϕ1 and the second transfer signal ϕ2 has a waveform that iterates in a unit of two consecutive periods T (for example, the periods T(1) and T(2)). Hereinafter, the expressions "H" (0 V) and "L1" (−3.3 V) are sometimes simply referred to as "H" and "L1", respectively.

The first transfer signal ϕ1 changes from "H" (0V) to "L1" (−3.3 V) at the start time b of the period T(1) and changes from "L1" to "H" at the time f. The first transfer signal ϕ1 then changes from "H" to "L1" at the end time i of the period T(2).

The second transfer signal ϕ2 is at "H" (0V) at the start time b of the period T(1) and changes from "H" (0V) to "L1" (−3.3 V) at the time e. Then, the second transfer signal ϕ2 changes from "L1" to "H" slightly after the end time i of the period T(2).

Comparison of the first transfer signal ϕ1 and the second transfer signal ϕ2 indicates that the second transfer signal ϕ2 is a signal obtained by shifting the first transfer signal ϕ1 behind by the period T on the time axis. The waveform of the second transfer signal ϕ2 that is indicated by a dotted line in the period T(1) and the waveform in the period T(2) iterate in the period T(3) and subsequent periods. The waveform of the second transfer signal ϕ2 in the period T(1) is different from that in the period T(3) and thereafter because the period T(1) is a period in which the light-emitting device 65 starts the operation.

A set of transfer signals (i.e., the first transfer signal ϕ1 and the second transfer signal ϕ2) specifies the laser diode LD assigned the same number as the number of the on-state transfer thyristor T to be a target of on (light emission)/off (no light emission) control (turn-on control) by propagating (transferring) the on-state of the transfer thyristors T in the numbered order as described later.

The turn-on signal ϕI1 that is sent to the terminal ϕI of the light-emitting chip C1 will be described next. Note that turn-on signals ϕI2 to ϕI40 are sent to the other light-emitting chips C2 to C40, respectively. The turn-on signal ϕI1 is a signal having two potentials of "H" (0 V) and "L2" (−5 V). Hereinafter, "H" (0 V) and "L2" (−5 V) may be abbreviated to "H" and "L2".

The turn-on signal ϕI1 in the period T(1) in which turn-on control is performed on the laser diode LD1 of the light-emitting chip C1 will be described in this example. The turn-on signal ϕI1 is at "H" (0 V) at the start time b of the period T(1) and changes from "H" (0 V) to "L2" (−5 V) at the time c. Then, the turn-on signal ϕI1 changes from "L2" to "H" at the time d and maintains "H" at the time e.

The operation of the light-emitting device 65 and the operation of the light-emitting chip C1 will be described in accordance with the timing chart illustrated in FIG. 8 with reference to FIGS. 4A to 7. Note that the periods T(1) and T(2) in which turn-on control is performed on the laser diodes LD1 and LD2 will be described below.

(1) Time a

Light-Emitting Device 65

At the time a, the reference potential supplying unit 160 of the signal generation circuit 110 of the light-emitting device 65 sets the reference potential Vsub to "H" (0 V). The power supply potential supplying unit 170 sets the power supply potential Vga to "L1" (−3.3 V). Then, the power supply line 200a on the circuit board 62 of the light-emitting device 65 has the reference potential Vsub ("H" (0 V)), and each of the terminals Vsub of the light-emitting chips C1 to C40 has "H" (see FIG. 4B). Thus, each of the power supply lines 74 of the light-emitting chips C1 to C40 has "H" (see FIG. 5).

Likewise, the power supply line 200b has the power supply potential Vga ("L1" (−3.3 V)), and each of the terminals Vga of the light-emitting chips C1 to C40 has "L1" (see FIG. 4B). As a result, each of the power supply lines 71 of the light-emitting chips C1 to C40 has "L1" (see FIG. 5).

Then, the transfer signal generation unit 120 of the signal generation circuit 110 sets the first transfer signal ϕ1 and the second transfer signal ϕ2 to "H" (0 V). Then, the first transfer signal line 201 and the second transfer signal line 202 have "H" (see FIG. 4B). Consequently, the terminals ϕ1 and ϕ2 of each of the light-emitting chips C1 to C40 have "H". The first transfer signal line 72 that is connected to the terminal ϕ1 through the current-limiting resistor R1 has "H", and the second transfer signal line 73 that is connected to the terminal ϕ1 through the current-limiting resistor R2 also has "H" (see FIG. 5).

Further, the turn-on signal generation unit 140 of the signal generation circuit 110 sets the turn-on signals ϕI1 to ϕI40 to "H" (0 V). Then, the turn-on signal lines 204-1 to 204-40 have "H" (see FIG. 4B). Consequently, the terminal ϕI of each of the light-emitting chips C1 to C40 has "H" through the current-limiting resistor RI, and the turn-on signal line 75 connected to the terminal ϕI also has "H" (0 V) (see FIG. 5).

Light-Emitting Chip C1

The anode (the p-anode layer 85) of the transfer thyristor T and of the setting thyristor S is connected to the terminal Vsub that is set to "H" (0V) via the p-ohmic electrode (the p-ohmic electrode 333 in the transfer thyristor T1 and the setting thyristor S1) and the power supply line 74 (see FIGS. 6A to 7).

The cathodes (the n-cathode layer 88) of the odd-numbered transfer thyristors T1, T3, T5, . . . are set to "H" (0 V) of the first transfer signal line 72 through the n-ohmic electrode (the n-ohmic electrode 323 in the transfer thyristor T1). The cathodes (the n-cathode layer 88) of the even-numbered transfer thyristors T2, T4, T6, . . . are set to "H" (0 V) of the second transfer signal line 73 through the n-ohmic electrode. Thus, since both the anode and the cathode of each of the transfer thyristors T have "H" (0 V), the transfer thyristor T is in the off-state.

The cathodes (the n-cathode layer 83) of the laser diodes LD are set to "H" (0 V) of the turn-on signal line 75. Thus, both the anode and the cathode of the laser diode LD and the setting thyristor S connected in series have "H" (0 V), and the laser diode LD and the setting thyristor S are in the off-state.

The gate Gt1 is connected to the cathode of the start diode SD as described before. The gate Gt1 is connected to the power supply line 71 having the power supply potential Vga ("L1" (−3.3 V)) through the power supply line resistor Rg1. The anode of the start diode SD is set to "H" (0 V) of the second transfer signal line 73. Thus, the start diode SD is forward-biased, and the cathode (gate Gt1) of the start diode SD has a potential (−1.5 V) obtained by subtracting the forward potential Vd (1.5 V) of the pn junction from the potential ("H" (0 V)) of the anode of the start diode SD. If the potential of the gate Gt1 becomes equal to −1.5 V, the coupling diode D1 is forward-biased since the anode (gate Gt1) thereof has −1.5 V and the cathode thereof is connected to the power supply line 71 ("L1" (−3.3 V)) through the power supply line resistor Rg2. Thus, the potential of the gate Gt2 becomes equal to −3 V obtained by subtracting the forward potential Vd (1.5 V) of the pn junction from the potential (−1.5 V) of the gate Gt1. In addition, the anode (gate Gt2) of the coupling diode D2 has −3 V, and the cathode thereof is connected to the power supply line 71 ("L1" (−3.3 V)) through the power supply line resistor Rg2. However, since the potential difference is −0.3 V, which is smaller than the forward potential Vd (1.5 V) in the absolute value, the potential of the gate Gt3 becomes equal to the power supply potential Vga ("L1" (−3.3 V)). That is, there is no influence of the connection of the second transfer signal line 73 to the anode of the start diode SD having "H" (0 V) on the gates Gt assigned the numbers of 3 and greater, and these gates Gt have the power supply potential Vga ("L1" (−3.3 V)) which is the potential of the power supply line 71.

Since the gates Gt serve as the gates Gs, the gates Gs have a potential equal to the potential of the gates Gt. Thus, the threshold voltages of the transfer thyristors T and the setting thyristors S are equal to a value obtained by subtracting the forward potential Vd (1.5 V) of the pn junction from the potential of the gates Gt (gates Gs). That is, the threshold voltages of the transfer thyristor T1 and the setting thyristor S1 are equal to −3 V, the threshold voltages of the transfer thyristor T2 and the setting thyristor S2 are equal to −4.5 V, and the threshold voltages of the transfer thyristors T and the setting thyristors S assigned the number of 3 or greater are equal to −4.8 V.

(2) Time b

At the time b illustrated in FIG. 8, the first transfer signal ϕ1 changes from "H" (0 V) to "L1" (−3.3 V). In response to this, the light-emitting device 65 starts the operation.

Upon the first transfer signal ϕ1 changing from "H" to "L1", the potential of the first transfer signal line 72 changes from "H" (0 V) to "L1" (−3.3 V) through the terminal ϕ1 and the current-limiting resistor R1. Then, the cathode of the transfer thyristor T1 has "L1", and −3.3 V is applied across the anode and the cathode of the transfer thyristor T1. Since the threshold voltage of the transfer thyristor T1 is equal to −3 V, the transfer thyristor T1 turns on. In response to turn-on of the transfer thyristor T1, the potential of the first transfer signal line 72 becomes equal to a potential close to −1.5 V (a negative potential having an absolute value greater than 1.5 V) obtained by subtracting the forward potential Vd (1.5 V) of the pn junction from the potential ("H" (0 V)) of the anode of the transfer thyristor T1. The description here is given on the assumption that the potential of the first transfer signal line 72 becomes equal to −1.5 V.

Note that the threshold voltage of the odd-numbered transfer thyristors T assigned the number of 3 or greater is −4.8 V. The voltage applied to the odd-numbered transfer thyristors T assigned the number of 3 or greater is equal to −1.8 V. Thus, the odd-numbered transfer thyristors T assigned the number of 3 or greater do not turn on.

On the other hand, the even-numbered transfer thyristors T do not turn on because the second transfer signal ϕ2 has "H" (0 V) and the second transfer signal line 73 to which the cathodes thereof are connected has "H" (0 V).

In response to turn-on of the transfer thyristor T1, the potential of the gate Gt1 (gate Gs1) becomes equal to "H" (0 V) that is the potential of the anode of the transfer thyristor T1. In addition, the potential of the gate Gt2 (gate Gs2) becomes equal to −1.5 V, the potential of the gate Gt3 (gate Gs3) becomes equal to −3 V, the potential of the gate Gt (gate Gs) assigned the number of 4 or greater becomes equal to "L1" (−3.3 V).

When the potential of the gate Gs1 becomes equal to "H" (0 V), the threshold voltage of the setting thyristor S1 becomes equal to −1.5 V. In addition, the threshold voltages of the transfer thyristor T2 and the setting thyristor S2 become equal to −3 V, the threshold voltages of the transfer thyristor T3 and the setting thyristor S3 become equal to −4.5 V, and the threshold voltages of the transfer thyristor T and the setting thyristor S assigned the number of 4 or greater become equal to −4.8 V.

However, since the first transfer signal line 72 has −1.5 V due to the on-state transfer thyristor T1, the odd-numbered transfer thyristors T that are in the off-state do not turn on. Since the second transfer signal line 73 has "H" (0 V), the even-numbered transfer thyristors T do not turn on. In addition, the turn-on signal line 75 has "H" (0 V), none of the laser diodes LD turn on.

Immediately after the time b (indicating time at which a steady state is achieved after a change in the thyristor and the like has occurred in response to a change in the potential of the signal at the time b. The same applies to the other cases), the transfer thyristor T1 is in the on-state and the other transfer thyristors T, the setting thyristors S, and the laser diodes LD are in the off-state.

(3) Time c

At the time c, the turn-on signal ϕI1 changes from "H" (0 V) to "L2" (−5 V).

Upon the turn-on signal ϕI1 changing from "H" to "L2", the turn-on signal line 75 changes from "H" (0 V) to "L2" (−5 V) through the current-limiting resistor RI and the terminal ϕI. Then, −1.7 V is applied to the laser diode LD, and thus, −3.3 V is applied to the setting thyristor S1. Then, the setting thyristor S1 having a threshold voltage of −1.5 V turns on, and thus, the laser diode LD1 that is connected to the setting thyristor S1 in series turns on (emits light). Then, the potential of the turn-on signal line 75 becomes equal to a potential close to −3.2 V. It is assumed here that the potential of the turn-on signal line 75 becomes equal to −3.2 V. Note that the threshold voltage of the setting thyristor S2 is equal to −3 V. However, since −1.7 V is applied to the laser diode LD2, the voltage applied to the setting thyristor S2 is equal to −1.5 V. Thus, the setting thyristor S2 does not turn on.

Immediately after the time c, the transfer thyristor T1 and the setting thyristor S1 are in the on-state, and the laser diode LD1 is on (is emitting light).

(4) Time d

At the time d, the turn-on signal ϕI1 changes from "L2" (−5 V) to "H" (0 V).

Upon the turn-on signal ϕI1 changing from "L2" to "H", the potential of the turn-on signal line 75 changes from −3.2 V to "H" (0 V) through the current-limiting resistor RI and the terminal ϕI. Since both the cathode of the setting thyristor S1 and the anode of the laser diode LD1 have "H" (0 V), the setting thyristor S1 turns off, and the laser diode LD1 turns off (no light emission). A period for which the laser diode LD1 is on is a period for which the turn-on signal ϕI1 is at "L2" from the time c at which the turn-on signal ϕI1 changes from "H" to "L2" to the time d at which the turn-on signal ϕI1 changes from "L2" to "H".

Immediately after the time d, the transfer thyristor T1 is in the on-state.

(e) Time e

At the time e, the second transfer signal ϕ2 changes from "H" (0 V) to "L1" (−3.3 V). At the time e, the period T(1) in which turn-on control is performed on the laser diode LD1 ends, and the period T(2) in which turn-on control is performed on the laser diode LD2 starts.

Upon the second transfer signal ϕ2 changing from "H" to "L1", the potential of the second transfer signal line 73 changes from "H" (0 V) to "L1" (−3.3 V) through the terminal ϕ2. As described before, since the threshold voltage of the transfer thyristor T2 is equal to −3 V, the transfer thyristor T2 turns on.

Consequently, the potential of the gate Gt2 (gate Gs2) becomes equal to "H" (0 V), the potential of the gate Gt3 (gate Gs3) becomes equal to −1.5 V, the potential of the gate Gt4 (gate Gs4) becomes equal to −3 V, and the potential of the gate Gt (Gate Gs) assigned the number of 5 or greater becomes equal to "L1" (−3.3 V).

Immediately after the time e, the transfer thyristors T1 and T2 are in the on-state.

(6) Time f

At the time f, the first transfer signal ϕ1 changes from "L1" (−3.3 V) to "H" (0 V).

Upon the first transfer signal ϕ1 changing from "L1" to "H", the potential of the first transfer signal line 72 changes from "L1" to "H" through the terminal ϕ1. Then, both the anode and the cathode of the on-state transfer thyristor T1 have "H" (0 V), and the transfer thyristor T1 turns off.

Then, the potential of the gate Gt1 (gate Gs1) changes toward the power supply voltage Vga ("L1" (−3.3 V)) of the power supply line 71 through the power supply line resistor Rg1. Consequently, the coupling diode D1 enters a state in which a potential is applied so that no current flows therein (a reverse-biased state). Thus, there is no longer an influence of the gate Gt2 (gate Gs2) having "H" (0 V) on the gate Gt1 (gate Gs1). That is, the transfer thyristor T having the gate Gt connected through the reverse-biased coupling diode D has the threshold of −4.8 V and does not turn on with the first transfer signal ϕ1 or the second transfer signal ϕ2 having "L1" (−3.3 V).

Immediately after the time f, the transfer thyristor T2 is in the on-state.

(7) Other Times

Upon the turn-on signal ϕI1 changing from "H" (0 V) to "L2" (−5 V) at the time g, the setting thyristor S2 turns on, and the laser diode LD2 turns on (emits light) just like the setting thyristor S1 and the laser diode LD1 at the time c.

Then, upon the turn-on signal ϕI1 changing from "L2" (−5 V) to "H" (0 V) at the time h, the setting thyristor S2 turns off and the laser diode LD2 turns off just like the setting thyristor S1 and the laser diode LD1 at the time d.

Further, upon the first transfer signal ϕ1 changing from "H" (0 V) to "L1" (−3.3 V) at the time i, the transfer thyristor T3 having a threshold voltage of −3 V turns on just like the transfer thyristor T1 at the time b or the transfer thyristor T2 at the time e. At the time i, the period T(2) in which turn-on control is performed on the laser diode LD2 ends, and the period T(3) in which turn-on control is performed on the laser diode LD3 starts.

The above-described operation is repeated thereafter.

Note that if the laser diode LD is maintained off (no light emission) instead of turning on (light emission), the turn-on signal ϕ1 is maintained at "H" (0 V) just like the turn-on signal ϕI1 from the time j to the time k in the period T(4) in which turn-on control is performed on the laser diode LD4 in FIG. 8. With this configuration, even if the threshold voltage of the setting thyristor S4 is equal to −1.5 V, the setting thyristor S4 does not turn on, and the laser diode LD4 is maintained off (no light emission).

As described above, the gate terminals Gt of the transfer thyristors T are connected to each other by the corresponding coupling diodes D. Thus, when the potential of the gate Gt changes, the potential of the gate Gt that is connected to the potential-changed gate Gt through the forward-biased coupling diode D also changes. This changes the threshold voltage of the transfer thyristor T having the potential-changed gate. The transfer thyristor T turns on at a timing at which the first transfer signal ϕ1 or the second transfer signal ϕ2 changes from "H" (0 V) to "L1" (−3.3 V) if the threshold voltage thereof is higher than or equal to (a negative value having an absolute value of less than or equal to) −3.3 V.

Then, when the transfer thyristor T enters the on-state, the potential of the gate Gt becomes equal to 0 V. This causes the setting thyristor S whose gate Gs is connected to the gate Gt to have a threshold voltage of −1.5 V. Thus, in response to the turn-on signal ϕI changing from "H" (0 V) to "L2" (−5 V), −3.3 V is applied across the anode and the cathode, and the setting thyristor S turns on. Then, the laser diode LD that is connected in series with the setting thyristor S turns on (emits light).

That is, when the transfer thyristor T enters the on-state, the setting thyristor S is ready to enter the on-state. That is, when the transfer thyristor T enters the on-state, the laser diode LD that is that is the target of turn-on control is specified. Then, when the turn-on signal ϕI becomes equal to "L2" (−5 V), the setting thyristor S connected in series with the laser diode LD that is the target of turn-on control turns on, and also the laser diode LD turns on (emits light).

Note that when the turn-on signal ϕI is maintained at "H" (0 V), the setting thyristor S is maintained in the off-state, and also the laser diode LD is maintained in the off-state (no light emission). That is, the turn-on signal ϕI sets on/off of the laser diode LD.

On/off of each laser diode LD is controlled by setting the turn-on signal ϕI in accordance with image data in this way.

Note that in the first stacked semiconductor layer 80A in FIG. 7, the p-anode (cladding) layer 81, the light-emitting layer 82, and the n-cathode (cladding) layer 83 are stacked in this order. Alternatively, in the first stacked semiconductor layer 80A, the n-cathode (cladding) layer 83, the light-emitting layer 82, and the p-anode (cladding) layer 81 may be stacked in this order.

Likewise, in the second stacked semiconductor layer 80B in FIG. 7, the p-anode layer 85, the n-gate layer 86, the p-gate layer 87, and the n-cathode layer 88 are staked in this order. Alternatively, in the second stacked semiconductor layer 80B, the n-cathode layer 88, the p-gate layer 87, the n-gate layer 86, and the p-anode layer 85 may be stacked in this order.

In these cases, the connection relationship is changed so as to set the same circuit configuration (see FIG. 5).

Method for Manufacturing Light-Emitting Chip C

A method for manufacturing the light-emitting chip C will be described.

Figure 9A:
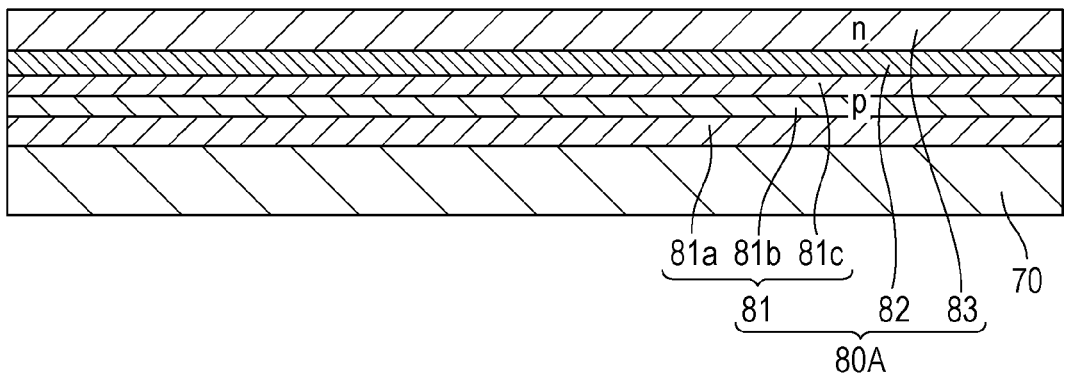
FIGS. 9A to 9C illustrate a method for manufacturing the light-emitting chip, specifically.
Figure 11A:
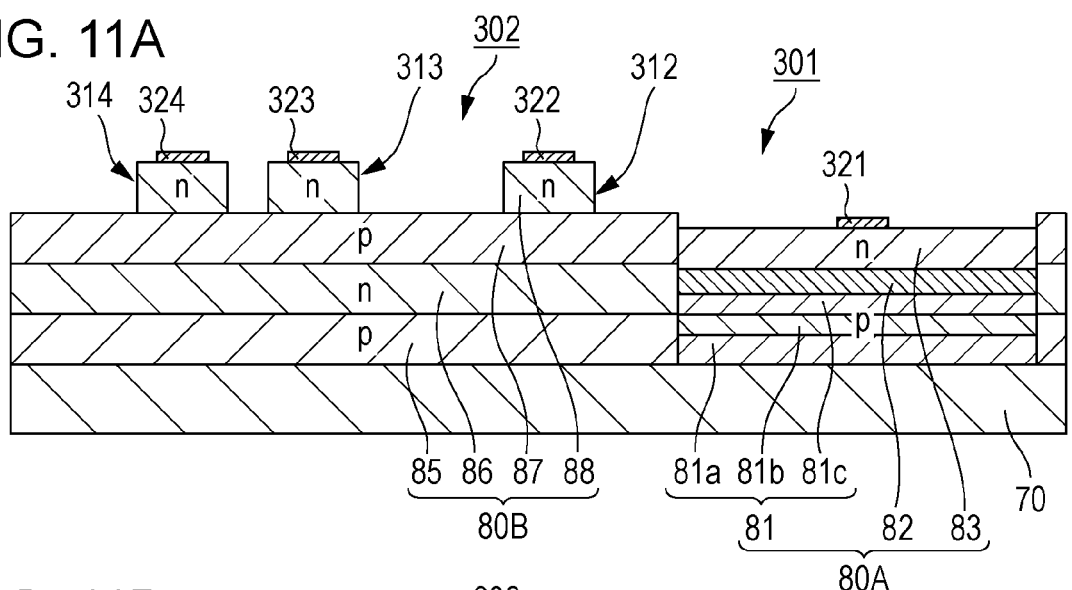
FIGS. 11A to 11C illustrate the method for manufacturing the light-emitting chip, specifically.
Figure 11B:
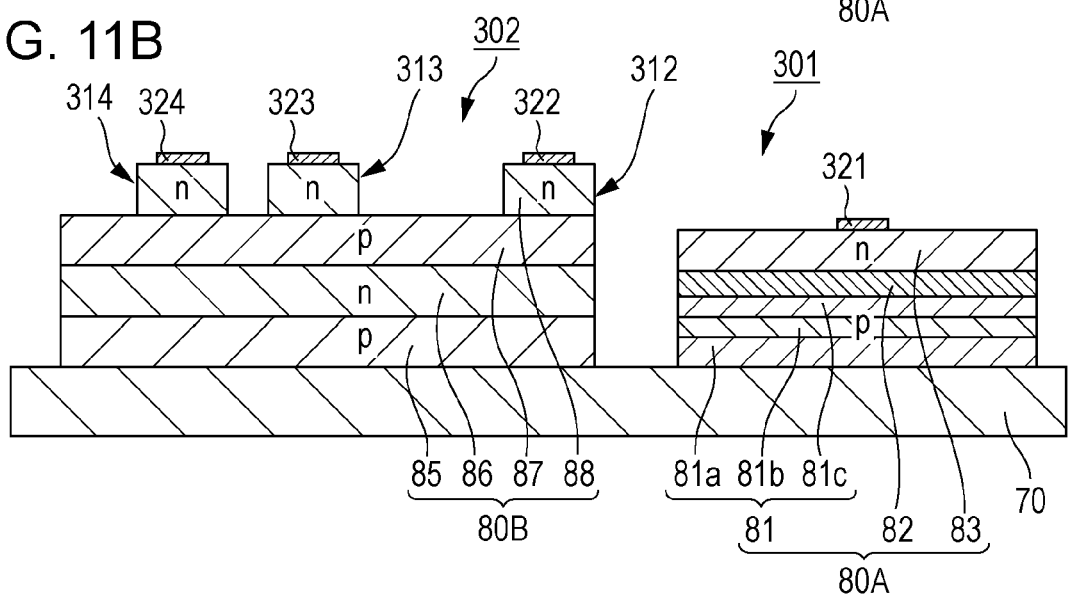
Figure 11C:
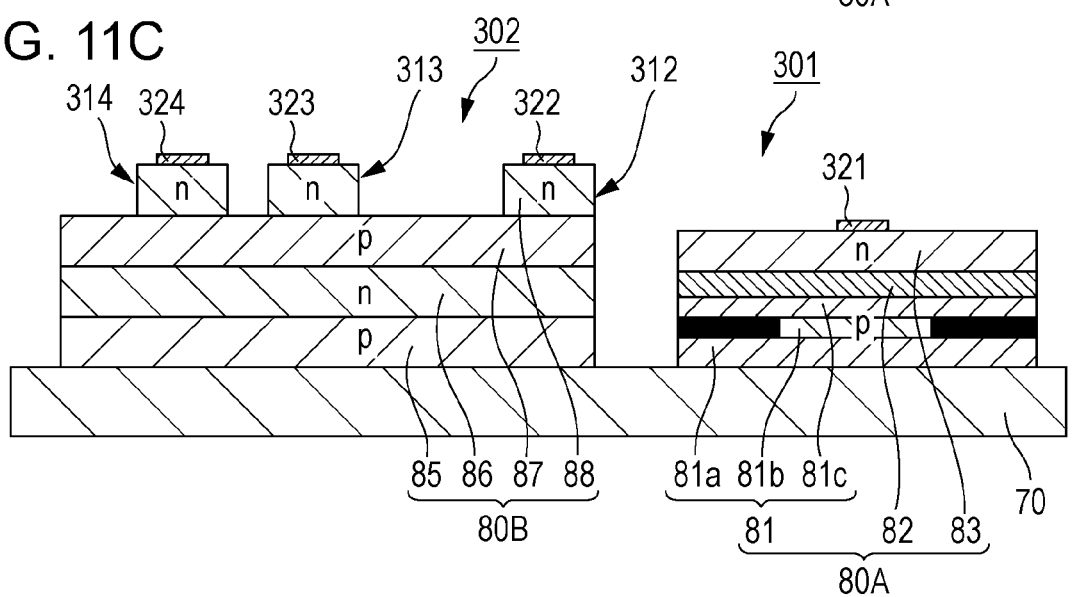
Figure 12A:
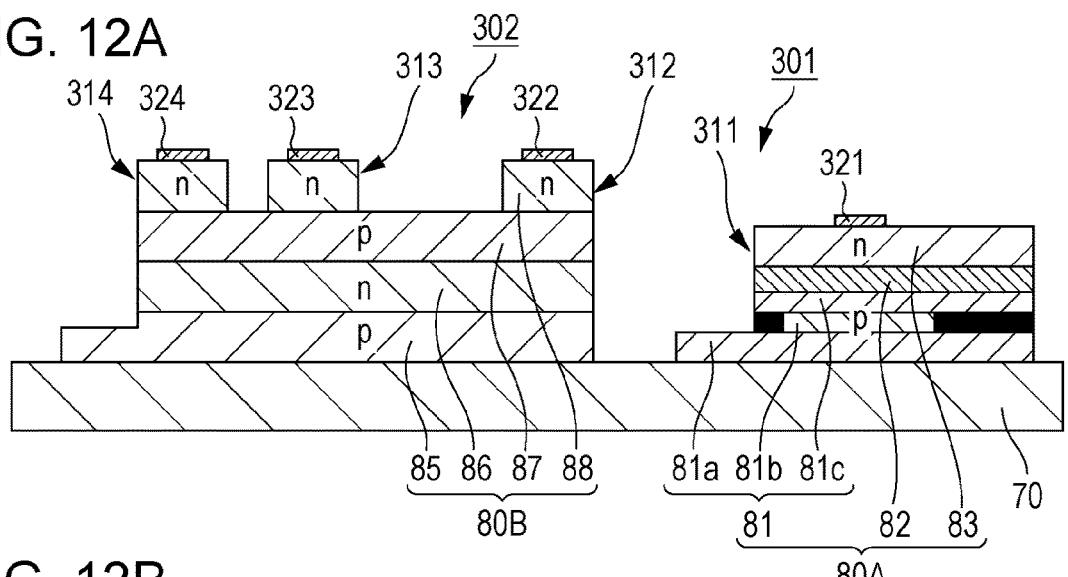
FIGS. 12A to 12C illustrate the method for manufacturing the light-emitting chip, specifically.
Figure 12B:
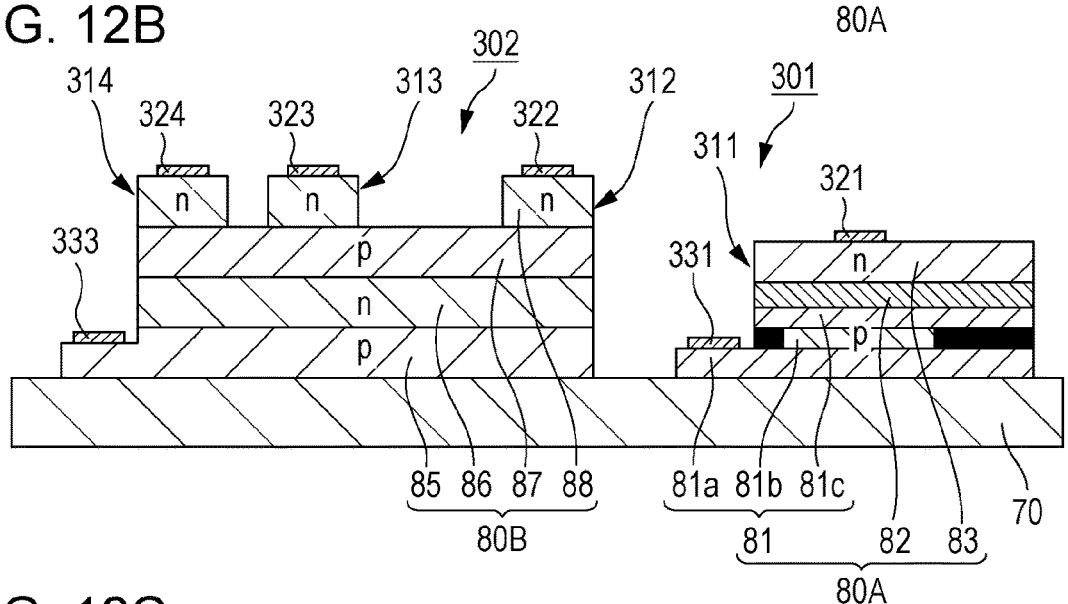
Figure 12C:
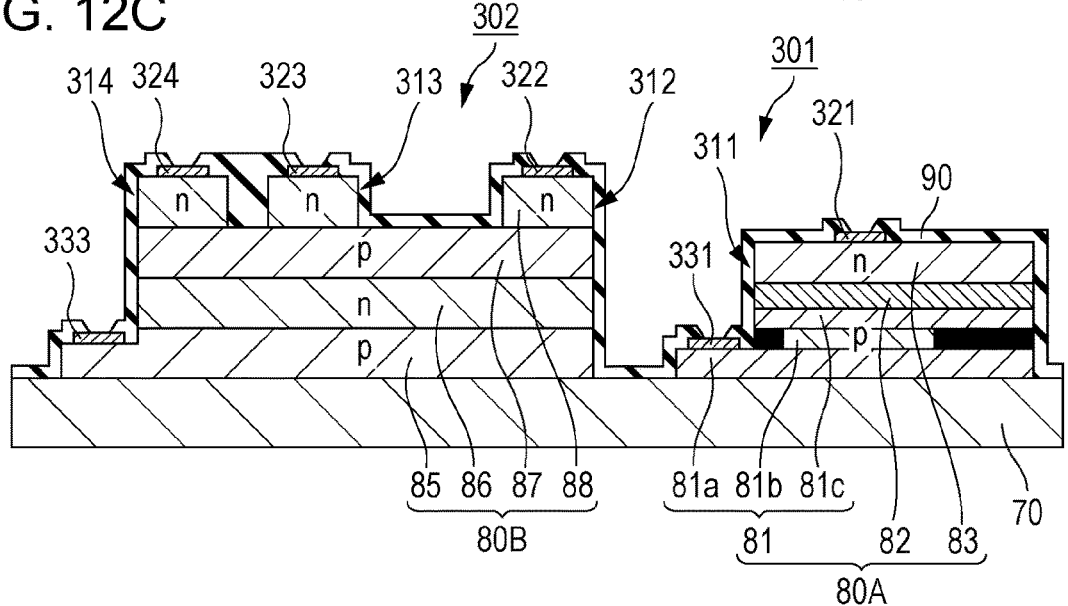
Figure 13A:
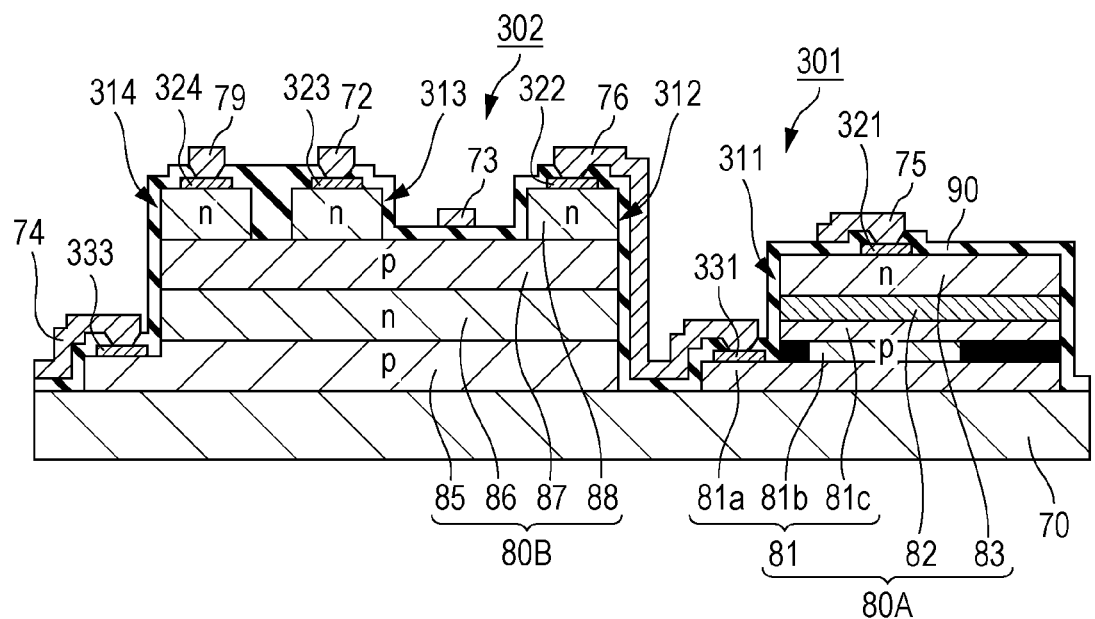
FIGS. 13A and 13B illustrate the method for manufacturing the light-emitting chip, specifically.
Figure 13B:
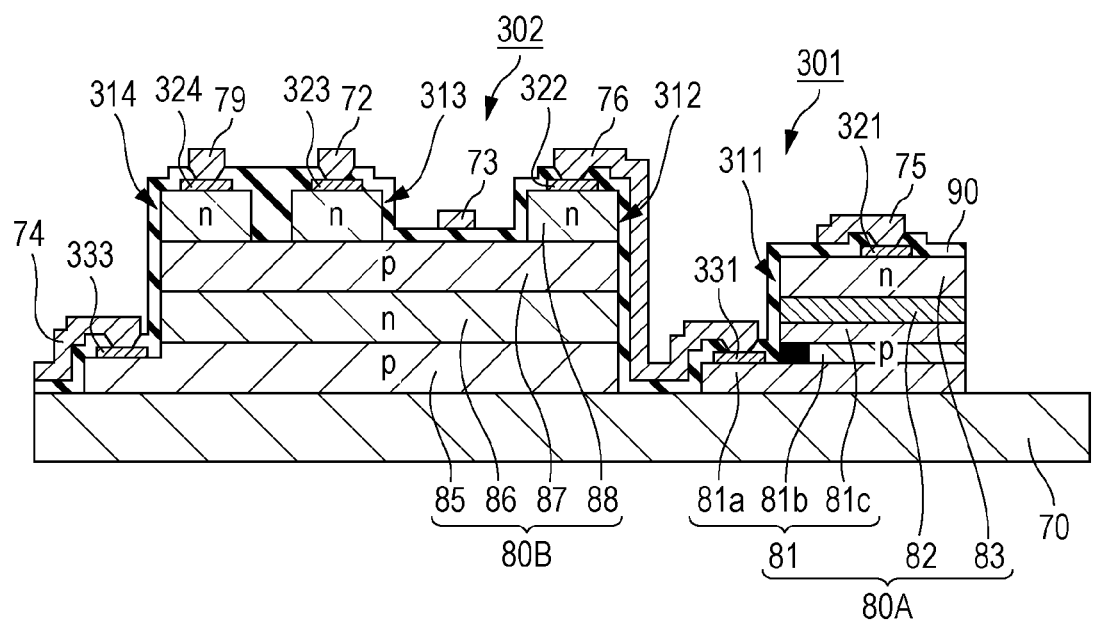

FIGS. 9A to 13B illustrate a method for manufacturing the light-emitting chip C. Specifically, FIG. 9A illustrates a first stacked semiconductor layer forming step, FIG. 9B illustrates a growth suppression layer forming step, and FIG. 9C illustrates a first stacked semiconductor layer etching step. FIG. 10A illustrates a second stacked semiconductor layer forming step, FIG. 10B illustrates a growth suppression layer etching step, and FIG. 10C illustrates a cathode electrode forming step. FIG. 11A illustrates a cathode region forming step, FIG. 11B illustrates a dividing etching step, and FIG. 11C illustrates a current constriction portion forming step. FIG. 12A illustrates an anode region forming etching step, FIG. 12B illustrates an anode electrode forming step, and FIG. 12C illustrates a protective layer forming step. FIG. 13A illustrates a wire forming step, and FIG. 13B illustrates an emission surface forming step.

The following description will be given with reference to a cross-sectional view of the islands 301 and 302 illustrated in FIG. 7. Although these cross-sectional views of the islands are taken along line VIB-VIB illustrated in FIG. 6A, but is viewed from the side (−x direction) opposite to the side illustrated in FIG. 6B. In addition, the conductivities (p and n) of impurities are illustrated.

Now, the steps will be sequentially described.

In the first stacked semiconductor layer forming step illustrated in FIG. 9A, on the insulating substrate 70, the p-anode (cladding) layer 81, the light-emitting layer 82, the n-cathode (cladding) layer 83 are epitaxially grown in this order to form the first stacked semiconductor layer 80A. The p-anode (cladding) layer 81, the light-emitting layer 82, the n-cathode (cladding) layer 83 constitute the light-emitting unit 102 including the laser diode LD. Note that in the drawings illustrating the manufacturing method, the p-anode (cladding) layer 81 and the n-cathode (cladding) layer 83 are respectively represented as "p" and "n".

In this case, the substrate 70 is formed of intrinsic (i-type) GaAs not doped with any impurities. Since no impurities are doped, the substrate 70 is an insulating substrate. Note that the intrinsic (i-type) GaAs not doped with any impurities may also be called semi-insulating. As illustrated in FIG. 7, different potentials are set as the potential of the p-anode (cladding) layer 81 in the first stacked semiconductor layer 80A constituting the laser diodes LD and the potential of the p-anode layer 85 in the second stacked semiconductor layer 80B constituting the setting thyristors S, the transfer thyristors T, and the like. Thus, these two potentials are not equal to each other via the substrate 70. Consequently, the substrate 70 does not have to be completely insulating and may be semi-insulating with high resistance. That is, the insulating substrate may be a semi-insulating substrate.

The substrate 70 may be a semiconductor substrate formed of InP, GaN, InAs, or other group III-V or group II-VI material, or a substrate formed of sapphire, Si, Ge, or the like as long as the above requirements are satisfied. When the material of the substrate 70 is changed, a material having a lattice constant that substantially matches that of the substrate (including a strain structure, a strain relaxation layer, and metamorphic growth) is used as a material monolithically stacked on the substrate. For example, InAs, InAsSb, GaInAsSb, or the like is used on an InAs substrate; InP, InGaAsP, or the like is used on an InP substrate; GaN, AlGaN, or InGaN is used on a GaN substrate or a sapphire substrate; and Si, SiGe, GaP, or the like is used on a Si substrate.

In this example, the current blocking portion β is formed by oxidizing a layer containing Al. The p-anode (cladding) layer 81 is constituted by the lower p-anode (cladding) layer 81a, the current constriction layer 81b, and the upper p-anode (cladding) layer 81c that are sequentially stacked.

The lower p-anode (cladding) layer 81a and the upper p-anode (cladding) layer 81c of the p-anode (cladding) layer 81 are formed of p-type $Al_{0.9}GaAs$ with an impurity concentration of $5\times10^{17}/cm^3$, for example. The Al composition ratio may be changed within a range of 0 to 1. Note that GaInP or the like may be alternatively used.

The current constriction layer 81b in this example is formed of AlAs or p-type AlGaAs with a high composition ratio of Al, for example. Any material may be used as long as Al is oxidized to be $Al_2O_3$ and consequently electrical resistance increases to constrict the current path.

The light-emitting layer 82 has a quantum well structure in which well layers and barrier layers are alternately stacked. The well layers are formed of GaAs, AlGaAs, InGaAS, GaAsP, AlGaInP, GaInAsP, or GaInP, for example. The barrier layers are formed of AlGaAs, GaAs, GaInP, or GaInAsP, for example. Note that the light-emitting layer 82 may have a quantum wire structure or a quantum dot structure.

The n-cathode (cladding) layer 83 is formed of n-type $Al_{0.9}GaAs$ with an impurity concentration of $5\times10^{17}/cm^3$, for example. The Al composition ratio may be changed within a range of 0 to 1. Note that GaInP or the like may be alternatively used.

These semiconductor layers are stacked using metal organic chemical vapor deposition (MOCVD) or molecular beam epitaxy (MBE), for example.

Figure 9B:
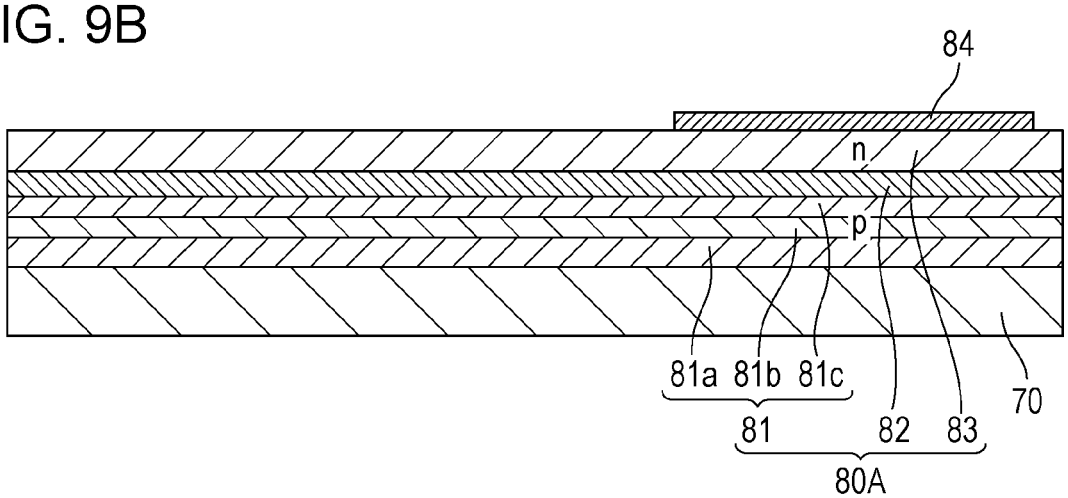

In the growth suppression layer forming step illustrated in FIG. 9B, a growth suppression layer 84 is formed in a region of the first stacked semiconductor layer 80A in which the island 301 is to be formed. The growth suppression layer 84 suppresses stacking of semiconductor layers in the second stacked semiconductor layer forming step illustrated in FIG. 10A described later. The growth suppression layer 84 may be formed of any of oxides and nitrides such as $SiO_2$, SiON, $TiO_2$, and $SiN_x$.

Note that the growth suppression layer 84 is formed as follows: a film of a material of the growth suppression layer 84 is formed on the entire top surface of the first stacked semiconductor layer 80A; a photoresist is formed in a region of the first stacked semiconductor layer 80A in which the island 301 is to be formed; and the film of a material of the growth suppression layer 84 is etched (etching method). Alternatively, the growth suppression layer 84 may be formed as follows: a film that is easily lifted off is formed on the top surface of the first stacked semiconductor layer 80A except in a region in which the island 301 is to be formed; a film of a material of the growth suppression layer 84 is deposited; and the film that is easily lifted off is removed to remove the film of a material of the growth suppression layer 84 on the film that is easily lifted off (lift-off method). Further alternatively, the growth suppression layer 84 may be formed as follows: a film of a material of the growth suppression layer 84 is formed by depositing on the first stacked semiconductor layer 80A through a metal mask having an opening corresponding to a region in which the island 301 is to be formed (metal mask method).

Figure 9C:
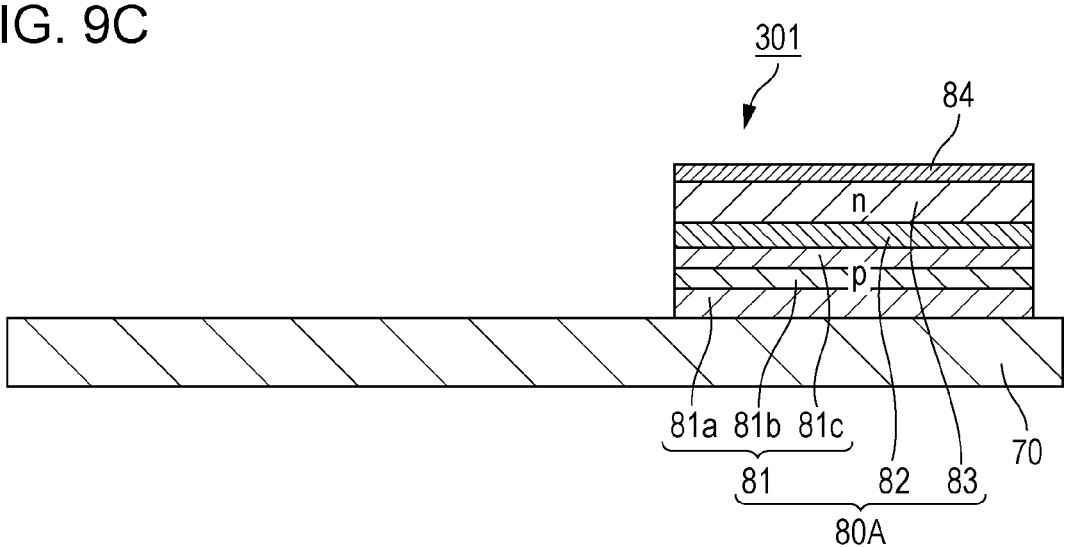

In the first stacked semiconductor layer etching step illustrated in FIG. 9C, the first stacked semiconductor layer 80A is etched by using the growth suppression layer 84 as a mask, and the surface of the substrate 70 is exposed. Note that etching may be performed by using the photoresist used for forming the growth suppression layer 84 as a mask.

This etching may be wet etching using, for example, a sulfuric-acid-based etching solution (sulfuric acid:hydrogen peroxide water:water=1:10:300 in weight ratio) or anisotropic dry etching (RIE) using, for example, boron chloride.

Figure 10A:
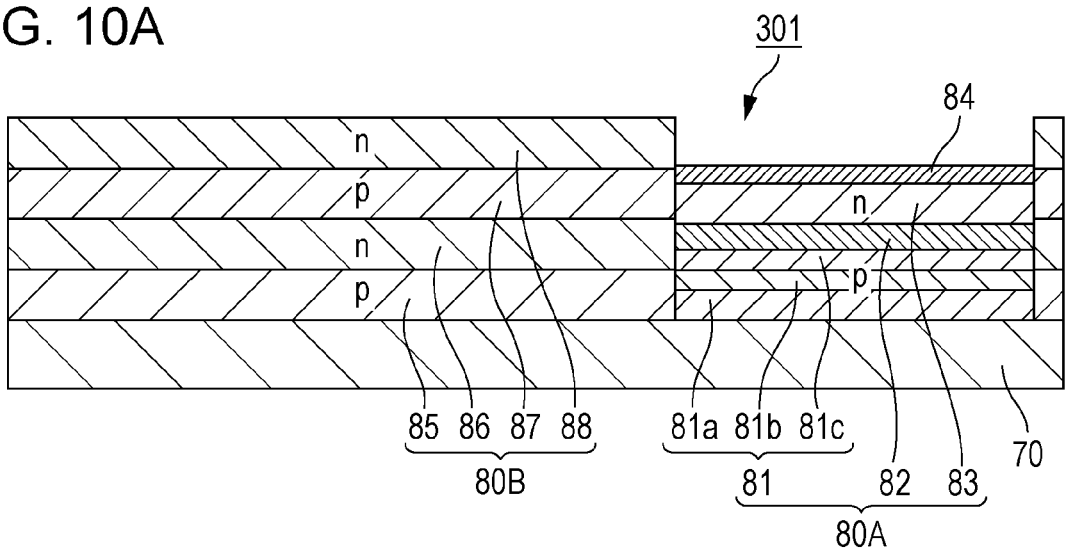
FIGS. 10A to 10C illustrate the method for manufacturing the light-emitting chip, specifically.

In the second stacked semiconductor layer forming step illustrated in FIG. 10A, on the substrate 70, the p-anode layer 85, the n-gate layer 86, the p-gate layer 87, and the n-cathode layer 88 are epitaxially grown in this order to form the second stacked semiconductor layer 80B. The p-anode layer 85, the n-gate layer 86, the p-gate layer 87, and the n-cathode layer 88 constitute the driving unit 101 including the setting thyristors S, the transfer thyristors T, the coupling diodes D, the start diode SD, and the like. At this time, the growth of the second stacked semiconductor layer 80B is suppressed on the first stacked semiconductor layer 80A on which the growth suppression layer 84 is formed.

The p-anode layer 85 is formed of p-type $Al_{0.9}GaAs$ with an impurity concentration of $1\times10^{18}/cm^3$, for example. The Al composition ratio may be changed within a range of 0 to 1. Note that GaInP or the like may be alternatively used.

The n-gate layer 86 is formed of n-type $Al_{0.9}GaAs$ with an impurity concentration of $1\times10^{17}/cm^3$, for example. The Al composition ratio may be changed within a range of 0 to 1. Note that GaInP or the like may be alternatively used.

The p-gate layer 87 is formed of p-type $Al_{0.9}GaAs$ with an impurity concentration of $1\times10^{17}/cm^3$, for example. The Al composition ratio may be changed within a range of 0 to 1. Note that GaInP or the like may be alternatively used.

The n-cathode layer 88 is formed of n-type $Al_{0.9}GaAs$ with an impurity concentration of $1\times10^{18}/cm^3$, for example.

The Al composition ratio may be changed within a range of 0 to 1. Note that GaInP or the like may be alternatively used.

These semiconductor layers are also stacked using metal organic chemical vapor deposition (MOCVD) or molecular beam epitaxy (MBE), for example.

Figure 10B:
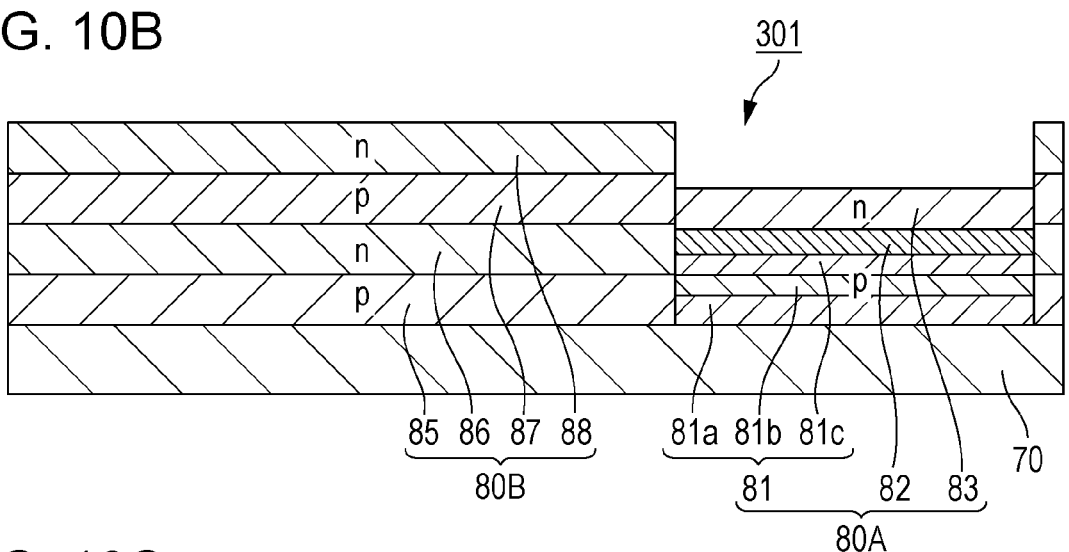

In the growth suppression layer etching step illustrated in FIG. 10B, the growth suppression layer 84 on the first stacked semiconductor layer 80A is removed.

This etching may be wet etching using, for example, a hydrogen fluoride-based etching solution if the growth suppression layer 84 is formed of an oxide such as $SiO_2$. Alternatively, anisotropic dry etching (RIE) may be performed.

Figure 10C:
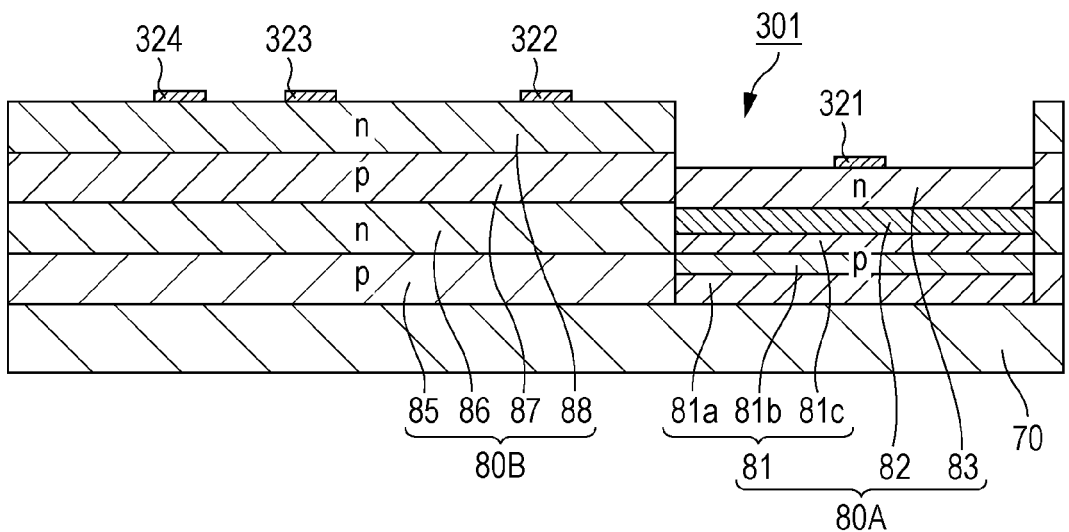

In the cathode electrode forming step illustrated in FIG. 10C, n-ohmic electrodes (e.g., the n-ohmic electrodes 321, 322, 323, and 324) are formed on the n-cathode (cladding) layer 83 and the n-cathode layer 88.

The n-ohmic electrodes are formed of Ge-containing Au (AuGe) that easily forms an ohmic contact with n-type GaAs-based semiconductor layers such as the n-cathode (cladding) layer 83 and the n-cathode layer 88, for example.

The n-ohmic electrodes are formed by a lift off method, for example.

In the cathode region forming step illustrated in FIG. 11A, the n-cathode layer 88 is etched in the second stacked semiconductor layer 80B. At this time, the n-cathode layer 88 is left unremoved in the regions 312, 313, and 314. Likewise, the n-cathode layer 88 is left unremoved in the region 315 of the start diode SD in the island 304. Thus, the n-cathode layer 88 is removed and the p-gate layer 87 is exposed in the portions serving as the islands 303, 305, and 306 (see FIG. 6A).

This etching is performed as in the first stacked semiconductor layer etching step in FIG. 9C.

In the dividing etching step illustrated in FIG. 11B, the first stacked semiconductor layer 80A and the second stacked semiconductor layer 80B are etched, and the islands (e.g., the islands 301, 302, and 303 in FIGS. 6A and 6B) are divided. This etching is performed as in the first stacked semiconductor layer etching step in FIG. 9C. The etching in the dividing etching step may be called mesa etching or post-etching.

In the current constriction portion forming step illustrated in FIG. 11C, the current constriction layer 81b that is exposed through the dividing etching step in the p-anode layer 81 of the first stacked semiconductor layer 80A is oxidized from the side surfaces, and thereby the current blocking portion β that blocks an electric current is formed. A portion that remains un-oxidized serves as the current passing portion α.

The current constriction layer 81b is oxidized by oxidizing Al in the current constriction layer 81b formed of AlAs, AlGaAs, or the like through steam oxidation at 300 to 400° C., for example. At this time, oxidation progresses from the exposed side faces, and consequently the current blocking portion β formed of $Al_2O_3$, which is an oxide of Al, is formed at the circumferential portion of the islands (e.g., the island 301) in which the laser diodes LD constituted by the first stacked semiconductor layer 80A are formed.

Note that the current blocking portion β may be formed by implanting a hydrogen ion ($H^+$) ($H^+$ ion implantation) to a semiconductor layer of GaAs, AlGaAs, or the like instead of using a semiconductor layer of AlAs or the like with a high Al composition ratio. That is, the p-anode (cladding) layer 81 that is not divided into the lower p-anode (cladding) layer 81a and the upper p-anode (cladding) layer 81c but is formed as a single layer may be formed without using the current constriction layer 81b, and H+ may be implanted to a portion that serves as the current blocking portion β, thereby forming the current blocking portion β having an inactivated impurity and a high electric resistance.

In the anode region forming etching step illustrated in FIG. 12A, the n-cathode (cladding) layer 83 and the light-emitting layer 82 in the island (the island 301) constituted by the first stacked semiconductor layer 80A are etched to expose the p-anode (cladding) layer 81. In addition, the p-gate layer 87 and the n-gate layer 86 in the island (the island 302) constituted by the second stacked semiconductor layer 80B are etched to expose the p-anode layer 85.

This etching is performed as in the first stacked semiconductor layer etching step in FIG. 9C.

In the anode electrode forming step illustrated in FIG. 12B, p-ohmic electrodes (e.g., the p-ohmic electrodes 331 and 333) are formed on the exposed surfaces of the p-anode (cladding) layer 81 and the p-anode layer 85. Note that the p-ohmic electrode 332 serving as the gate Gt (gate Gs) terminal in the island 302 in which the setting thyristor S1, the transfer thyristor T1, and the like are formed, the p-ohmic electrodes 334 and 335 in the island 303 in which the power supply line resistor Rg1 is formed, and the p-ohmic electrode 336 in the island 304 in which the start diode SD is formed, each illustrated in FIG. 6A, are concurrently formed. The same applies to the gate Gt (gate Gs) terminals of the other setting thyristors S and the other transfer thyristors T and the other power supply line resistors Rg. The p-ohmic electrodes 331 to 336 are formed on the exposed surface of the p-gate layer 87 in the first stacked semiconductor layer 80A.

The p-ohmic electrodes are formed of Zn-containing Au (AuZn) that easily forms an ohmic contact with p-type GaAs-based semiconductor layers such as the p-anode (cladding) layer 81, the p-anode layer 85, and the p-gate layer 86, for example.

The p-ohmic electrodes are formed by a lift off method, for example.

In the protective layer forming step illustrated in FIG. 12C, the protective layer 90 of an insulating material such as $SiO_2$, SiON, or SiN, for example, is formed to cover the surfaces of islands (e.g., the islands 301 and 302). The protective layer 90 transmits light emitted from the laser diode LD.

Subsequently, through-holes (openings) are formed in the protective layer 90 at portions above the n-ohmic electrodes (e.g., the n-ohmic electrodes 321, 322, 323, and 324) and the p-ohmic electrodes (e.g., the p-ohmic electrodes 331 and 333).

In the wire forming step illustrated in FIG. 13A, wires (e.g., the power supply lines 71 and 74, the first transfer signal line 72, the second transfer signal line 73, and the turn-on signal line 75) that connect the n-ohmic electrodes (e.g., the n-ohmic electrodes 321, 323, and 324) and the p-ohmic electrodes (e.g., the p-ohmic electrodes 331 and 332) to each other via the through-holes in the protective layer 90 are formed.

The wires are formed of Au, Al, or the like.

In the emission surface forming step illustrated in FIG. 13B, a side surface of the first stacked semiconductor layer 80A serving as a surface from which light from the laser diodes LD is emitted is exposed. In this example, the protective layer 90, the n-cathode (cladding) layer 83, the light-emitting layer 82, and the p-anode (cladding) layer 81 are etched such that the current blocking portion β of the current constriction layer 81b in the p-anode (cladding) layer 81 is removed.

This etching is performed as in the first stacked semiconductor layer etching step in FIG. 9C.

Note that the emission surface may be formed by cleaving. Alternatively, the emission surface may be formed between the anode electrode forming step in FIG. 12B and the protective layer forming step in FIG. 12C. In this case, the exposed side surface of the first stacked semiconductor layer 80A is covered by the protective layer 90.

The emission surface forming step is not necessarily performed if the current blocking portion β does not affect light emission.

As described above, in the light-emitting chip C according to the first exemplary embodiment, the light-emitting unit 102 including the laser diodes LD is constituted by the first stacked semiconductor layer 80A, and the driving unit 101 including the setting thyristors S, the transfer thyristors T, and the like is constituted by the second stacked semiconductor layer 80B. In addition, the laser diodes LD and the setting thyristors S are connected in series via the connection wire 76. In this way, the first stacked semiconductor layer 80A constituting the light-emitting unit 102 including the laser diodes LD and the second stacked semiconductor layer 80B constituting the driving unit 101 including the setting thyristors S, the transfer thyristors T, and the like are formed in accordance with desired characteristics. That is, in the first exemplary embodiment, the laser diodes LD perform light emission while the transfer thyristors T and the setting thyristors S perform transfer, and thereby light emission and transfer are separated from each other. The setting thyristors S and the transfer thyristors T need not emit light. Thus, light emission characteristics, for example, are successfully improved by configuring the laser diodes LD to have the quantum well structure, and driving characteristics or the like of the setting thyristors S and the transfer thyristors T are also successfully improved. That is, the laser diodes LD of the light-emitting unit 102 and the transfer thyristors T and the setting thyristors S of the driving unit 101 are separately (independently) settable. This may achieve a higher driving speed, a higher output power of light, a higher efficiency, a lower power consumption, a lower cost and the like.

Since the light emission characteristics of the laser diodes LD and the driving characteristics of the setting thyristors S, the transfer thyristors T, and the like used for driving are independently set, the laser diodes LD are considered to be formed on the setting thyristors S with a tunnel junction interposed therebetween. The tunnel junction is used because the setting thyristors S and the laser diodes LD will be reverse-biased, in which a current does not flow easily, if the laser diodes LD are stacked directly on the setting thyristors S. If the laser diodes LD are stacked on the setting thyristors S with the tunnel junction layer interposed therebetween, a current flows easily therebetween because the tunnel junction has characteristics of allowing a current to flow even in a reverse-biased state.

However, a semiconductor layer constituting the tunnel junction has a higher impurity concentration than the other semiconductor layers. The semiconductor layer constituting the tunnel junction has, for example, an impurity concentration of greater than or equal to $10^{19}/cm^3$, which is higher than the impurity concentrations of the other semiconductor layers that are in a range of $10^{17}$ to $10^{18}/cm^3$. In particular, an impurity, such as Si, used for a semiconductor layer of GaAs or the like is a different material from the semiconductor serving as a base, such as GaAs, and a lattice constant, a bond strength, and the number of valence electrons also differ. Thus, when Si is mixed in the semiconductor layer of GaAs or the like, crystal defects are unlikely to occur. In particular, the higher the impurity concentration, the higher the likelihood of crystal defects.

In order to increase the impurity concentration, growth conditions (e.g., the growth temperature, the deposition speed, and the ratio of an impurity material in a raw material used for deposition) are changed, and the growth conditions deviate from the growth conditions of the semiconductor layer of GaAs or the like. This also increases the likelihood of crystal defects.

Thus, crystal defects that have occurred in the semiconductor layer constituting the tunnel junction propagate in a semiconductor layer formed on the semiconductor layer constituting the tunnel junction. That is, if the laser diodes LD are formed on the semiconductor layer constituting the tunnel junction, crystal defects may propagate in the laser diodes LD, degrading the characteristics of the laser diodes LD. In particular, the light emission characteristics of the light-emitting elements such as the laser diodes LD are easily affected by the crystal defects contained in the semiconductor layer.

In the light-emitting chip C according to the first exemplary embodiment, as described above, after the first stacked semiconductor layer 80A constituting the light-emitting unit 102 including the laser diodes LD is formed, the first stacked semiconductor layer 80A is removed in the regions other than the light-emitting unit 102, and the second stacked semiconductor layer 80B constituting the driving unit 101 including the setting thyristors S, the transfer thyristors T, and the like is formed. Therefore, the tunnel junction is not used. In addition, even if the first stacked semiconductor layer 80A in a region other than the light-emitting unit 102 is removed and the second stacked semiconductor layer 80B is formed on the exposed surface of the substrate 70, the likelihood of crystal defects is less likely to increase in the second stacked semiconductor layer 80B than in a case where the second stacked semiconductor layer 80B is formed on the semiconductor layer constituting the tunnel junction. Thus, degradation of characteristics of the driving unit 101 including the setting thyristors S, the transfer thyristors T, and the like, constituted by the second stacked semiconductor layer 80B, is suppressed.

The light-emitting chips C according to the first exemplary embodiment are of self-scanning type that sequentially turn on the laser diodes LD by using the transfer thyristors T and the setting thyristors S. As a result, the number of terminals provided in the light-emitting chips C is reduced, and the light-emitting chips C and the light-emitting device 65 become more compact.

Note that in the first stacked semiconductor layer forming step illustrated in FIG. 9A, the p-anode (cladding) layer 81, the light-emitting layer 82, and the n-cathode (cladding) layer 83 are stacked in this order in the first stacked semiconductor layer 80A. Alternatively, in the first stacked semiconductor layer 80A, the n-cathode (cladding) layer 83, the light-emitting layer 82, and the p-anode (cladding) layer 81 may be stacked in this order.

Likewise, in the second stacked semiconductor layer forming step illustrated in FIG. 10A, the p-anode layer 85, the n-gate layer 86, the p-gate layer 87, and the n-cathode layer 88 are staked in this order in the second stacked semiconductor layer 80B. Alternatively, in the second stacked semiconductor layer 80B, the n-cathode layer 88, the p-gate layer 87, the n-gate layer 86, and the p-anode layer 85 may be stacked in this order.

In these cases, the connection relationship is changed so as to set the same circuit configuration (see FIG. 5).

Modification of Method for Manufacturing Light-Emitting Chip C

A modification of the method for manufacturing the light-emitting chip C according to the first exemplary embodiment will be described next. In this modification, the first stacked semiconductor layer 80A and the second stacked semiconductor layer 80B are formed in the reverse order.

Figure 14A:
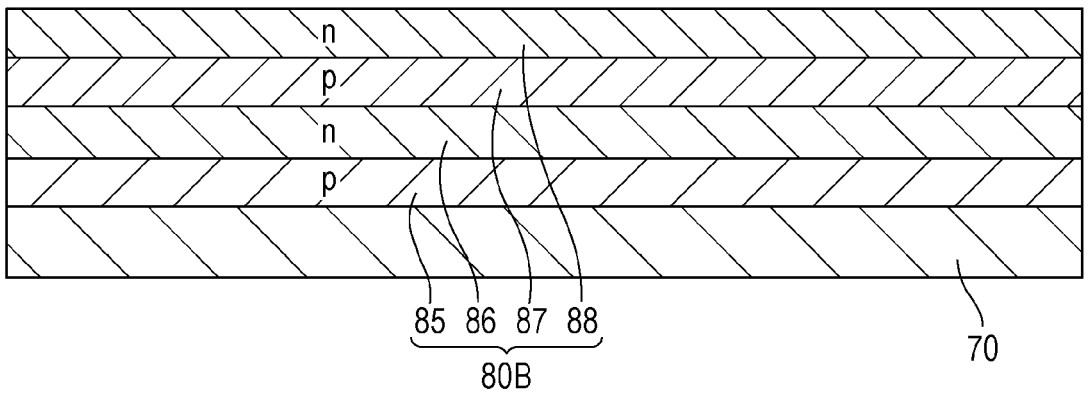
FIGS. 14A to 14C illustrate a modification of the method for manufacturing the light-emitting chip, specifically.
Figure 14B:
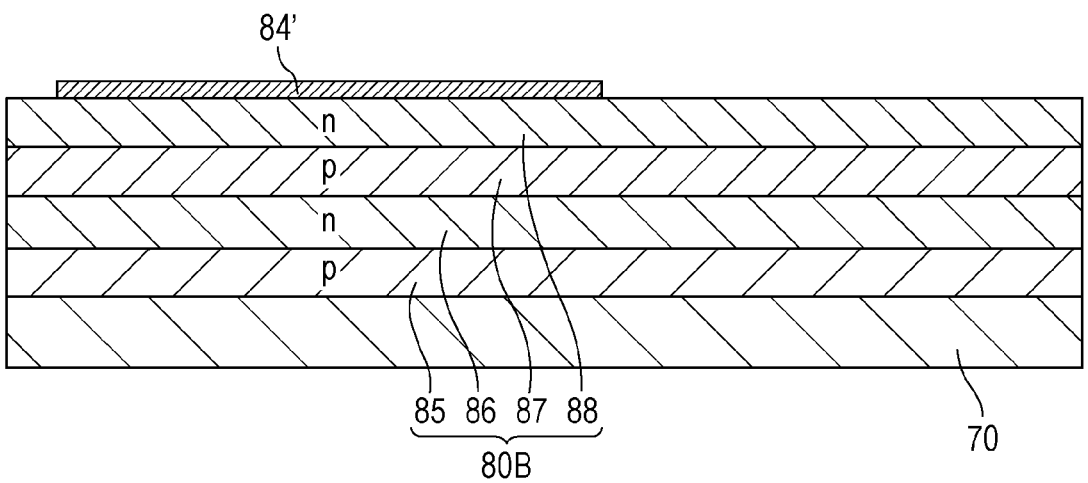
Figure 14C:
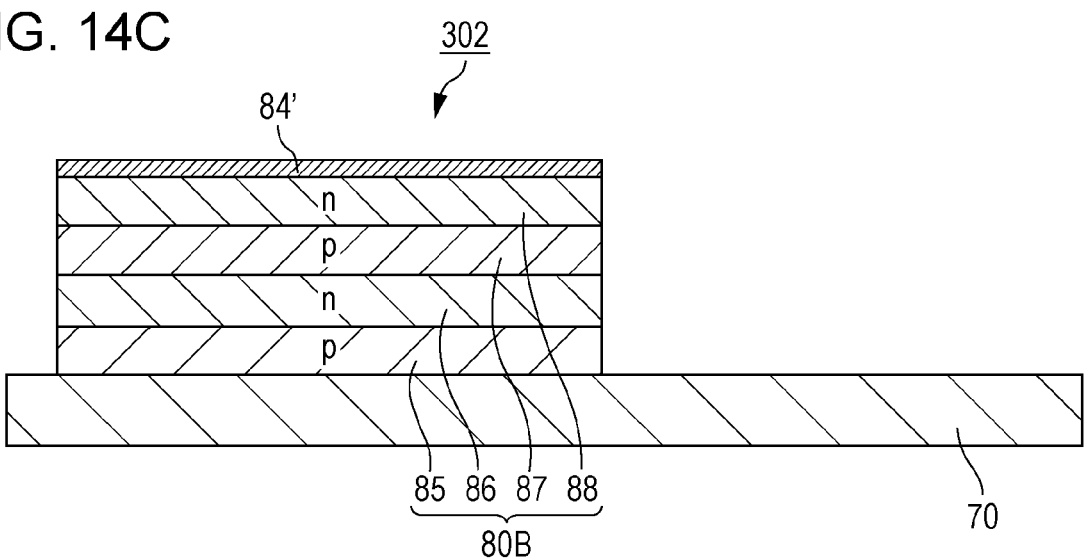
Figure 15A:
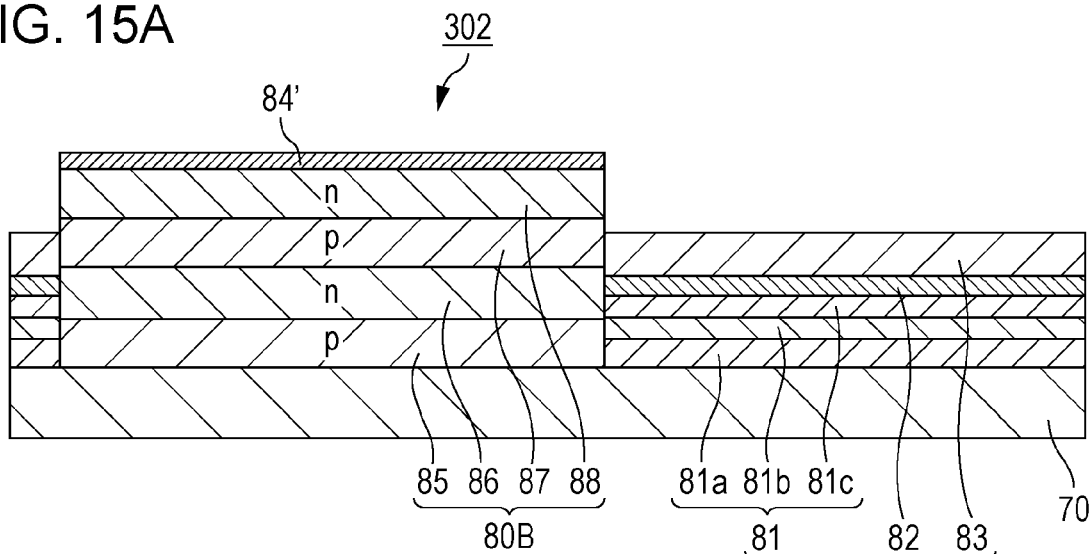
FIGS. 15A to 15C illustrate the modification of the method for manufacturing the light-emitting chip, specifically.
Figure 15B:
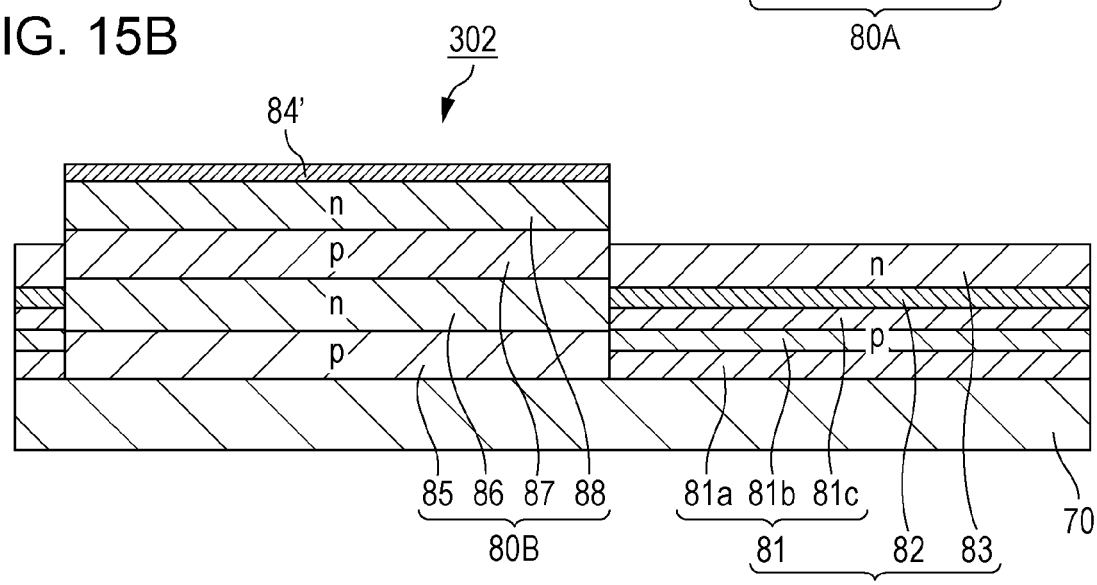
Figure 15C:
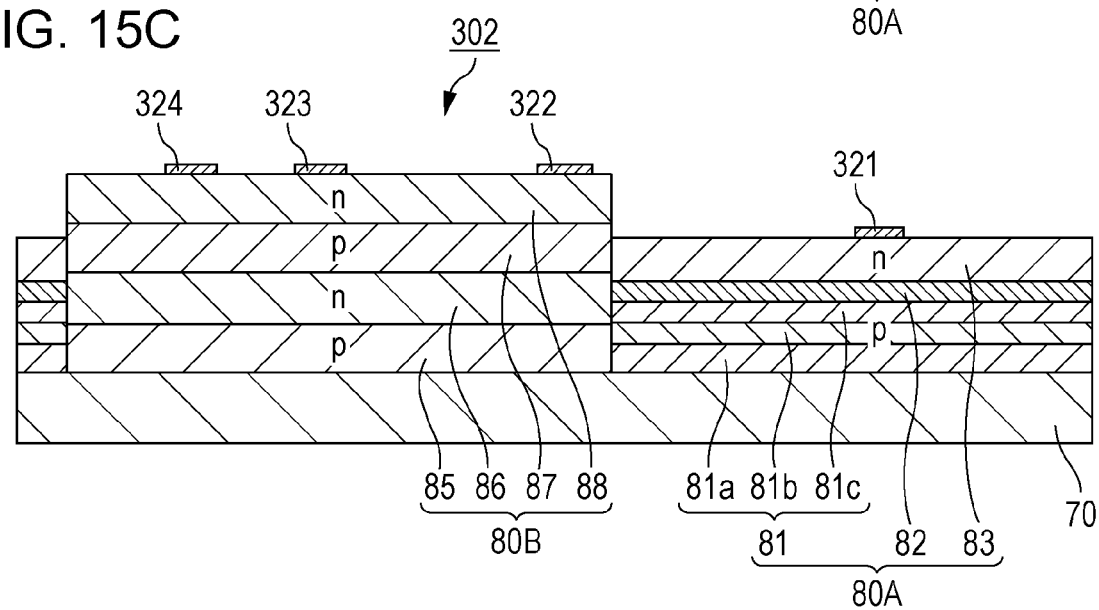
Figure 16:
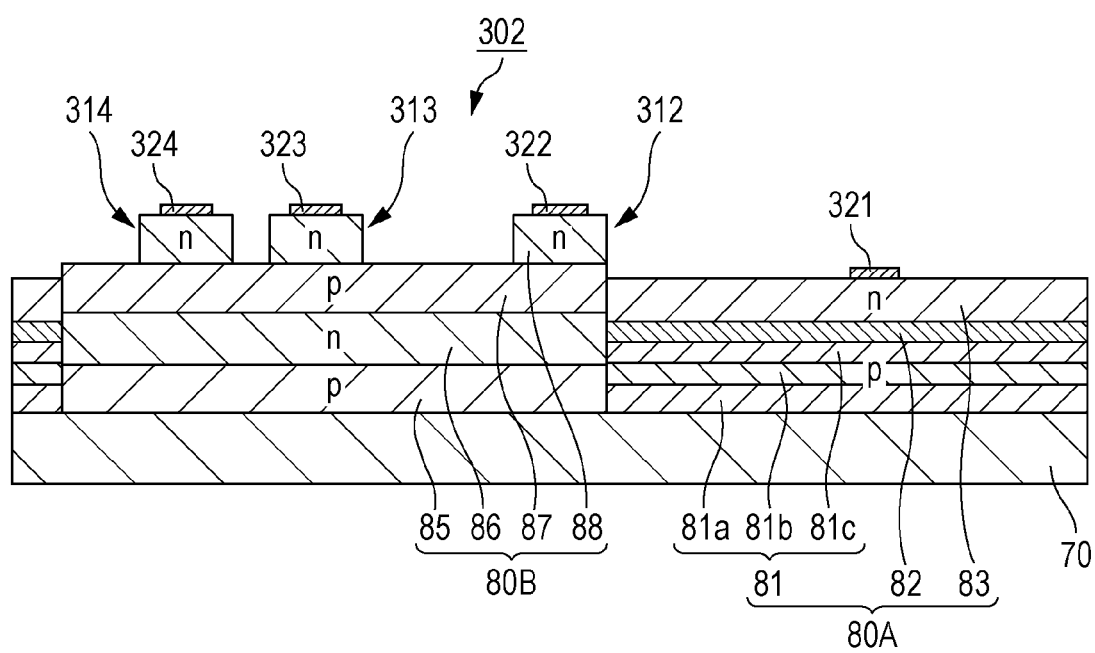
FIG. 16 illustrates the modification of the method for manufacturing the light-emitting chip, specifically.

FIGS. 14A to 16 illustrate the modification of the method for manufacturing the light-emitting chip C. FIG. 14A illustrates a second stacked semiconductor layer forming step, FIG. 14B illustrates a growth suppression layer forming step, and FIG. 14C illustrates a second stacked semiconductor layer etching step. FIG. 15A illustrates a first stacked semiconductor layer forming step, FIG. 15B illustrates a growth suppression layer etching step, and FIG. 15C illustrates a cathode electrode forming step. FIG. 16 illustrates a cathode region forming step. The subsequent steps are the same as those in FIG. 11B and thereafter, and a description thereof is omitted.

The description will be given again by referring to the cross-sectional view of the islands 301 and 302 illustrated in FIG. 7. Although the cross-sectional view of the islands is taken along line VIB-VIB illustrated in FIG. 6A, but is viewed from the side (−x direction) opposite to the side illustrated in FIG. 6B. In addition, the conductivities (p and n) of impurities are illustrated.

Now, the steps will be sequentially described.

In the second stacked semiconductor layer forming step illustrated in FIG. 14A, on the insulating substrate 70, the p-anode layer 85, the n-gate layer 86, the p-gate layer 87, and the n-cathode layer 88 are epitaxially grown in this order to form the second stacked semiconductor layer 80B. The p-anode layer 85, the n-gate layer 86, the p-gate layer 87, and the n-cathode layer 88 constitute the driving unit 101 including the setting thyristors S, the transfer thyristors T, the coupling diodes D, the start diode SD, and the like. A detailed description is omitted because details are substantially the same as those described for the method for manufacturing the light-emitting chip C with reference to FIG. 10A.

In the growth suppression layer forming step illustrated in FIG. 14B, a growth suppression layer 84' is formed on a region of the second stacked semiconductor layer 80B in which the island 302 is to be formed. The growth suppression layer 84' suppresses stacking of semiconductor layers in the first stacked semiconductor layer forming step illustrated in FIG. 15A described later. A detailed description is omitted because details are substantially the same as those described for the method for manufacturing the light-emitting chip C with reference to FIG. 9B.

In the second stacked semiconductor layer etching step illustrated in FIG. 14C, the second stacked semiconductor layer 80B is etched by using the growth suppression layer 84' as a mask, and the surface of the substrate 70 is exposed. Note that etching may be performed by using the photoresist used for forming the growth suppression layer 84' as a mask. A detailed description is omitted because details are substantially the same as those described for the method for manufacturing the light-emitting chip C with reference to FIG. 9C.

In the first stacked semiconductor layer forming step illustrated in FIG. 15A, the p-anode (cladding) layer 81, the light-emitting layer 82, the n-cathode (cladding) layer 83 are epitaxially grown in this order to form the first stacked semiconductor layer 80A. The p-anode (cladding) layer 81, the light-emitting layer 82, the n-cathode (cladding) layer 83 constitute the light-emitting unit 102 including the laser diodes LD. At this time, the growth of the first stacked semiconductor layer 80A is suppressed on the second stacked semiconductor layer 80B on which the growth suppression layer 84' is formed. A detailed description is omitted because details are substantially the same as those described for the method for manufacturing the light-emitting chip C with reference to FIG. 9A.

In the growth suppression layer etching step illustrated in FIG. 15B, the growth suppression layer 84' on the second stacked semiconductor layer 80B is removed. A detailed description is omitted because details are substantially the same as those described for the method for manufacturing the light-emitting chip C with reference to FIG. 10B.

In the cathode electrode forming step illustrated in FIG. 15C, n-ohmic electrodes (e.g., the n-ohmic electrodes 321, 322, 323, and 324) are formed on the n-cathode (cladding) layer 83 and the n-cathode layer 88. A detailed description is omitted because details are substantially the same as those described for the method for manufacturing the light-emitting chip C with reference to FIG. 10C.

In the cathode region forming step illustrated in FIG. 16, the n-cathode layer 88 is etched in the second stacked semiconductor layer 80B. A detailed description is omitted because details are substantially the same as those described for the method for manufacturing the light-emitting chip C with reference to FIG. 11A.

The subsequent steps are the same as those of the method for manufacturing the light-emitting chip C in FIG. 11B and thereafter, and a description thereof is omitted.

The light-emitting chip C according to the first exemplary embodiment is manufactured also by the modification of the method for manufacturing the light-emitting chip C in which the second stacked semiconductor layer 80B is formed on the substrate 70 first and the first stacked semiconductor layer 80A is formed next. However, when the second stacked semiconductor layer 80B is etched to expose the surface of the substrate 70, the surface of the substrate 70 may possibly become rough. If the first stacked semiconductor layer 80A constituting the laser diode LD is formed on the rough surface of the substrate 70, crystal defects may possibly occur in the first stacked semiconductor layer 80A. The occurrence of crystal detects in the first stacked semiconductor layer 80A damages the characteristics of the laser diode LD. Note that thyristors (the setting thyristors S and the transfer thyristors T) are only required to turn on and supply a current to the laser diodes LD. That is, the thyristors (the setting thyristors S and the transfer thyristors T) are unlikely to be affected by the crystal defects. Thus, it is desirable to adopt the method for manufacturing the light-emitting chip C in which the first stacked semiconductor layer 80A is formed first and the second stacked semiconductor layer 80B is formed next.

The following describes a modification of the light-emitting chip C according to the first exemplary embodiment. The following modification will be described by referring to the island 301 in which the laser diode LD1 is disposed and the island 302 in which the setting thyristor S1, the transfer thyristor T1, and the like are disposed in the light-emitting chip C.

Figure 17:
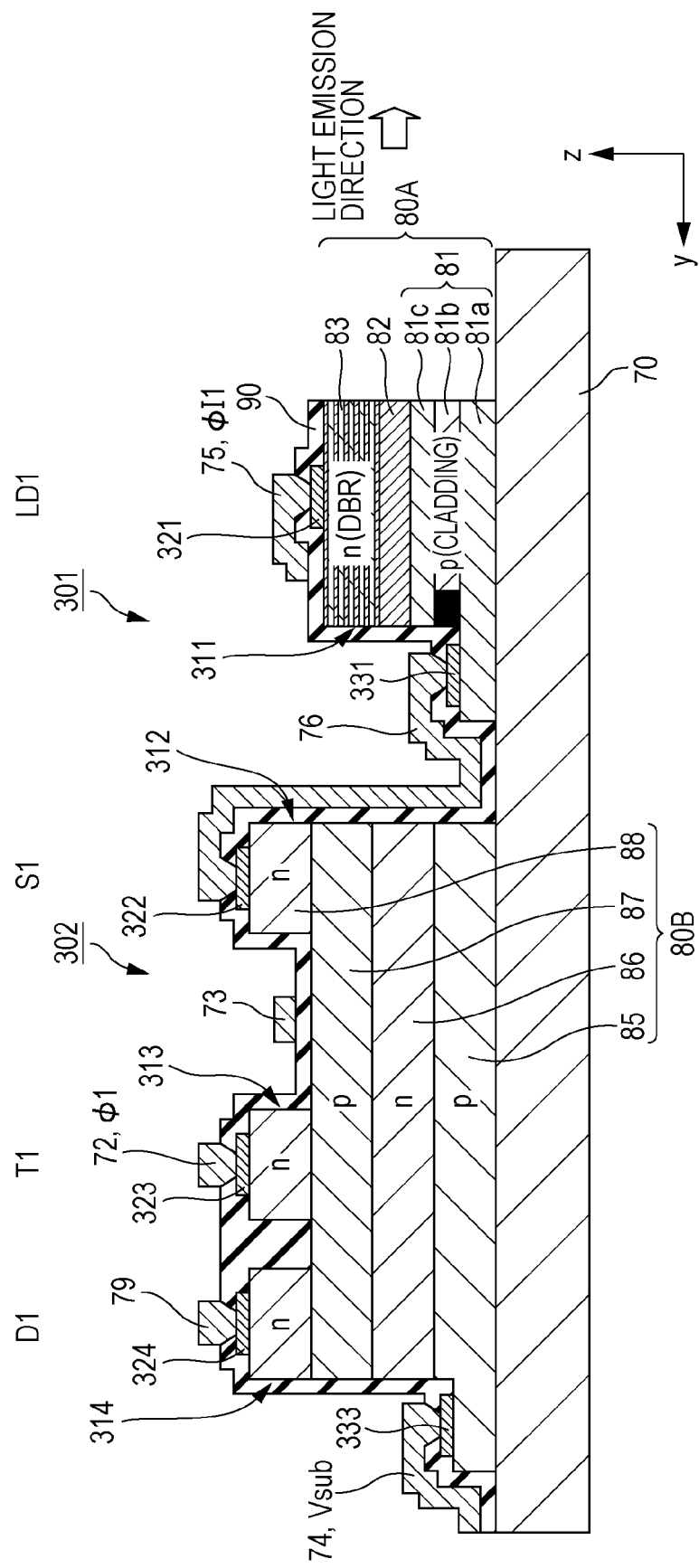
FIG. 17 is an enlarged cross-sectional view of the island in which the laser diode is disposed and the island in which the setting thyristor, the transfer thyristor, and the like are disposed for illustrating a first modification of the light-emitting chip according to the first exemplary embodiment.

First Modification of Light-Emitting Chip C
According to First Exemplary Embodiment FIG. 17 is an enlarged cross-sectional view of the island 301 and the island 302 for illustrating a first modification of the light-emitting chip C according to the first exemplary embodiment. The laser diode LD1 is disposed in the island 301, and the setting thyristor S1, the transfer thyristor T1, and the like are disposed in the island 302.

In the first modification, the n-cathode (cladding) layer 83 is changed to a distributed Bragg reflector layer (hereinafter, referred to as a DBR layer). Note that the n-cathode (cladding) layer 83 is referred to as the n-cathode (DBR) layer 83 and is represented as "n (DBR)" in FIG. 17. The DBR layer is constituted by stacking plural semiconductor layers with varying refractive index. The DBR is configured to reflect light from the laser diode LD. The rest of the configuration is substantially the same as that of the light-emitting chip C according to the first exemplary embodiment.

The DBR layer is constituted by a combination of low refractive index layers with a high Al composition ratio of, for example, $Al_{0.9}Ga_{0.1}As$ and high refractive index layers with a low Al composition ratio of, for example, $Al_{0.2}Ga_{0.8}As$. Thicknesses (optical path length) of the low refractive index layers and the high refractive index layers are set to 0.25 (¼) of the center wavelength, for example. Note that the Al composition ratios of the low refractive index layers and the high refractive index layers may be changed within a range of 0 to 1.

Thus, in the first modification of the light-emitting chip C, the light-emitting chip C is manufactured by changing the n-cathode (cladding) layer 83 to the DBR layer in the method for manufacturing the light-emitting chip C according to the first exemplary embodiment illustrated in FIGS. 9A to 13B or the modification of the method for manufacturing the light-emitting chip C according to the first exemplary embodiment illustrated in FIGS. 14A to 16.

Second Exemplary Embodiment

In a second exemplary embodiment, the light-emitting chip C includes a voltage reduction layer (a voltage reduction layer 89 illustrated in FIG. 18) in the setting thyristor S and the transfer thyristor T. The rest of the configuration is substantially the same as that in the first exemplary embodiment. Thus, a description of substantially the same part is omitted, and different part will be described.

Figure 18:
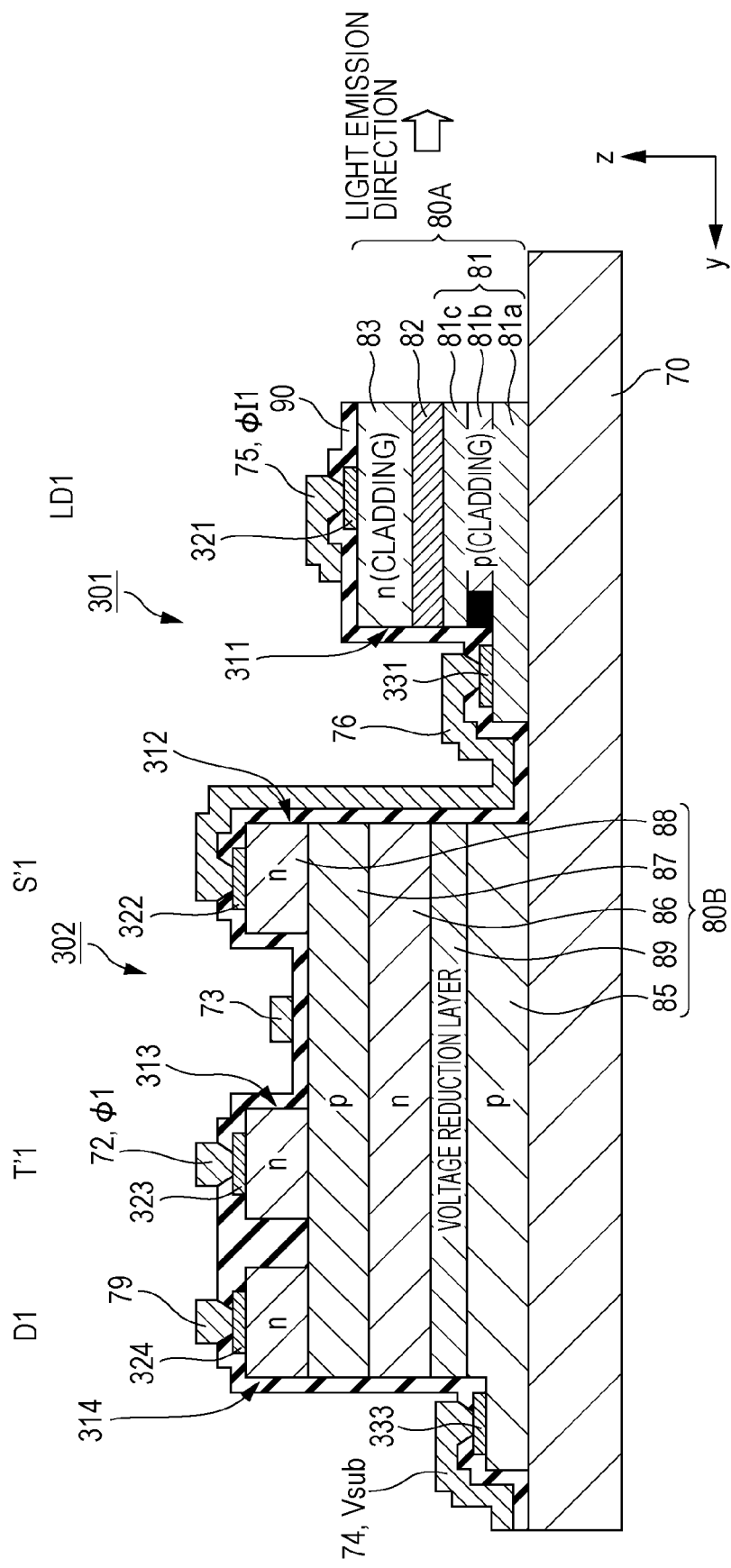
FIG. 18 is an enlarged cross-sectional view of an island in which a laser diode is disposed and an island in which a setting thyristor, a transfer thyristor, and the like are disposed in a light-emitting chip according to a second exemplary embodiment.

FIG. 18 is an enlarged cross-sectional view of the island 301 and the island 302 in the light-emitting chip C according to the second exemplary embodiment. The laser diode LD1 is disposed in the island 301, and a setting thyristor S'1, a transfer thyristor T'1, and the like are disposed in the island 302.

In the light-emitting chip C according to the second exemplary embodiment, the second stacked semiconductor layer 80B constituting the island 302 includes the voltage reduction layer 89 between the p-anode layer 85 and the n-gate layer 86 in the island 302 of the light-emitting chip C according to the first exemplary embodiment illustrated in FIG. 7. In addition, in the light-emitting chip C according to the first exemplary embodiment, the setting thyristor S is replaced with a setting thyristor S', and the transfer thyristor T is replaced with a transfer thyristor T'. The rest of the configuration is substantially the same as that in the first exemplary embodiment, and thus, a description thereof is omitted.

The voltage reduction layer 89 reduces a voltage applied to the setting thyristor S and the transfer thyristor T.

The voltage reduction layer 89 may be part of the p-anode layer 85, that is, may be a p-type layer with an impurity concentration similar to that of the p-anode layer 85. Alternatively, the voltage reduction layer 89 may be part of the n-gate layer 86, that is, may be an n-type layer with an impurity concentration similar to that of the n-gate layer 86. In addition, the voltage reduction layer 89 may be an i-type layer.

A function of the voltage reduction layer 89 in the setting thyristor S and the transfer thyristor T will be described by referring to the setting thyristor S' in the light-emitting chip C according to the second exemplary embodiment and the setting thyristor S in the light-emitting chip C according to the first exemplary embodiment.

Figure 19A:
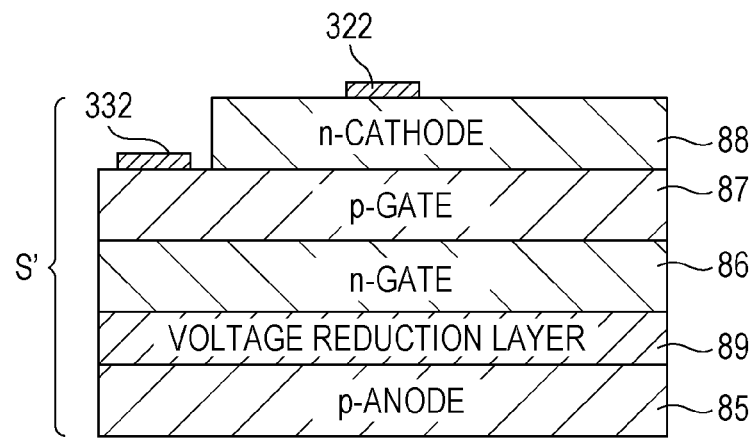
FIGS. 19A to 19C illustrate structures and characteristics of setting thyristors, specifically.
Figure 19B:
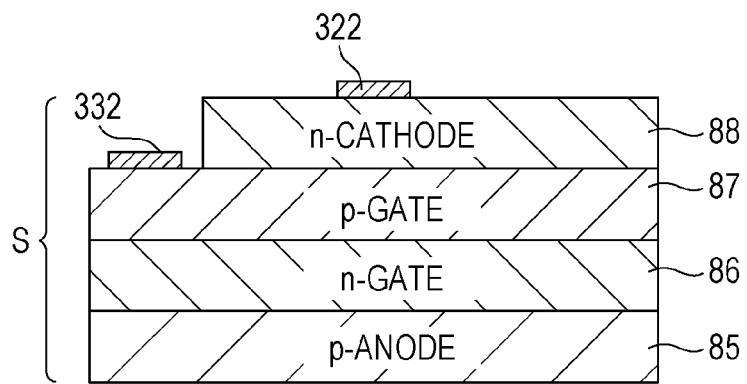
Figure 19C:
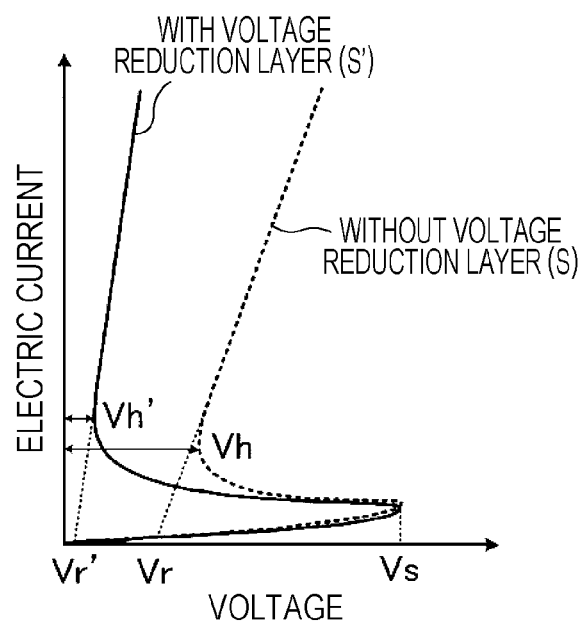

FIGS. 19A to 19C illustrate structures and characteristics of the setting thyristors S and S'. Specifically, FIG. 19A is a cross-sectional view of the setting thyristor S' including the voltage reduction layer 89, FIG. 19B is a cross-sectional view of the setting thyristor S not including the voltage reduction layer 89, and FIG. 19C illustrates characteristics of the setting thyristors S and S'. In this example, the p-ohmic electrode 332 disposed on the p-gate layer 87 and serving as the gate Gs of the setting thyristors S and S' is illustrated (see FIG. 6A). Note that the substrate 70 is omitted from the illustration.

The setting thyristor S' illustrated in FIG. 19A includes the voltage reduction layer 89 between the p-anode layer 85 and the n-gate layer 86. Note that the voltage reduction layer 89 serves as part of the p-anode layer 85 if the voltage reduction layer 89 is a p-type layer with an impurity concentration that is substantially the same as that of the p-anode layer 85, or serves as part of the n-gate layer 86 if the voltage reduction layer 89 is an n-type layer with an impurity concentration that is substantially the same as that of the n-gate layer 86. The voltage reduction layer 89 may be alternatively an i-type layer.

The setting thyristor S illustrated in FIG. 19B does not include the voltage reduction layer 89.

Rising voltages Vr and Vr'(see FIG. 19C) of the setting thyristors S and S' are determined by the smallest bandgap energy among bandgap energies of the semiconductor layers that constitute the setting thyristors S and S'. Note that the rising voltages Vr and Vr' of the setting thyristors S and S' are voltages obtained when a current flowing through the on-state setting thyristors S and S' is extrapolated to the voltage axis.

As illustrated in FIG. 19A, the setting thyristor S' includes the voltage reduction layer 89 having a smaller bandgap energy than any of the p-anode layer 85, the n-gate layer 86, the p-gate layer 87, and the n-cathode layer 88. Thus, the rising voltage Vr' of the setting thyristor S' is lower than the rising voltage Vr of the setting thyristor S not including the voltage reduction layer 89. In addition, as an example, the bandgap of the voltage reduction layer 89 is smaller than that of the light-emitting layer 82.

The setting thyristor S is not used as the light-emitting element, but functions as part of the driving unit 101 that drives laser diode LD. Thus, the bandgap is determined independently of the wavelength of light actually emitted by the light-emitting element. Accordingly, the rising voltage Vr is reduced to the rising voltage Vr' by providing the voltage reduction layer 89 having a bandgap smaller than the bandgap of the light-emitting layer 82.

This reduces the voltage applied to the setting thyristor S' and the laser diode LD connected in series in a state where the setting thyristor S' is in the on-state. The same applies to the transfer thyristor T', and the voltage applied to the transfer thyristor T' is reduced compared with the transfer thyristor T.

Figure 20:
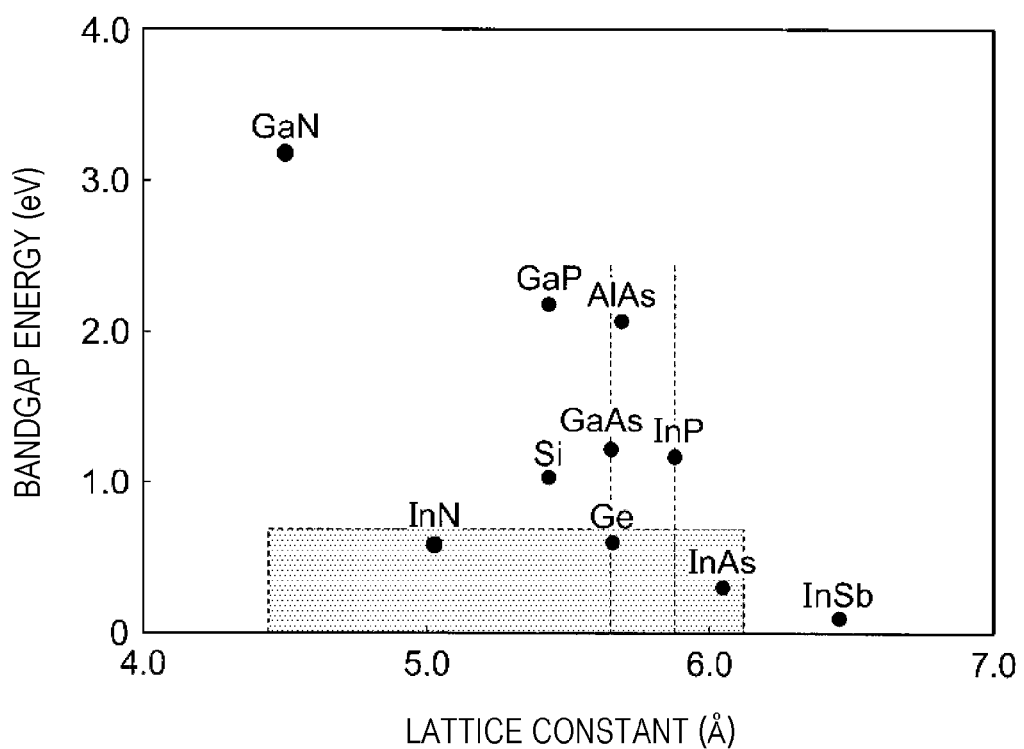
FIG. 20 illustrates bandgap energies of materials for forming semiconductor layers.

FIG. 20 illustrates bandgap energies of materials for forming semiconductor layers.

The lattice constant of GaAs is about 5.65 Å. The lattice constant of AlAs is about 5.66 Å. Thus, a material having a lattice constant close to this lattice constant is able to be epitaxially grown on the substrate 70 formed of GaAs. For example, Ge or AlGaAs, which is a compound of GaAs and AlAs, is able to be epitaxially grown on a GaAs substrate.

In addition, the lattice constant of InP is about 5.87 Å. A material having a lattice constant close to this lattice constant is able to be epitaxially grown on an InP substrate.

GaN has different lattice constants depending on the growth face. The lattice constant of the a-plane is 3.19 Å and the lattice constant of the c-plane is 5.17 Å. A material having a lattice constant close to one of these lattice constants is able to be epitaxially grown on a GaN substrate.

Materials having bandgap energies that reduce the rising voltage of the thyristor for GaAs, InP, and GaN are in a shaded range in FIG. 20. That is, when a material in the shaded range is used for a layer of the thyristor, the rising voltage Vr of the thyristor becomes equal to bandgap energy of the material in the shaded range.

For example, the bandgap energy of GaAs is about 1.43 eV. Thus, the rising voltage Vr of the thyristor is about 1.43 V without the voltage reduction layer 89. However, when a material in the shaded range is used for or included in a layer of the thyristor, the rising voltage Vr' of the thyristor is able to be set to be higher than 0 V and lower than 1.43 V (0 V<Vr'<1.43 V).

Consequently, power consumption is reduced when the setting thyristor S' and the transfer thyristor T' including the voltage reduction layer 89 are in the on-state.

The materials in the shaded range include Ge which has a bandgap energy of about 0.67 eV when the substrate 70 is formed of GaAs. Ge may contain Sn. In addition, the materials include InAs which has a bandgap energy of about 0.36 eV when the substrate 70 is formed of InP. In addition, materials having a smaller bandgap energy such as a compound of GaAs and InP, a compound of InN and InSb, and a compound of InN and InAs may be used when the substrate 70 is formed of GaAs or InP. In particular, a GaInNAs-based mixed compound is suitable. These may contain Al, Ga, As, P, Sb, and so forth. In addition, GaNP, GaNAs, or GaNSb may serve as the voltage reduction layer 89 when the substrate 70 is formed of GaN. In addition, (1) an InN layer or an InGaN layer obtained by metamorphic growth, for example; (2) quantum dots of InN, InGaN, InNAs, or InNSb; or (3) an InAsSb layer having a lattice constant equivalent to the doubled lattice constant of GaN (the a-plane), for example, may be used as the voltage reduction layer 89. These may contain Al, Ga, N, As, P, Sb, and so forth.

The description here has been given using the rising voltages Vr and Vr' of the setting thyristors S and S' as examples. The same applies to hold voltages Vh and Vh' that are the minimum voltages applied to maintain the thyristors in the on-state and to voltages applied to the on-state thyristors (see FIG. 19C).

On the other hand, a switching voltage Vs (see FIG. 19C) of a thyristor is determined by a depletion layer of a reverse-biased semiconductor layer. Thus, the influence of the voltage reduction layer 89 on the switching voltage Vs of the thyristor is small.

That is, the voltage reduction layer 89 maintains the switching voltage Vs of the thyristor and reduces the rising voltage Vr. Consequently, the voltage applied to the on-state thyristor is reduced, and power consumption is reduced. The switching voltage Vs of the thyristor is set to a given value by adjusting the materials, impurity concentrations, and the like of the p-anode layer 85, the n-gate layer 86, the p-gate layer 87, and the n-cathode layer 88. Note that the switching voltage Vs changes depending on the position at which the voltage reduction layer 89 is inserted.

Although FIGS. 18 to 19C illustrate an example in which a single voltage reduction layer 89 is provided, plural voltage reduction layers 89 may be provided. For example, the voltage reduction layer 89 may be disposed between the p-anode layer 85 and the n-gate layer 86 and between the p-gate layer 87 and the n-cathode layer 88. Alternatively, the voltage reduction layer 89 may be disposed in the n-gate layer 86 and in the p-gate layer 87. In addition, two or three layers may be selected from among the p-anode layer 85, the n-gate layer 86, the p-gate layer 87, and the n-cathode layer 88, and the voltage reduction layer 89 may be disposed in each of the two or three selected layers. The conductivity types of these voltage reduction layers 89 may be set to match the conductivity types of the anode layer, the cathode layer, and the gate layers where the respective voltage reduction layers 89 are disposed or may be i-type.

A material used for the voltage reduction layer 89 is more difficult to grow and has a lower quality than a material such as GaAs or InP. Thus, crystal defects are more likely to occur in the voltage reduction layer 89 and the crystal defects extend to a semiconductor layer of GaAs or the like that is grown on the voltage reduction layer 89.

As described above, light emission characteristics of light-emitting elements, such as the laser diodes LD, are easily affected by crystal defects contained in the semiconductor layer. On the other hand, thyristors (the setting thyristors S and the transfer thyristors T) are only required to turn on and supply a current to the laser diodes LD. That is, when the thyristors including the voltage reduction layer 89 are not used as the light-emitting layers but are used for reducing the voltage, the semiconductor layers (the n-gate layer 86, the p-gate layer 87, and the n-cathode layer 88 in the case of FIG. 7) that constitute the thyristors may contain crystal defects.

Note that the light-emitting chip C according to the second exemplary embodiment is manufactured by adding the voltage reduction layer 89 to the second stacked semiconductor layer 80B constituted by the p-anode layer 85, the n-gate layer 86, the p-gate layer 87, and the n-cathode layer 88 in the method for manufacturing the light-emitting chip C according to the first exemplary embodiment illustrated in FIGS. 9A to 13B or the modification of the method for manufacturing the light-emitting chip C according to the first exemplary embodiment illustrated in FIGS. 14A to 16.

In addition, as in the first modification of the light-emitting chip C according to the first exemplary embodiment, the n-cathode layer 83 may be changed to the DBR layer.

Third Exemplary Embodiment

In the light-emitting chip C according to the first and second exemplary embodiments, the light-emitting element is the laser diode LD. In the light-emitting chip C according to the third exemplary embodiment, the light-emitting element is a light-emitting diode LED.

The configuration other than the light-emitting diode LED in the light-emitting chip C is substantially the same as that in the first exemplary embodiment. Thus, the laser diodes LD (the laser diodes LD1 to LD128) are replaced with light-emitting diodes LED (light-emitting diodes LED1 to LED128). Consequently, a description of substantially the same part is omitted, and different part will be described.

Figure 21:
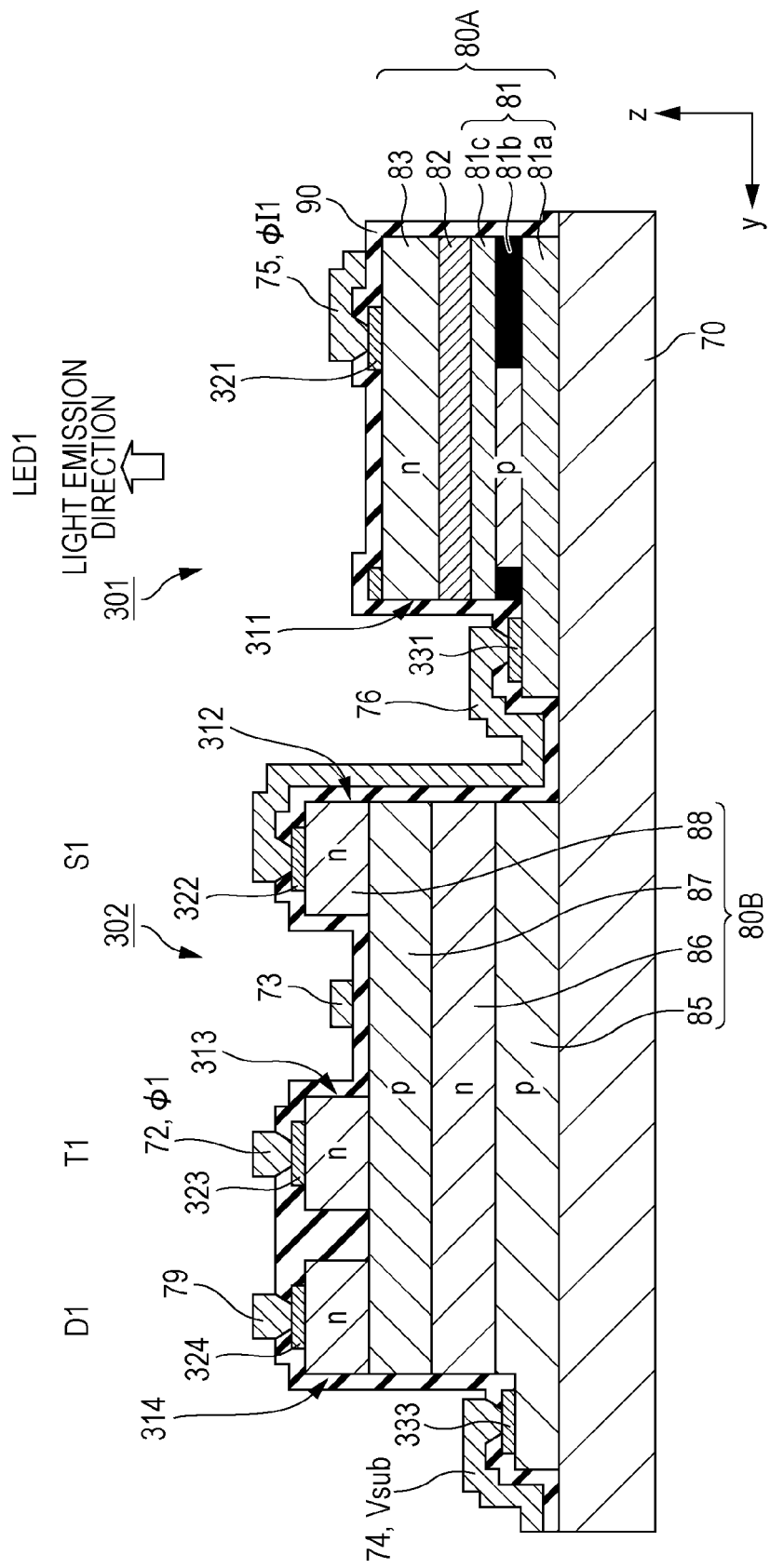
FIG. 21 is an enlarged cross-sectional view of an island in which a light-emitting diode is disposed and an island in which a setting thyristor, a transfer thyristor, and the like are disposed in a light-emitting chip according to a third exemplary embodiment.

FIG. 21 is an enlarged cross-sectional view of the island 301 and the island 302 in the light-emitting chip C according to the third exemplary embodiment. The light-emitting diode LED1 is disposed in the island 301, and the setting thyristor S1, the transfer thyristor T1, and the like are disposed in the island 302.

The light-emitting chip C according to the third exemplary embodiment includes the light-emitting unit 102 and the driving unit 101 on the insulating substrate 70. The light-emitting unit 102 includes the light-emitting diodes LED constituted by the first stacked semiconductor layer 80A, and the driving unit 101 includes the setting thyristors S, the transfer thyristors T, and the like constituted by the second stacked semiconductor layer 80B. The first stacked semiconductor layer 80A includes the p-anode layer 81, the light-emitting layer 82, and the n-cathode layer 83. The second stacked semiconductor layer 80B includes the p-anode layer 85, the n-gate layer 86, the p-gate layer 87, and the n-cathode layer 88.

In addition, the p-anode layer 81 is constituted by the lower p-anode layer 81*a*, the current constriction layer 81*b*, and the upper p-anode layer 81*c*.

The lower p-anode layer 81*a* and the upper p-anode layer 81*c* are formed of p-type $Al_{0.9}GaAs$ with an impurity concentration of $1 \times 10^{18}/cm^3$, for example. The Al composition ratio may be changed within a range of 0 to 1. Note that GaInP or the like may be alternatively used.

The n-cathode layer 83 is formed of p-type $Al_{0.9}GaAs$ with an impurity concentration of $1 \times 10^{18}/cm^3$, for example. The Al composition ratio may be changed within a range of 0 to 1. Note that GaInP or the like may be alternatively used.

The rest of the configuration is substantially the same as that in the first exemplary embodiment.

The light-emitting diode LED emits light in a direction perpendicular to the substrate 70 as indicated by the arrow. Thus, the n-ohmic electrode 321 has an opening in the central portion through which light from the light-emitting diode LED exits. Note that the position of the turn-on signal line 75 is changed in accordance with the change in the shape of the n-ohmic electrode 321. In this example, the turn-on signal line 75 is shifted in the −y direction in FIGS. 6A and 6B.

The n-cathode layer 83 may include the current constriction layer. In addition, as described in the second exemplary embodiment, the setting thyristor S and the transfer thyristor T may include the voltage reduction layer 89.

Modifications of the light-emitting chip C according to the third exemplary embodiment will be described next.

Figure 22:
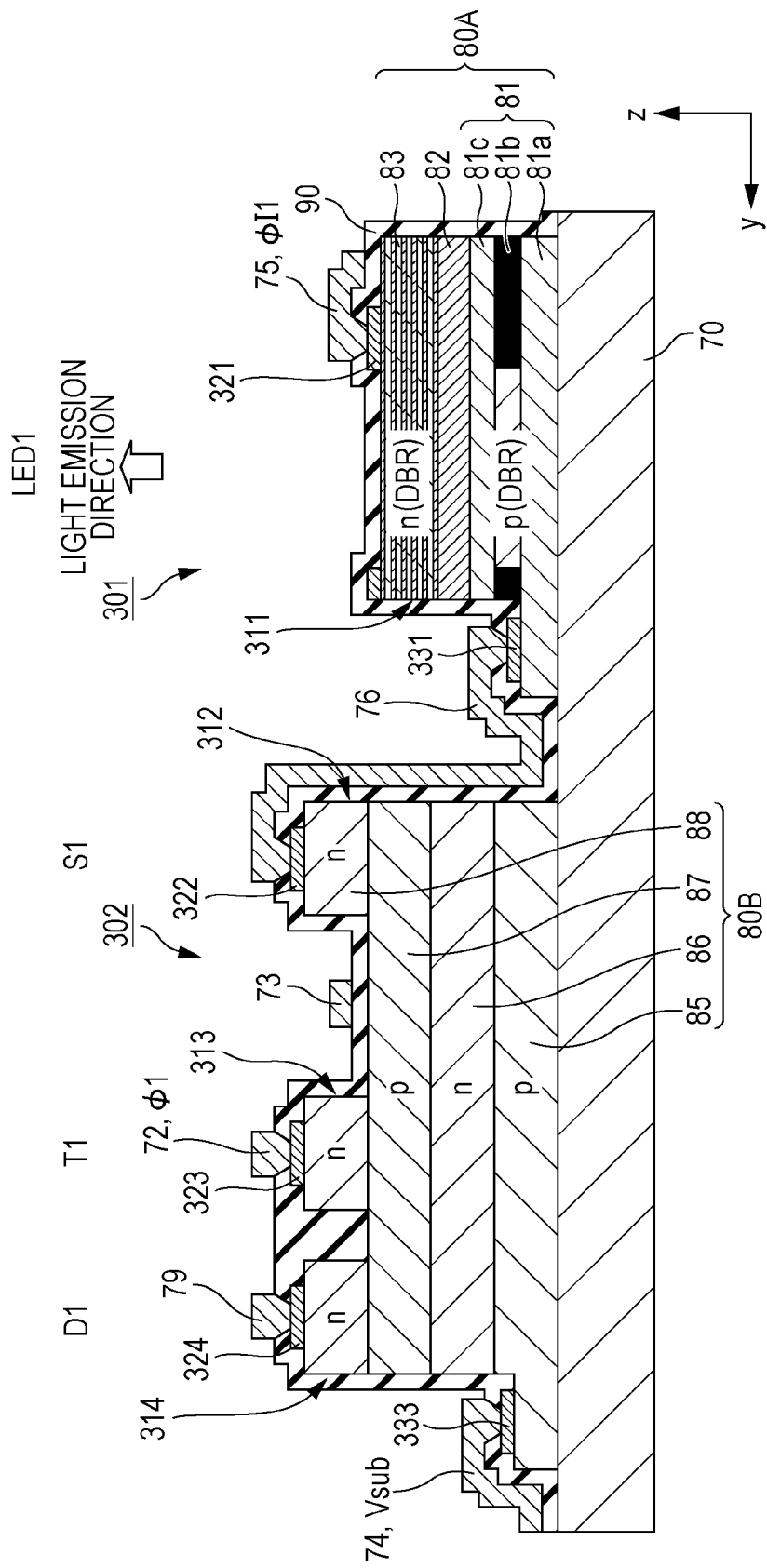
FIG. 22 is an enlarged cross-sectional view of the island in which the light-emitting diode is disposed and the island in which the setting thyristor, the transfer thyristor, and the like are disposed for illustrating a second modification of the light-emitting chip according to the third exemplary embodiment.

Second Modification of Light-Emitting Chip C According to Third Exemplary Embodiment FIG. 22 is an enlarged cross-sectional view of the island 301 and the island 302 for illustrating a second modification of the light-emitting chip C according to the third exemplary embodiment. The light-emitting diode LED1 is disposed in the island 301, and the setting thyristor S1, the transfer thyristor T1, and the like are disposed in the island 302.

In the second modification, the light-emitting layer 82 is sandwiched by two DBR layers. That is, the p-anode layer 81 and the n-cathode layer 83 are constituted as DBR layers, and thus are referred to as the p-anode (DBR) layer 81 and the n-cathode (DBR) layer 83, respectively. The p-anode (DBR) layer 81 includes the current constriction layer 81*b*. That is, in the p-anode layer 81, the lower p-anode layer 81*a*, the current constriction layer 81*b*, and the upper p-anode layer 81*c* are stacked in this order, and the lower p-anode layer 81*a* and the upper p-anode layer 81*c* are constituted as DBR layers.

The configuration of the DBR layers is the same as that in the first modification of the light-emitting chip C described in the first exemplary embodiment. Note that the thickness (optical path length) of the current constriction layer 81*b* is determined by the structure adopted in the p-anode (DBR) layer 81. In the case where importance is placed on extraction efficiency and process reproducibility, the thickness (optical path length) of the current constriction layer 81*b* is desirably set to an integer multiple of the thickness (optical path length) of the low refractive index layers and the high refractive index layers constituting the DBR layer. The thickness is set to 0.75 (¾) of the center wavelength, for example. In the case of an odd multiple, the current constriction layer 81*b* is desirably sandwiched by a high refractive index layer and a high refractive index layer. In the case of an even multiple, the current constriction layer 81*b* is desirably sandwiched by a high refractive index layer and a low refractive index layer. That is, the current constriction layer 81*b* is desirably provided to suppress a disturbance in the period of the refractive index due to the DBR layer. Conversely, in the case where a reduction of the influences of an oxidized portion (in the refractive index and distortion) is desired, the thickness of the current constriction layer 81*b* is desirably set to several tens of nanometers (nm) and is desirably inserted at a portion corresponding to a node of a standing wave caused in the DBR layer.

The p-anode (DBR) layer 81 an the n-cathode (DBR) layer 83 are configured to reflect light emitted from the light-emitting layer 82 of the light-emitting diode LED. That is, the p-anode (DBR) layer 81 and the n-cathode (DBR) layer 83 constitute a resonator (cavity), and the intensity of light from the light-emitting layer 82 is increased by resonance before the light is output. That is, in the second modification, the setting thyristor S is stacked on a resonance-type light-emitting diode LED.

Since the current constriction layer 81*b* is provided, electric power consumed by non-radiative recombination is reduced. Consequently, power consumption is reduced, and light extraction efficiency improves.

The second modification of the light-emitting chip C is manufactured by changing the p-anode (cladding) layer 81 and the n-cathode (cladding) layer 83 to DBR layers in the method for manufacturing the light-emitting chip C according to the first exemplary embodiment illustrated in FIGS. 9A to 13B or the modification of the method for manufacturing the light-emitting chip C according to the first exemplary embodiment illustrated in FIGS. 14A to 16.

The current constriction layer may be provided in the n-cathode (DBR) layer 83. In addition, as described in the second exemplary embodiment, the setting thyristor S and the transfer thyristor T may include the voltage reduction layer 89.

Figure 23:
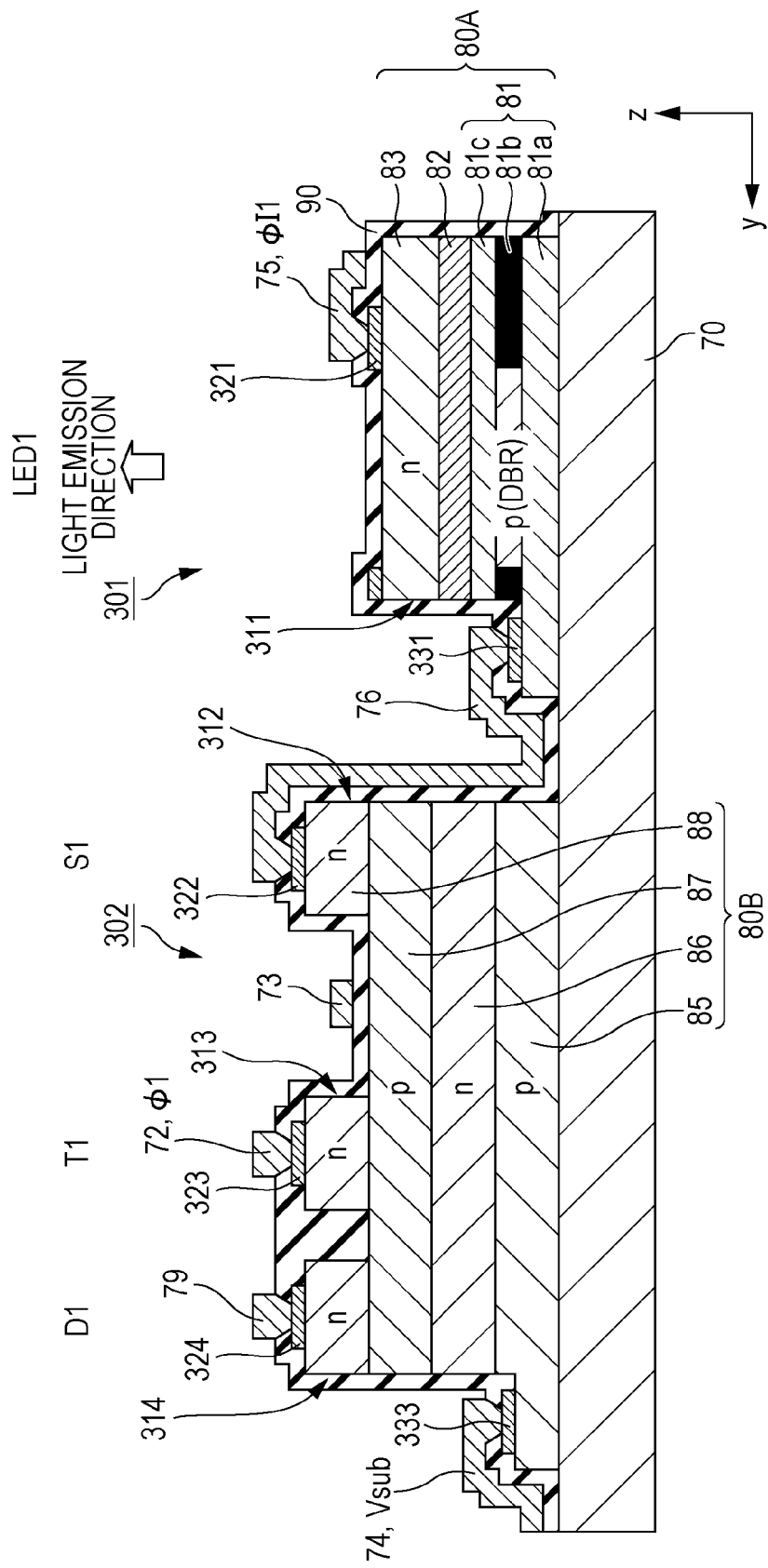
FIG. 23 is an enlarged cross-sectional view of the island in which the light-emitting diode is disposed and the island in which the setting thyristor, the transfer thyristor, and the like are disposed for illustrating a third modification of the light-emitting chip according to the third exemplary embodiment.

Third Modification of Light-Emitting Chip C According to Third Exemplary Embodiment FIG. 23 is an enlarged cross-sectional view of the island 301 and the island 302 for illustrating a third modification of the light-emitting chip C according to the third exemplary embodiment. The light-emitting diode LED1 is disposed in the island 301, and the setting thyristor S1, the transfer thyristor T1, and the like are disposed in the island 302.

In the third modification of the light-emitting chip C, the n-cathode (DBR) layer 83 of the light-emitting chip C illustrated in FIG. 22 is replaced with the n-cathode layer 83 that is not a DBR layer. The rest of the configuration is substantially the same as that of the light-emitting chip C according to the first exemplary embodiment.

In the light-emitting chip C according to the third modification, the p-anode (DBR) layer 81 is disposed under the light-emitting layer 82 (on the side closer to the substrate 70). In this case, since a reflectance of 30% is achieved at an interface between the protective layer 90 and air, the intensity of light from the light-emitting layer 82 is increased by resonance before the light is output.

In addition, light that travels toward the substrate 70 out of light from the light-emitting layer 82 is reflected by the p-anode (DBR) layer 81 and then travels towards the exit. Thus, the light use efficiency increases compared with the case where the p-anode layer 81 is not a DBR layer.

The light-emitting chip C according to the third modification is manufactured by changing the p-anode (cladding) layer 81 to the DBR layer in the method for manufacturing the light-emitting chip C according to the first exemplary embodiment illustrated in FIGS. 9A to 13B or the modification of the method for manufacturing the light-emitting chip C according to the first exemplary embodiment illustrated in FIGS. 14A to 16.

The current constriction layer may be provided in the n-cathode (DBR) layer 83. In addition, as described in the second exemplary embodiment, the setting thyristor S and the transfer thyristor T may include the voltage reduction layer 89.

Fourth Exemplary Embodiment

In the light-emitting chip C according to the first and second exemplary embodiments, the light-emitting elements are the laser diodes LD, and in the light-emitting chip C according to the third exemplary embodiment, the light-emitting elements are the light-emitting diodes LED. In the light-emitting chip C according to a fourth exemplary embodiment, vertical-cavity surface-emitting lasers (VCSEL) are used as light-emitting elements.

The configuration other than the vertical-cavity surface-emitting lasers (VCSEL) in the light-emitting chip C is substantially the same as that in the first exemplary embodiment. Thus, the laser diodes LD (the laser diodes LD1 to LD128) are replaced with vertical-cavity surface-emitting lasers (VCSEL) (vertical-cavity surface-emitting lasers VCSEL1 to VCSEL128). Consequently, a description of substantially the same part is omitted, and different part will be described.

Figure 24:
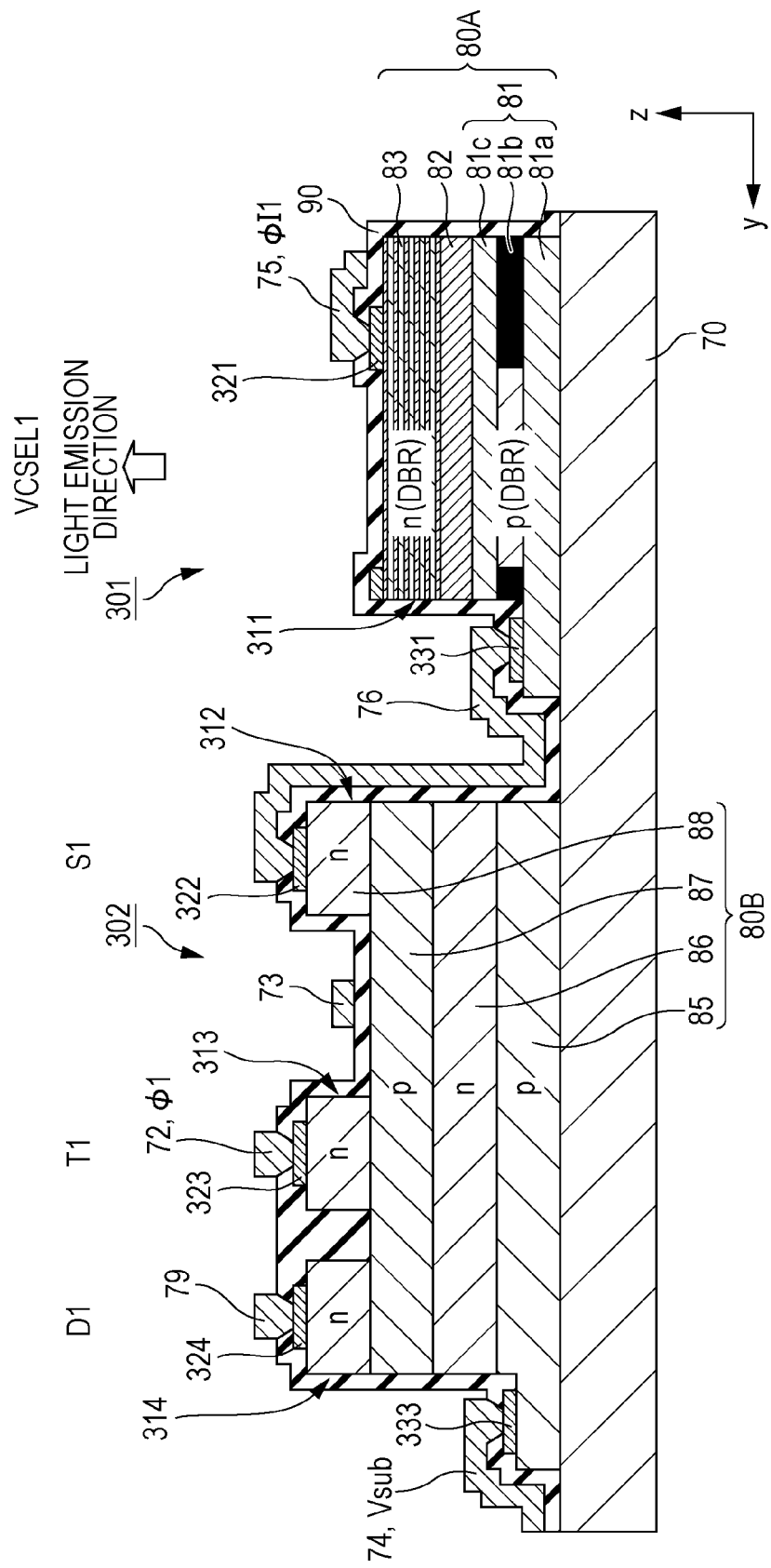
FIG. 24 is an enlarged cross-sectional view of an island in which a vertical-cavity surface-emitting laser is disposed and an island in which a setting thyristor, a transfer thyristor, and the like are disposed in a light-emitting chip according to a fourth exemplary embodiment.

FIG. 24 is an enlarged cross-sectional view of the island 301 and the island 302 in the light-emitting chip C according to the fourth exemplary embodiment. The vertical-cavity surface-emitting laser VCSEL1 is disposed in the island 301, and the setting thyristor S1, the transfer thyristor T1, and the like are disposed in the island 302.

The basic structure is substantially the same as that in the second modification of the light-emitting chip C according to the third exemplary embodiment illustrated in FIG. 22, and therefore a description thereof is omitted.

The vertical-cavity surface-emitting laser VCSEL resonates light in the light-emitting layer 82 sandwiched by the two DBR layers (the p-anode (DBR) layer 81 and the n-cathode (DBR) layer 83) to cause laser oscillation. When, for example, the reflectance between the light-emitting layer 82 and the two DBR layers (the p-anode (DBR) layer 81 and the n-cathode (DBR) layer 83) becomes 99% or higher, laser oscillation occurs.

Note that the current constriction layer may be provided in the n-cathode layer 83. In addition, as in the second exemplary embodiment, the second stacked semiconductor layer 80B constituting the setting thyristor S and the transfer thyristor T may include the voltage reduction layer 89.

In the first to fourth exemplary embodiments, the description has been given by using the laser diodes LD, the light-emitting diodes LED, and the vertical-cavity surface-emitting lasers VCSEL as light-emitting elements; however, other light-emitting elements such as laser transistors may be used.

In addition, elements other than thyristors may be used for driving the light-emitting elements. For example, driving elements such as transistors may be used.

The self-scanning light-emitting device (SLED) array according to the first to fourth exemplary embodiments includes the light-emitting unit 102 including the light-emitting elements (the laser diodes LD, the light-emitting diodes LED, or the vertical-cavity surface-emitting lasers VCSEL) and the driving unit 101 including the setting thyristors S and the transfer thyristors T, for example; however, the driving unit 101 may further include control thyristors disposed between the setting thyristors S and the transfer thyristors T. Further, other components such as diodes or resistors may be further included.

In addition, the transfer thyristors T are connected to each other by the respective coupling diodes D. However, the transfer thyristors T may be connected to each other by respective members capable of transferring a change in the potential, such as resistors.

In the first to fourth exemplary embodiments, the conductivity types of the light-emitting elements (the laser diodes LD, the light-emitting diodes LED, and the vertical-cavity surface-emitting lasers VCSEL) and of the setting thyristors S and the transfer thyristors T may be reversed, and the polarity of the circuit may be changed. That is, the anode-common circuit may be changed to a cathode-common circuit.

To reduce light emission delay and relaxation oscillation at the time of turn-on of the light-emitting elements (the laser diodes LD, the light-emitting diodes LED, and the vertical-cavity surface-emitting lasers VCSEL), a small current that is greater than or equal to a threshold current may be caused to flow through the light-emitting elements in advance to set the light-emitting elements in a light-emitting state or an oscillation-state in a slight degree. That is, the light-emitting elements may be caused to emit weak light before the respective setting thyristors S turn on, and the amount of light emitted by the light-emitting elements may be increased when the respective setting thyristors S turn on so that a predetermined amount of light is emitted. Examples of such a configuration may include the following. For example, an electrode is formed at the anode layer of each light-emitting element (the laser diode LD, the light-emitting diode LED, or the vertical-cavity surface-emitting laser VCSEL). A voltage or current source may be connected to this electrode, and a weak current may be supplied to the light-emitting element from this voltage or current source before the setting thyristor S turns on.

In addition, the transfer thyristors T and the setting thyristors S used in each of the exemplary embodiments may have a structure other than the pnpn four-layer structure as long as the structure implements functions of the transfer thyristors T and the setting thyristors S in the exemplary embodiment. For example, the transfer thyristors T and the setting thyristors S may have a pinin structure, a pipin structure, an npip structure, or a pnin structure having properties of the thyristors. In this case, one of the i-layer, the n-layer, and the i-layer sandwiched by the p-layer and the n-layer in the pinin structure and one of the n-layer and the i-layer sandwiched by the p-layer and the p-layer in the pnin structure may serve as a gate layer, and the n-ohmic electrode disposed on the gate layer may serve as the terminal of the gate Gt (gate Gs). Alternatively, one of the i-layer, the p-layer, and the i-layer sandwiched by the n-layer and the p-layer in the npip structure and one of the p-layer and the i-layer sandwiched by the n-layer and the p-layer in the npip structure may serve as the gate layer, and the p-ohmic electrode disposed on the gate layer may serve as the terminal of the gate Gt (gate Gs).

The above description has been given mainly of the case where the substrate 70 is formed of insulating GaAs by way of example. An example of semiconductor layers when a substrate of another type is used will be described.

First, an example of the semiconductor layers in the case where an insulating GaN substrate is used is as described below.

The p-anode layer 81 is formed of p-type $Al_{0.9}GaN$ with an impurity concentration of $1\times10^{18}/cm^3$, for example. The Al composition ratio may be changed within a range of 0 to 1.

Since it is difficult to use an oxidized constriction layer as the current constriction layer on the GaN substrate, it is effective to use ion implantation as a current constriction method.

The light-emitting layer 82 has a quantum well structure in which well layers and barrier layers are alternately stacked. The well layers are formed of GaN, InGaN, or AlGaN, for example, and the barrier layers are formed of AlGaN or GaN, for example. The light-emitting layer 82 may have a quantum wire structure or a quantum dot structure.

The n-cathode layer 83 is formed of n-type $Al_{0.9}GaN$ with an impurity concentration of $1\times10^{18}/cm^3$, for example. The Al composition ratio may be changed within a range of 0 to 1.

The p-anode layer 85 is formed of p-type $Al_{0.9}GaN$ with an impurity concentration of $1\times10^{18}/cm^3$, for example. The Al composition ratio may be changed within a range of 0 to 1.

The n-gate layer 86 is formed of n-type $Al_{0.9}GaN$ with an impurity concentration of $1\times10^{17}/cm^3$, for example. The Al composition ratio may be changed within a range of 0 to 1.

The p-gate layer 87 is formed of p-type $Al_{0.9}GaN$ with an impurity concentration of $1\times10^{17}/cm^3$, for example. The Al composition ratio may be changed within a range of 0 to 1.

The n-cathode layer 88 is formed of n-type $Al_{0.9}GaN$ with an impurity concentration of $1\times10^{18}/cm^3$, for example. The Al composition ratio may be changed within a range of 0 to 1.

An example of the semiconductor layers in the case where an insulating InP substrate is used is as described below.

The p-anode layer 81 is formed of p-type InGaAsP with an impurity concentration of $1\times10^{18}/cm^3$, for example. The Ga composition ratio or/and the As composition ratio may be changed within a range of 0 to 1.

Since it is difficult to use an oxidized constriction layer as the current constriction layer on the InP substrate, it is effective to use ion implantation as a current constriction method.

The light-emitting layer 82 has a quantum well structure in which well layers and barrier layers are alternately stacked. The well layers are formed of InAs, InGaAsP, AlGaInAs, or GaInAsPSb, for example, and the barrier layers are formed of InP, InAsP, InGaAsP, or AlGaInAsP, for example. Note that the light-emitting layer 82 may have a quantum wire stricture or a quantum dot structure.

The n-cathode layer 83 is formed of n-type InGaAsP with an impurity concentration of $1\times10^{18}/cm^3$, for example. The Ga composition ratio or/and the As composition ratio may be changed within a range of 0 to 1.

The p-anode layer 85 is formed of p-type InGaAsP with an impurity concentration of $1\times10^{18}/cm^3$, for example. The Ga composition ratio or/and the As composition ratio may be changed within a range of 0 to 1.

The n-gate layer 86 is formed of n-type InGaAsP with an impurity concentration of $1\times10^{17}/cm^3$, for example. The Ga composition ratio or/and the As composition ratio may be changed within a range of 0 to 1.

The p-gate layer 87 is formed of p-type InGaAsP with an impurity concentration of $1\times10^{17}/cm^3$, for example. The Ga composition ratio or/and the As composition ratio may be changed within a range of 0 to 1.

The n-cathode layer 88 is formed of n-type InGaAsP with an impurity concentration of $1\times10^{18}/cm^3$, for example. The Ga composition ratio or/and the As composition ratio may be changed within a range of 0 to 1.

These semiconductor layers are stacked using metal organic chemical vapor deposition (MOCVD) or molecular beam epitaxy (MBE), for example.

In addition, the exemplary embodiments described above may be applied to p-type, n-type, and i-type layers formed of organic materials.

Further, each of the exemplary embodiments may be used in combination of another exemplary embodiment.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light-emitting component comprising:
an insulating substrate;
a plurality of light-emitting elements that are disposed on the substrate and constituted by a first stacked semiconductor layer, the first stacked semiconductor layer being obtained by stacking a plurality of semiconductor layers; and
a plurality of thyristors that are constituted by a second stacked semiconductor layer disposed on the substrate such that the light-emitting elements and the thyristors are arranged side by side, connected to the plurality of light-emitting elements, respectively, and turn on to drive the light-emitting elements to emit light or to increase an emitted light amount, the second stacked semiconductor layer being obtained by stacking a plurality of semiconductor layers that are different from the semiconductor layers of the first stacked semiconductor layer,
wherein the light-emitting elements of the plurality of light-emitting elements are light emitting diodes or laser elements.

2. The light-emitting component according to claim 1, wherein each of the light-emitting elements and a corresponding one of the thyristors are connected in series via a connection wire.

3. The light-emitting component according to claim 2, wherein a voltage is applied to each of the light-emitting elements and a corresponding one of the thyristors to turn on the light-emitting element.

4. The light-emitting component according to claim 1, wherein the second stacked semiconductor layer includes a voltage reduction layer that reduces a rise voltage of each of the thyristors.

5. The light-emitting component according to claim 4, wherein the voltage reduction layer has a smaller bandgap energy than any other semiconductor layers constituting the second stacked semiconductor layer.

6. A printhead comprising:
the light-emitting component according to claim 1; and
an optical system that focuses light emitted from the light-emitting component to form an image.

7. An image forming apparatus comprising:
an image bearing member;
a charging member that charges the image bearing member;
the printhead according to claim 6;
a developing member that develops an electrostatic latent image obtained by being exposed to light by the printhead and formed on the image bearing member; and
a transfer member that transfers an image developed on the image bearing member to a transferred-image-receiving medium.

8. The light-emitting component according to claim 1, wherein the light-emitting elements of the plurality of light-emitting elements are laser elements.

9. The light-emitting component according to claim 1, wherein the light-emitting elements of the plurality of light-emitting elements are vcsel elements.

10. A method for manufacturing the light-emitting component according to claim 1, the method comprising:
growing the first stacked semiconductor layer on the insulating substrate;
etching the first stacked semiconductor layer other than at least a region in which the plurality of light-emitting elements is formed; and
growing the second stacked semiconductor layer on the insulating substrate after etching the first stacked semiconductor layer.

11. The method for manufacturing the light-emitting component according to claim 10, further comprising:
providing a growth suppression layer on the first stacked semiconductor layer before growing the second stacked semiconductor layer on the insulating substrate.

12. The method for manufacturing a light-emitting component according to claim 10, further comprising:
providing a growth suppression layer on the first stacked semiconductor layer before etching the first stacked semiconductor layer.

13. A method for manufacturing the light-emitting component comprising:
growing the second stacked semiconductor layer on the insulating substrate;
etching the second stacked semiconductor layer other than at least a region in which the plurality of thyristors is formed; and growing the first stacked semiconductor layer on the insulating substrate after etching the second stacked semiconductor layer.

14. The method for manufacturing the light-emitting component according to claim 13, further comprising:
providing a growth suppression layer on the second stacked semiconductor layer before growing the first stacked semiconductor layer on the insulating substrate.

15. The method for manufacturing the light emitting component according to claim 13, further comprising:
providing a growth suppression layer on the second stacked semiconductor layer before etching the second stacked semiconductor layer.

* * * * *